(12) United States Patent
Shibata et al.

(10) Patent No.: US 9,461,253 B2
(45) Date of Patent: Oct. 4, 2016

(54) ORGANIC ELECTROLUMINESCENCE DEVICE AND LUMINESCENCE APPARATUS

(75) Inventors: Kazuyuki Shibata, Tokyo (JP); Masaru Kinoshita, Kanagawa (JP); Tasuku Satou, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 286 days.

(21) Appl. No.: 12/632,825

(22) Filed: Dec. 8, 2009

(65) Prior Publication Data

US 2010/0140605 A1 Jun. 10, 2010

(30) Foreign Application Priority Data

Dec. 10, 2008 (JP) ................. 2008-314812

(51) Int. Cl.
*H05B 33/14* (2006.01)
*H01L 51/00* (2006.01)
*H01L 51/50* (2006.01)

(52) U.S. Cl.
CPC ....... *H01L 51/0087* (2013.01); *H01L 51/0085* (2013.01); *H01L 51/0058* (2013.01); *H01L 51/0072* (2013.01); *H01L 51/5016* (2013.01); *H01L 51/5036* (2013.01)

(58) Field of Classification Search
CPC ..................... H01L 51/0087; C09K 2211/185
USPC ........... 313/498–512; 315/169.3; 345/36, 45, 345/76
See application file for complete search history.

(56) References Cited

U.S. PATENT DOCUMENTS

| | | | |
|---|---|---|---|
| 5,405,709 A * | 4/1995 | Littman et al. ............... | 428/690 |
| 2001/0053462 A1 * | 12/2001 | Mishima ....................... | 428/690 |
| 2003/0064248 A1 * | 4/2003 | Wolk et al. ................... | 428/690 |
| 2005/0121666 A1 * | 6/2005 | Kondakova et al. .......... | 257/40 |
| 2006/0214568 A1 * | 9/2006 | Yamazaki et al. ............ | 313/504 |
| 2007/0059551 A1 * | 3/2007 | Yamazaki ..................... | 428/690 |
| 2007/0247061 A1 * | 10/2007 | Adamovich et al. ......... | 313/504 |

(Continued)

FOREIGN PATENT DOCUMENTS

| | | |
|---|---|---|
| JP | 2001-319780 A | 11/2001 |
| JP | 2002-100476 A | 4/2002 |

(Continued)

OTHER PUBLICATIONS

Fukagawa et al., Highly efficient, deep-blue phosphorescent organic light emitting diode with a double-emitting layer structure, Oct. 3, 2008, Applied Physics Letters 93, 133312.*

(Continued)

*Primary Examiner* — Nimeshkumar Patel
*Assistant Examiner* — Christopher Raabe
(74) *Attorney, Agent, or Firm* — Riverside Law LLP

(57) ABSTRACT

The invention provides an organic EL device including a pair of electrodes and at least one luminescent layer between the pair of electrodes, the at least one luminescent layer including at least two phosphorescent materials, an electrically inert material, and a charge-transporting material, the at least two phosphorescent materials being selected from a blue phosphorescent material having a luminescence peak in a range of from 420 nm to less than 500 nm, a green phosphorescent material having a luminescence peak in a range of from 500 nm to less than 570 nm, or a red phosphorescent material having a luminescence peak in a range of from 570 nm to 650 nm. The invention also provides a luminescence apparatus including the above organic EL device.

16 Claims, 1 Drawing Sheet

(56) References Cited

U.S. PATENT DOCUMENTS

2008/0303415 A1* 12/2008 Suzuri et al. ................. 313/504
2008/0303421 A1* 12/2008 Xu et al. ....................... 313/504
2009/0121624 A1* 5/2009 D'Andrade et al. .......... 313/504

FOREIGN PATENT DOCUMENTS

| JP | 2005220080 A | * | 8/2005 |
| JP | 2007-027092 A | | 2/2007 |

OTHER PUBLICATIONS

Tang et al., Broad band and white phosphorescent polymer light-emitting diodes in multilayer structure, Mar. 28, 2008, Synthetic Metals 158, (287-291).*

* cited by examiner

ORGANIC ELECTROLUMINESCENCE DEVICE AND LUMINESCENCE APPARATUS

CROSS-REFERENCE TO RELATED APPLICATION

This application claims priority under 35 USC 119 from Japanese Patent Application No. 2008-314812 filed Dec. 10, 2008, the disclosure of which is incorporated by reference herein.

TECHNICAL FIELD

The present invention relates to an organic electroluminescence device and a luminescence apparatus.

BACKGROUND ART

Apparatuses employing an organic electroluminescence device (organic EL device) have been developed in recent years. For example, these apparatuses are formed by providing, on a substrate of glass or the like, an anode, an organic layer (such as a hole-transporting layer, a luminescent layer and an electron-transporting layer), a cathode, and the like, and connecting the same with an external wiring via wirings (terminals) of the two electrodes. When a voltage is applied between the electrodes, excitons are generated in the luminescent layer positioned between the electrodes, as a result of re-combination of holes and electrons, and excessive energy is emitted as light when the excitons return from the excited state to the ground state.

The apparatus employing an organic EL device as mentioned above can reduce the thickness thereof as compared with display apparatuses employing a liquid crystal, and are applicable to a backlight for a liquid crystal display or an illumination device, by emitting white light, in addition to a display for a television or a cellular phone.

In order to emit white light using an organic EL device, a method of forming three luminescent layers each emit light of red (R), green (G) and blue (B), respectively, and a method of dispersing three kinds of luminescent materials for RGB in a single luminescent layer, have been known.

For example, Japanese Patent Application Laid-Open (JP-A) No. 2001-319780 proposes a luminescent device having a luminescent layer that includes at least two kinds of luminescent material, of which at least one luminescent material is an ortho-metallized complex, in order to improve luminescence efficiency or brightness as a white light source.

JP-A No. 2002-100476 proposes a luminescent device having a luminescent layer that includes a luminescent material and a host material, the luminescent material having a maximum luminescence peak wavelength of 500 nm, and the host material having a lowest excited triplet energy level that is higher than that of the luminescent material, in order to improve luminescent efficiency and color purity of the white light emission.

JP-A No. 2007-27092 proposes an organic EL device that emits white light, the device having a blue luminescent layer and a mixed luminescent layer of green and red, the mixed luminescent layer including a hole-transporting material, an electron-transporting material, and a phosphorescent material.

The present invention aims to provide an organic EL device having a luminescent layer including two or more kinds of luminescent material each individually emit light that can be produced in a stable manner, and a luminescence apparatus including the same.

SUMMARY OF THE INVENTION

The present invention has been made in view of the above circumstances, and provides an organic EL device including a pair of electrodes and at least one luminescent layer between the pair of electrodes, the at least one luminescent layer including at least two phosphorescent materials, an electrically inert material, and a charge-transporting material, the at least two phosphorescent materials being selected from a blue phosphorescent material having a luminescence peak in a range of from 420 nm to less than 500 nm, a green phosphorescent material having a luminescence peak in a range of from 500 nm to less than 570 nm, or a red phosphorescent material having a luminescence peak in a range of from 570 nm to 650 nm.

BRIEF DESCRIPTION OF THE DRAWINGS

Exemplary embodiments of the present invention will be described in detail based on the following figures, wherein.

DETAILED DESCRIPTION OF THE INVENTION

Figure 1:
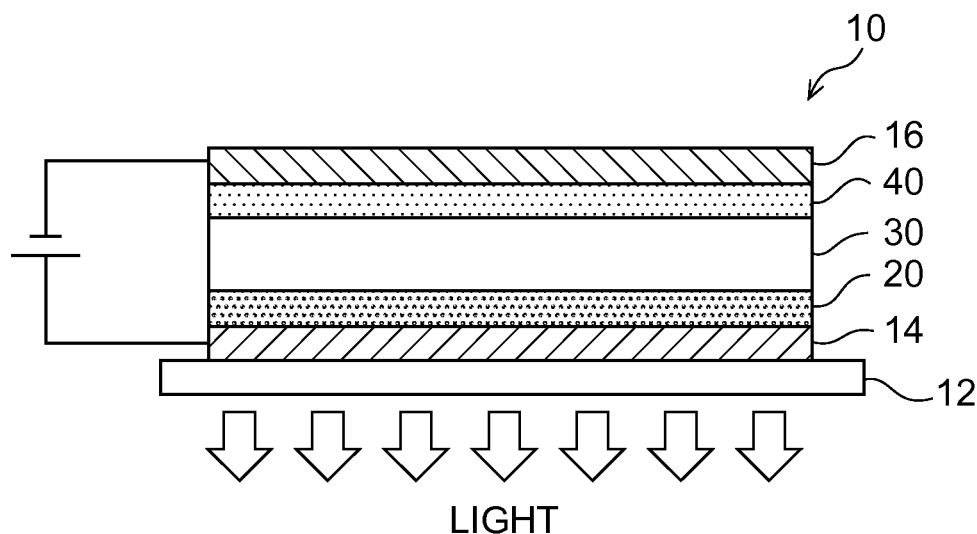
FIG. 1 is a schematic view of an exemplary embodiment (first exemplary embodiment) of the organic EL device according to the invention.

In the following, details of the organic EL device according to the present invention will be described by referring to the attached drawings.

Typically, when producing an organic EL device that emits white light by including luminescent materials for RGB in a luminescent layer, energy of excitons transfers from the blue luminescent material having a higher level of lowest excited triplet energy level (T1) to the green or red luminescent material having a lower T1. Therefore, when the dope concentration of the luminescent materials is similar to each other, blue light is hardly emitted and white light cannot be obtained. Accordingly, for example, when a luminescent layer is formed by evaporation, the luminescent materials for RGB are co-evaporated at a dope concentration for B of 15%, a dope concentration for G of 0.13%, and a dope concentration for R of 0.13%, respectively. In this case, while the variation in the dope concentration of blue luminescent material may have a relatively small effect, even a slight variation in the dope concentration due to changes in evaporation rate for the green and red luminescent material, which are evaporated at a particularly low evaporation rate, may easily affect the color balance. As a result, desired white color may not be obtained.

The problem in color balance may also occur when two kinds of luminescent material are added in the luminescent layer, or when four kinds of luminescent material are added in the luminescent layer. For example, when a luminescent layer including a blue luminescent material and a green luminescent material is formed, the dope concentration of the green luminescent material needs to be highly precisely controlled in order to form a luminescent layer in which B and G are mixed, since even a slight increase in the dope concentration of green luminescent material may result in almost green light emission.

Based on the idea that the energy transfer of excitons among the luminescent materials occurs via a charge-transporting material (host material) when two or more luminescent materials are included in a single luminescent layer and allowed to emit light of each material, the present inventors have found that by including an electrically inert material that suppresses the energy transfer of excitons, preferably an electrically inert organic compound, together with the two or more phosphorescent materials and the charge-transporting material, the energy transfer of excitons can be suppressed and emission of light based on each phosphorescent material can be achieved.

Specifically, the inventors have found that the above effect can be achieved by including the electrically inert material having an energy difference (Eg) between the highest occupied molecular orbital and the lowest unoccupied molecular orbital of 4.0 eV or more, a lowest excited triplet energy level (T1) of 2.7 eV or more, an electron affinity (Ea) of 2.3 eV, and an ionization potential (Ip) of 6.1 eV.

By using the electrically inert material as described above, and by increasing the dope concentration of the phosphorescent material having a lower T1 with respect to the phosphorescent material having the highest T1, an organic EL device having a favorable color balance can be produced in a stable manner.

The organic EL device according to the invention includes a pair of electrodes and at least one luminescent layer located between the pair of electrodes, the at least one luminescent layer including two or more phosphorescent materials having different lowest excited triplet energy levels, an electrically inert material, and a charge-transporting material. Further, the luminescence spectrum of the organic EL device has two or more peak wavelengths based on the two or more phosphorescent materials.

The organic EL device according to the invention may include other functional layers, as necessary. The following are exemplary layer structures, but the structure of the invention is not limited thereto and may be selected as appropriate according to purposes.

(1) Anode/luminescent layer/cathode
(2) Anode/hole-transporting layer/luminescent layer/electron-transporting layer/cathode
(3) Anode/hole-transporting layer/luminescent layer/blocking layer/electron-transporting layer/cathode
(4) Anode/hole-transporting layer/luminescent layer/blocking layer/electron-transporting layer/electron-injection layer/cathode
(5) Anode/hole-injection layer/hole-transporting layer/luminescent layer/blocking layer/electron-transporting layer/cathode
(6) Anode/hole-injection layer/hole-transporting layer/luminescent layer/blocking layer/electron-transporting layer/electron-injection layer/cathode
(7) Anode/hole-transporting layer/blocking layer/luminescent layer/electron-transporting layer/cathode
(8) Anode/hole-transporting layer/blocking layer/luminescent layer/electron-transporting layer/electron-injection layer/cathode
(9) Anode/hole-injection layer/blocking layer/hole-transporting layer/luminescent layer/electron-transporting layer/cathode
(10) Anode/hole-injection layer/blocking layer/hole-transporting layer/luminescent layer/electron-transporting layer/electron-injection layer/cathode First Exemplary Embodiment FIG. 1 schematically shows an exemplary structure of the organic EL device according to the invention (first exemplary embodiment). Organic EL device according to the present exemplary embodiment 10 is formed on support substrate 12, and includes a pair of electrodes 14 and 16 located to face each other and an organic layer (including hole-transporting layer 20, luminescent layer 30 and electron-transporting layer 40) located between electrodes 14 and 16.

In the following explanations, an anode is formed on support substrate 12 as lower electrode 14, but it is also possible to form a cathode on support substrate 12 as lower electrode 14.

—Luminescent Layer—

Luminescent layer 30 has a function of receiving holes from the anode, the hole injection-layer or the hole-transporting layer, while receiving electrons from the cathode, the electron-injection layer or the electron-transporting layer, and providing a place at which the holes and the electrons are re-combined to emit light.

The organic EL device 10 according to the first exemplary embodiment includes, in luminescent layer 30, two or more kinds of phosphorescent material having different T1s, an electrically inert material, and a charge-transporting material.

The two or more kinds of phosphorescent material having different T1s may be selected as appropriate according to usage.

For example, luminescent layer 30 may include a combination of two or more kinds selected from a phosphorescent material having a luminescence peak in a range of from 420 nm to less than 500 nm (blue phosphorescent material), a phosphorescent material having a luminescence peak in a range of from 500 nm to less than 570 nm (green phosphorescent material), and a phosphorescent material having a luminescence peak in a range of from 570 nm to 650 nm (red phosphorescent material). In order to obtain whit light by mixing light of different colors, it is preferable to include a blue phosphorescent material having a luminescence peak in a range of from 420 nm to less than 500 nm, a green phosphorescent material having a luminescence peak in a range of from 500 nm to less than 570 nm, and a red phosphorescent material having a luminescence peak in a range of from 570 nm to 650 nm.

Typically, when forming a luminescent layer that emits whit light by mixing luminescent materials that emit different colors, energy transfer of excitons occurs from the blue phosphorescent material having a higher T1 to the green and red phosphorescent materials having a lower T1. Therefore, the dope concentration of the green and red phosphorescent materials needs to be significantly reduced with respect to the dope amount of the blue phosphorescent material. However, if the balance of dope concentration of these phosphorescent materials is impaired, white light may not be obtained. On the other hand, by including an electrically inert material, energy transfer of excitons from the phosphorescent material having a higher T1 to the phosphorescent material having a lower T1 can be suppressed. As a result, the doping of the phosphorescent material having a lower T1 can be performed at a relatively high concentration. Accordingly, effects on color balance due to the variation in dope concentration of the phosphorescent materials can be suppressed, and an organic EL device that emits white light can be produced in a stable manner.

In the invention, the concentration (content) of each material that forms luminescent layer 30 may differ according to the type of the material. However, in view of production stability, suppression of energy transfer, color balance, or the like, it is preferable to include the blue phosphorescent material having a luminescence leak in a range of from 420 nm to less than 500 nm in an amount of from 5% by mass to 30% by mass, a green phosphorescent material having a luminescence peak in a range of from 500 nm to less than 570 nm in an amount of from 0.2% by mass to 5% by mass, a red phosphorescent material having a luminescence peak in a range of from 570 nm to 650 nm in an amount of from 0.2% by mass to 5% by mass, a charge-transporting material in an amount of from 50% by mass to 90% by mass, and an electrically inert material in an amount of from 3% by mass to 40% by mass, respectively.

Other exemplary combinations of the phosphorescent materials include the following, but the invention is not limited thereto.

(1) A combination of a blue phosphorescent material having a luminescence peak in a range of from 420 nm to less than 500 nm and a red phosphorescent material having a luminescence peak in a range of from 570 nm to 650 nm.

(2) A combination of a green phosphorescent material having a luminescence peak in a range of from 500 nm to less than 570 nm and a red phosphorescent material having a luminescence peak in a range of from 570 nm to 650 nm.

When luminescent layer 30 includes two or more kinds of phosphorescent material having different T1s, the concentration (content) of each material may differ according to the type of the material, combination of colors of light emitted, or the like. However, in view of production stability, suppression of energy transfer of excitons, color balance, or the like, it is preferable to include a phosphorescent material having a luminescence peak at a shorter wavelength in an amount of from 5% by mass to 30% by mass, a phosphorescent material having a luminescence peak at a longer wavelength in an amount of from 0.2% by mass to 5% by mass, a charge-transporting material in an amount of from 50% by mass to 90% by mass, and an electrically inert material in an amount of from 3% by mass to 40% by mass, respectively.

In either case, the content of the two or more kinds of phosphorescent material is adjusted so that the luminescence spectrum of the organic EL device has peak wavelengths based on each phosphorescent material. However, in view of achieving a favorable color balance by mixing the colors of the phosphorescent materials, the ratio of minimum luminescence spectrum to maximum luminescence spectrum of the two or more kinds of phosphorescent material is preferably within a range of from 5:95 to 50:50, more preferably from 20:80 to 50:50, further preferably from 30:70 to 50:50.

However, when the difference in the T1 values of the phosphorescent materials included in luminescent layer 30 is too large, lack of color balance of the emitted light may occur due to a certain degree of energy transfer of excitons from the phosphorescent material having a higher T1 to the phosphorescent material having a lower T1. In order to suppress this lack of color balance, the difference in the maximum value and the minimum value of T1 of the two or more kinds of phosphorescent material included in the luminescent layer is preferably 1.5 eV or less, more preferably 1.0 eV or less, further preferably 0.8 eV or less.

On the other hand, in order to sufficiently achieve the effect of the invention, by suppressing the energy transfer of excitons among the phosphorescent materials included in the luminescent layer and obtaining the color of emitted light based on each of the phosphorescent materials, the difference in the maximum value and the minimum value of T1 of the two or more kinds of phosphorescent material included in the luminescent layer is preferably 0.2 eV or more, more preferably 0.5 eV or more, further preferably 0.7 eV or more.

In the following, each of the materials that form luminescent layer 30 is described in detail.

—Phosphorescent Material—

Exemplary phosphorescent materials used in the present invention include a complex including a transition metal atom or a lanthanoid atom.

Preferable examples of the transition metal atom include, but not particularly limited to, ruthenium, rhodium, palladium, tungsten, rhenium, osmium, iridium and platinum. Among these, rhenium, iridium and platinum are more preferred.

Examples of the lanthanoid atom include lanthanum, cerium, praseodymium, neodymium, samarium, europium, gadolinium, terbium, dysprosium, holmium, erbium, thulium, ytterbium, and lutetium. Among these, neodymium, europium and gadolinium are preferred.

Exemplary ligands for the complex are described in G. Wildinson et al., Comprehensive Coordination Chemistry, published by Pergamon Press (1987); H. Yersin et al., Photochemistry and Photophysics of Coordination Compounds, published by Springer-Verlag (1987); and Akio Yamamoto et al, Organometallic Chemistry—Basic and Applications—, published by Shokabo Publishing Co., Ltd. (1982).

Specific examples of the ligand preferably include halogen ligands (preferably a chlorine ligand), nitrogen-containing heterocycle ligands (such as phenylpyridine, benzoquinoline, quinolinol, bipyridyl and phenanthroline), diketone ligands (such as acetylacetone), carboxylic acid ligands (such as acetic acid ligands), carbon monoxide ligands, isonitrile ligands, and cyano ligands. Among these, nitrogen-containing heterocycle ligands are more preferred.

The complex as mentioned above may have one metal atom therein, or may form a so-called polynuclear complex including two or more metal atoms. The complex may include different kinds of metal atoms.

Among these, examples of the complex suitably used for a luminescent material include the phosphorescent compounds described in U.S. Pat. No. 6,303,238, U.S. Pat. No. 6,097,147, WO00/57676, WO00/70655, WO01/08230, WO01/39234, WO01/41512, WO02/02714, WO02/15645, WO02/44189, JP-A No. 2001-247859, JP-A No. 2000-33561, JP-A No. 2002-117978, JP-A No. 2002-225352, JP-A No. 2002-235076, JP-A No. 2001-239281, JP-A No. 2002-170684, EP 1211257, JP-A No. 2002-226495, JP-A No. 2002-234894, JP-A No. 2001-247859, JP-A No. 2001-298470, JP-A No. 2002-173674, JP-A No. 2002-203678, JP-A No. 2002-203679, JP-A No. 2004-357791, JP-A No. 2006-256999, and JP-A 2005-75341.

The phosphorescent material that may be used in the invention is preferably an electron-transporting phosphorescent material having an electron affinity (Ea) of from 2.5 eV to 3.5 eV, and an ionization potential (Ip) of from 5.7 eV to 7.0 eV.

Specific examples thereof include complexes of ruthenium, rhodium, palladium, tungsten, rhenium, osmium, iridium, platinum, gold, lanthanum, cerium, praseodymium, neodymium, samarium, europium, gadolinium, terbium, dysprosium, holmium, erbium, thulium, ytterbium, and lutetium. Among these, complexes of ruthenium, rhodium, palladium, rhenium, iridium and platinum are more preferred, and complexes of iridium and platinum are most preferred.

The phosphorescent material used for the invention is particularly preferably a metal complex having a tridentate or higher-dentate ligand. In the following, the metal complex having a tridentate of higher-dentate ligand is described.

(1) Metal Ion

The atom that forms a coordinate bond with a metal ion in the metal complex having a tridentate of higher-dentate ligand is not particularly limited, but is preferably an oxygen atom, a nitrogen atom, a carbon atom, a sulfur atom or a phosphorus atom, more preferably an oxygen atom, a nitrogen atom or a carbon atom, further preferably a nitrogen atom or a carbon atom.

The metal ion in the metal complex having a tridentate of higher-dentate ligand is not particularly limited, but in view of improving light-emission efficiency or durability, or reducing the driving voltage, the metal ion is preferably a transition metal ion or a rare earth metal ion. Specific examples thereof include iridium ion, platinum ion, gold ion, rhenium ion, tungsten ion, rhodium ion, ruthenium ion, osmium ion, palladium ion, silver ion, copper ion, cobalt ion, zinc ion, nickel ion, lead ion, aluminum ion, gallium ion, rare earth metal ion (such as europium ion, gadolinium ion, or terbium ion); preferably iridium ion, platinum ion, gold ion, rhenium ion, tungsten ion, palladium ion, zinc ion, aluminum ion, gallium ion, europium ion, gadolinium ion, or terbium ion; more preferably iridium ion, platinum ion, rhenium ion, tungsten ion, palladium ion, zinc ion, aluminum ion, gallium ion, europium ion, gadolinium ion, or terbium ion; further preferably iridium ion, platinum ion, palladium ion, zinc ion, aluminum ion, or gallium ion; and most preferably platinum ion.

(2) Number of Ligands

The metal complex having a tridentate of higher-dentate ligand is preferably a metal complex having a tridentate to hexadentate ligand, in view of improving light-emission efficiency or durability. When the metal ion is prone to form a hexadentate complex, such as iridium ion, the metal complex preferably has a tridentate, tetradentate or hexadentate ligand. When the metal ion is prone to form a tetradentate complex, such as platinum ion, the metal complex preferably has a tridentate or tetradentate ligand, more preferably a tetradentate ligand.

(3) Ligand

The ligand of the above-described metal complex preferably has a chain or cyclic structure in view of improving light-emission efficiency or durability, and preferably has at least one nitrogen-containing heterocycle in which the central metal ($M^{11}$ in the compound represented by the following Formula (A)) forms a coordinate bond with a nitrogen atom. Exemplary nitrogen-containing heterocycles include a pyridine ring, a quinoline ring, a pyrimidine ring, a pyrazine ring, a pyrrole ring, an imidazole ring, a pyrazole ring, an oxazole ring, a thiazole ring, an oxadiazole ring, a thiadiazole ring, or a triazole ring. The nitrogen-containing heterocycle is more preferably a nitrogen-containing 6-membered heterocycle, or a nitrogen-containing 5-membered heterocycle. The heterocycle may form a condensate ring together with other ring(s).

When the ligand of the metal complex has a chain structure, this refers to that the ligand does not have a cyclic structure (such as a terpyridyl ligand). Further, when the ligand of the metal complex has a cyclic structure, this refers to that the plural ligands in the metal complex bond to each other to form a closed structure (such as a phthalocyanine ligand or a crown ether ligand).

(4) Preferable Structure of Metal Complex

The metal complex that may be used in the invention as a phosphorescent material is preferably an organic compound represented by the following Formula (A).

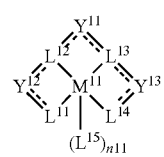

Formula (A)

In Formula (A), $M^{11}$ represents a metal ion and $L^{11}$ to $L^{15}$ each represent a ligand that binds to $M^{11}$. An atomic group may exist between $L^{11}$ and $L^{14}$ to form a cyclic ligand. $L^{15}$ may bind to both $L^{11}$ and $L^{14}$ to form a cyclic ligand.

$Y^{11}$, $Y^{12}$ and $Y^{13}$ each independently represent a linkage group, a single bond, or a double bond. When $Y^{11}$, $Y^{12}$ or $Y^{13}$ is a linkage group, the linkage between $L^{11}$ and $Y^{12}$, $Y^{12}$ and $L^{12}$, $L^{12}$ and $Y^{11}$, $Y^{11}$ and $L^{13}$, $L^{13}$ and $Y^{13}$, or $Y^{13}$ and $L^{14}$ each independently represent a single bond or a double bond. $n^{11}$ represents an integer of from 0 to 4. $M^{11}$ and each of $L^{11}$ to $L^{15}$ may be bound to each other via any of a coordinate bond, an ion bond or a covalent bond, respectively.

In Formula (A), the metal ion represented by $M^{11}$ is not particularly limited, but is preferably a divalent or trivalent metal ion. Exemplary divalent or trivalent metal ions include gold ion, platinum ion, iridium ion, rhenium ion, palladium ion, rhodium ion, ruthenium ion, copper ion, europium ion, gadolinium ion and terbium ion, preferably platinum ion, iridium ion and europium ion, more preferably platinum ion and iridium ion, and particularly preferably platinum ion.

In Formula (A), $L^{11}$, $L^{12}$, $L^{13}$ and $L^{14}$ each independently represent a ligand that binds to $M^{11}$. Preferable examples of the atom that is included in $L^{11}$, $L^{12}$ and $L^{14}$ and binds to $M^{11}$ include a nitrogen atom, an oxygen atom, a sulfur atom, a carbon atom or a phosphorus atom, more preferably a nitrogen atom, an oxygen atom, a sulfur atom or a carbon atom, further preferably a nitrogen atom, an oxygen atom or a carbon atom.

$M^{11}$ and each of $L^{11}$, $L^{12}$, $L^{13}$ and $L^{14}$ may be bound to each other via any of a covalent bond, an ionic bond, or a coordinate bond, respectively. For convenience of explanation, the term "ligand" is used not only in terms of a coordinate bond, but also used in terms of an ionic bond and a covalent bond.

The ligand formed from $L^{11}$, $Y^{12}$, $L^{12}$, $Y^{11}$, $L^{13}$, $Y^{13}$ and $L^{14}$ is preferably an anionic ligand (a ligand in which at least one anion binds to a metal). The number of anions in the anionic ligand is preferably 1 to 3, more preferably 1 to 2, and further preferably 2.

Examples of the ligand represented by $L^{11}$, $L^{12}$, $L^{13}$ and $L^{14}$ that binds to $M^{11}$ via a carbon atom are not particularly limited, but include an imino ligand, an aromatic carbon ring ligand (such as a benzene ligand, a naphthalene ligand, an anthracene ligand, or a phenanthracene ligand), a heterocyclic ligand (such as a thiophene ligand, a pyridine ligand, a pyrazine ligand, a pyrimidine ligand, a thiazole ligand, an oxazole ligand, a pyrrole ligand, an imidazole ligand, a pyrazole ligand, a condensed cyclic ligand (such as a quinoline ligand or a benzothiazole ligand), or tautomers of these ligands).

Examples of the ligand represented by $L^{11}$, $L^{12}$, $L^{13}$ and $L^{14}$ that binds to $M^{11}$ via a nitrogen atom are not particularly limited, but include a nitrogen-containing heterocyclic ligand (such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, and a thiadiazole ligand), a ring-fused structure including the above ligand (such as a quinoline ligand, a benzoxazole ligand, and a benzimidazole ligand), tautomers of these ligands (in the present specification, the following are also referred to as a tautomer, in addition to those commonly referred to as a tautomer. For example, a 5-membered heterocyclic ligand of Compound (24) as described later and a terminal-5-membered heterocyclic ligand of Compound (64) as described later are also referred to as a pyrrole tautomer), an amino ligand (such as an alkylamino ligand preferably having 2 to 30 carbon atoms, more preferably 2 to 20 carbon atoms, particularly preferably 2 to 10 carbon atoms, e.g., a methylamino ligand), an arylamino ligand (such as a phenylamino ligand), an acylamino ligand (preferably having 2 to 30 carbon atoms, more preferably 2 to 20 carbon atoms, particularly preferably 2 to 10 carbon atoms, e.g., an acetylamino ligand or a benzoylamino ligand), an alkoxycarbonylamino ligand (preferably having 2 to 30 carbon atoms, more preferably 2 to 20 carbon atoms, particularly preferably 2 to 12 carbon atoms, e.g., a methoxycarbonylamino ligand), an aryloxycarbonylamino ligand (preferably having 7 to 30 carbon atoms, more preferably 7 to 20 carbon atoms, particularly preferably 7 to 12 carbon atoms, e.g., a phenyloxycarbonylamino ligand), a sulfonylamino ligand (preferably having 1 to 30 carbon atoms, more preferably 1 to 20 carbon atoms, particularly preferably 1 to 12 carbon atoms, e.g., a methanesulfonylamino ligand or a benzenesulfonylamino ligand), and an imino ligand. These ligands may be further substituted.

Examples of the ligand represented by $L^{11}$, $L^{12}$, $L^{13}$ and $L^{14}$ that binds to $M^{11}$ via an oxygen atom are not particularly limited, but include an alkoxy ligand (preferably having 1 to 30 carbon atoms, more preferably 1 to 20 carbon atoms, particularly preferably 1 to 10 carbon atoms, such as a methoxy ligand, an ethoxy ligand, a butoxy ligand, and a 2-ethylhexyloxy ligand), an aryloxy ligand (preferably having 6 to 30 carbon atoms, more preferably 6 to 20 carbon atoms, and particularly preferably 6 to 12 carbon atoms, such as a phenyloxy ligand, a 1-naphthyloxy ligand, or 2-naphthyloxy ligand), a heterocyclic oxy ligand (preferably having 1 to 30 carbon atoms, more preferably 1 to 20 carbon atoms, particularly preferably 1 to 12 carbon atoms, such as a pyridyloxy ligand, a pyrazyloxy ligand, a pyrimidyloxy ligand, and a quinolyloxy ligand), an acyloxy ligand (preferably having 2 to 30 carbon atoms, more preferably 2 to 20 carbon atoms, particularly preferably 2 to 10 carbon atoms, such as an acetoxy ligand and a benzoyloxy ligand), a silyloxy ligand (preferably having 3 to 40 carbon atoms, more preferably 3 to 30 carbon atoms, particularly preferably 3 to 24 carbon atoms, such as a trimethylsilyloxy ligand and a triphenylsilyloxy ligand), a carbonyl ligand (such as a ketone ligand, an ester ligand and an amide ligand), an ether ligand (such as a dialkylether ligand, a diarylether ligand and a furyl ligand).

Examples of the ligand represented by $L^{11}$, $L^{12}$, $L^{13}$ and $L^{14}$ that binds to $M^{11}$ via a sulfur atom are not particularly limited, but include an alkylthio ligand (preferably having 1 to 30 carbon atoms, more preferably 1 to 20 carbon atoms, particularly preferably 1 to 12 carbon atoms, such as a methylthio ligand or an ethylthio ligand), an arylthio ligand (preferably having 6 to 30 carbon atoms, more preferably 6 to 20 carbon atoms, particularly preferably 6 to 12 carbon atoms, such as a phenylthio ligand), a heterocyclicthio ligand (preferably having 1 to 30 carbon atoms, more preferably 1 to 20 carbon atoms, particularly preferably 1 to 12 carbon atoms, such as a pyridylthio ligand, a 2-benzimidazolylthio ligand, a 2-benzoxazolylthio ligand, and a 2-benzthiazolylthio ligand), a thiocarbonyl ligand (such as a thioketone ligand, and a thioester ligand), and a thioether ligand (such as a dialkylthioether ligand, a diarylthioether ligand, and a thiofuryl ligand). These ligands may be further substituted.

Examples of the ligand represented by $L^{11}$, $L^{12}$, $L^{13}$ and $L^{14}$ that binds to $M^{11}$ via a phosphorus atom are not particularly limited, but include a dialkylphosphino group, a diarylphosphino group, a trialkylphosphine group, a triarylphosphine group, and a phosphinine group. These groups may be further substituted.

Preferable examples of $L^{11}$ and $L^{14}$ include an aromatic carbon ring ligand, an alkyloxy ligand, an aryloxy ligand, an ether ligand, an alkylthio ligand, an arylthio ligand, an alkylamino ligand, an arylamino ligand, an acylamino ligand, a nitrogen-containing heterocyclic ligand (such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, or a ring-fused ligand (such as a quinoline ligand, a benzoxazole ligand, and a benzimidazole ligand), or tautomers of these ligands); more preferably an aromatic carbon ring ligand, an aryloxy ligand, an arylthio ligand, an arylamino ligand, a pyridine ligand, a pyrazine ligand, an imidazole ligand, or tautomers of these ligands; further preferably an aromatic carbon ring ligand, an aryloxy ligand, an arylthio ligand, and an arylamino ligand; and particularly preferably an aromatic carbon ring ligand and an aryloxy ligand.

$L^{12}$ and $L^{13}$ each independently are preferably a ligand that forms a coordinate bond with $M^{11}$, and examples thereof include a pyridine ring, a pyrazine ring, a pyrimidine ring, a triazine ring, a thiazole ring, an oxazole ring, a pyrrole ring, a triazole ring, and a ring-fused structure including the above ring (such as a quinoline ring, a benzoxazole ring, a benzimidazole ring, and an indolenine ring), and tautomers of these ligands; more preferably a pyridine ring, a pyrazine ring, a pyrimidine ring, a pyrrole ring, a ring-fused structure including the above ring (such as a quinoline ring and a benzopyrrole ring), and tautomers of these ligands; further preferably a pyridine ring, a pyrazine ring, a pyrimidine ring, a ring-fused structure including the above ring (such as a quinoline ring); and particularly preferably a pyridine ring and a ring-fused structure including a pyridine ring (such as a quinoline ring).

In Formula (A), $L^{15}$ represents a ligand that binds to $M^{11}$. $L^{15}$ is preferably a monodentate to tetradentate ligand, more preferably an anionic monodentate to tetradentate ligand. Examples of the anionic monodentate to tetradentate ligand are not particularly limited, but preferably include a halogen ligand, a 1,3-diketone ligand (such as an acetylacetone ligand), a monoanionic bidentate ligand including a pyridine ligand (such as a picoline ligand and a 2-(2-hydroxyphenyl)-pyridine ligand), and a tetradentate ligand formed from $L^{11}$, $Y^{12}$, $L^{12}$, $Y^{11}$, $L^{13}$, $Y^{13}$ and $L^{14}$; more preferably a 1,3-diketone ligand (such as an acetylacetone ligand), a monoanionic bidentate ligand including a pyridine ligand (such as a picoline ligand and a 2-(2-hydroxyphenyl)-pyridine ligand), and a tetradentate ligand formed from $L^{11}$, $Y^{12}$, $L^{12}$, $Y^{11}$, $L^{13}$, $Y^{13}$ and $L^{14}$; further preferably a 1,3-diketone ligand (such as an acetylacetone ligand), a monoanionic bidentate ligand including a pyridine ligand (such as a picoline ligand and a 2-(2-hydroxyphenyl)-pyridine ligand); and particularly preferably a 1,3-diketone ligand (such as an acetylacetone ligand). The number of coordination position or ligand does not exceed the coordination number of the metal. However, $L^{15}$ does not form a cyclic ligand by binding to both $L^{11}$ and $L^{14}$.

In Formula (A), $Y^{11}$, $Y^{12}$ and $Y^{13}$ each independently represent a linkage group, a single bond or a double bond. The linkage group is not particularly limited, but preferably includes an atom selected from a carbon atom, a nitrogen atom, an oxygen atom, a sulfur atom, a silicon atom, or a phosphorus atom. Specific examples of the linkage group include the following.

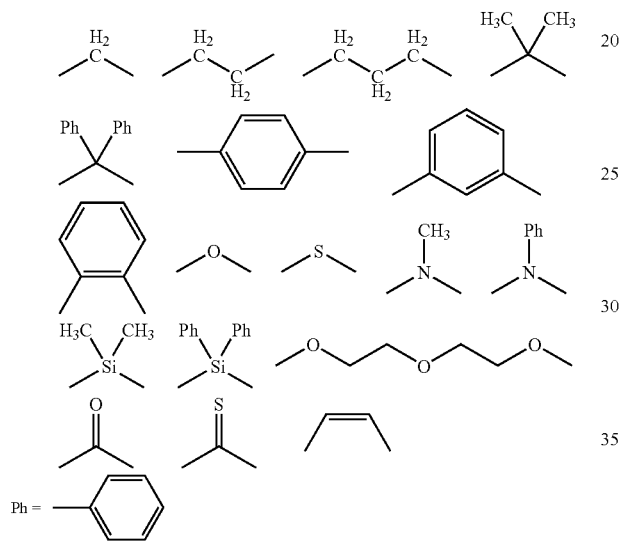

Further, when $Y^{11}$, $Y^{12}$ or $Y^{13}$ is a linkage group, the linkages between $L^{11}$ and $Y^{12}$, $Y^{12}$ and $L^{12}$, $L^{12}$ and $Y^{11}$, $Y^{11}$ and $L^{13}$, $L^{13}$ and $Y^{13}$, and $Y^{13}$ and $L^{14}$ each independently represent a single bond or a double bond.

$Y^{11}$, $Y^{12}$ and $Y^{13}$ each independently preferably represent a single bond, a double bond, a carbonyl linkage group, an alkylene group, or an alkenylene group. $Y^{11}$ is more preferably a single bond or an alkylene group, further preferably an alkylene group. $Y^{12}$ and $Y^{13}$ are more preferably a single bond or an alkenylene group, further preferably a single bond.

The ring formed from $Y^{12}$, $L^{11}$, $L^{12}$ and $M^{11}$, a ring formed from $Y^{11}$, $L^{12}$, $L^{13}$ and $M^{11}$, and a ring formed from $Y^{13}$, $L^{13}$, $L^{14}$ and $M^{11}$ are preferably a 4 to 10-membered ring, more preferably a 5 to 7-membered ring, further preferably a 5 or 6-membered ring.

In Formula (A), $n^{11}$ represents an integer of 0 to 4. When $M^{11}$ is a metal having a coordination number of 4, $n^{11}$ is 0. When $M^{11}$ is a metal having a coordination number of 6, $n^{11}$ is preferably 1 or 2, more preferably 1. When $M^{11}$ is a metal having a coordination number of 6 and $n^{11}$ is 1, $L^{15}$ represents a bidentate ligand. When $M^{11}$ is a metal having a coordination number of 6 and $n^{11}$ is 2, $L^{15}$ is a monodentate ligand. When $M^{11}$ is a metal having a coordination number of 8, $n^{11}$ is preferably any of 1 to 4, more preferably 1 or 2, further preferably 1. When $M^{11}$ is a metal having a coordination number of 8 and $n^{11}$ is 1, $L^{15}$ is a tetradentate ligand. When $M^{11}$ is a metal having a coordination number of 8 and $n^{11}$ is 2, $L^{15}$ represents a bidentate ligand. When there are two or more of $n^{11}$, the two or more of $L^{15}$ may be the same or different.

The following are specific examples of the phosphorescent material that may be used in the invention, but the invention is not limited thereto.

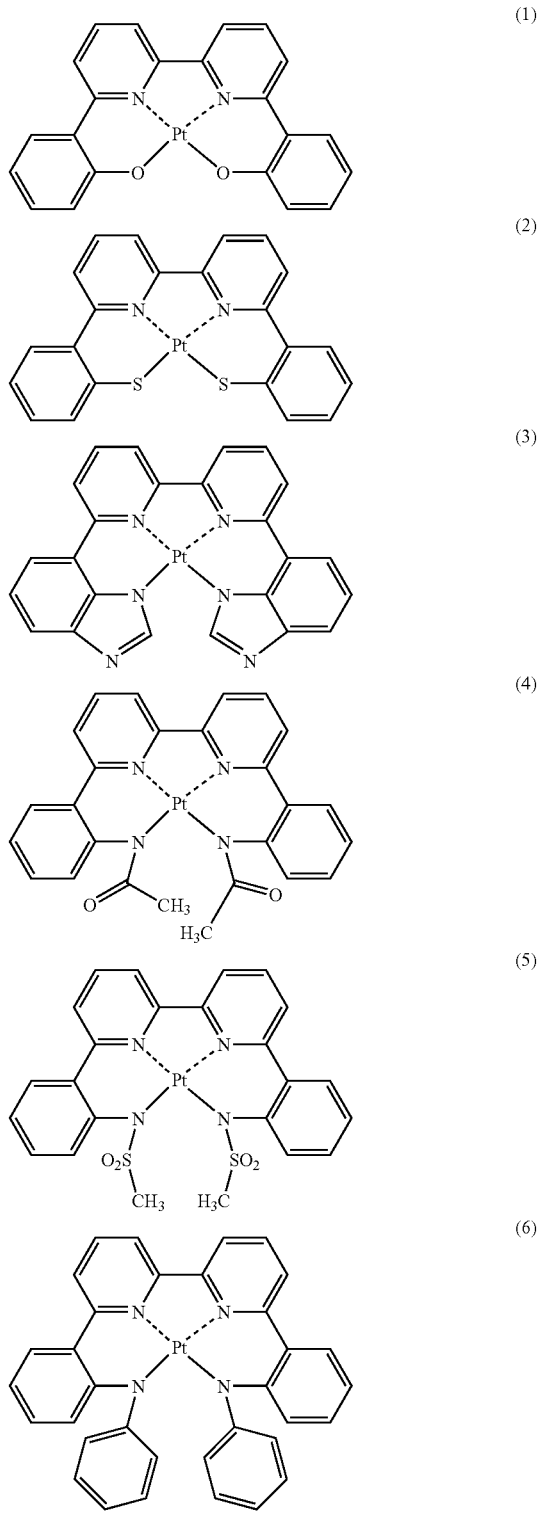

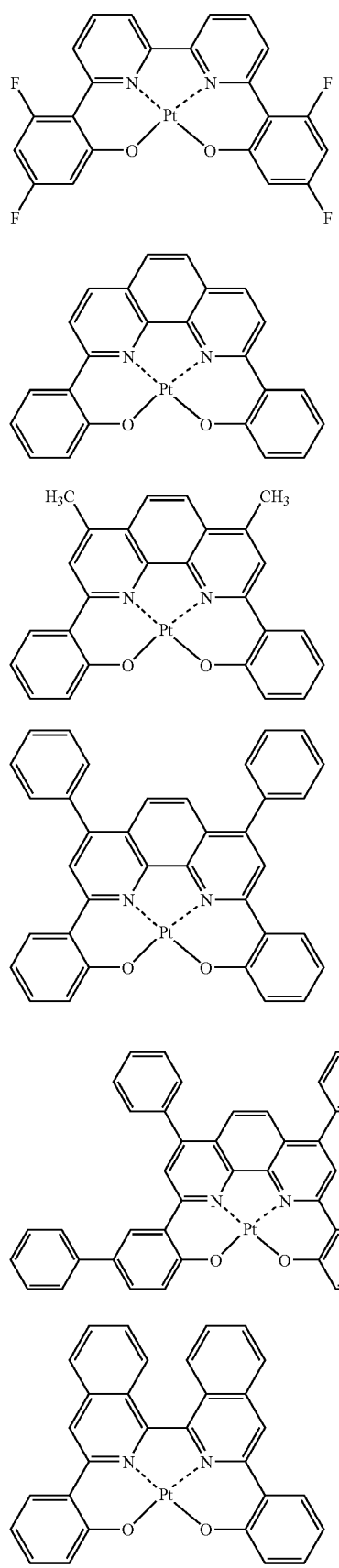
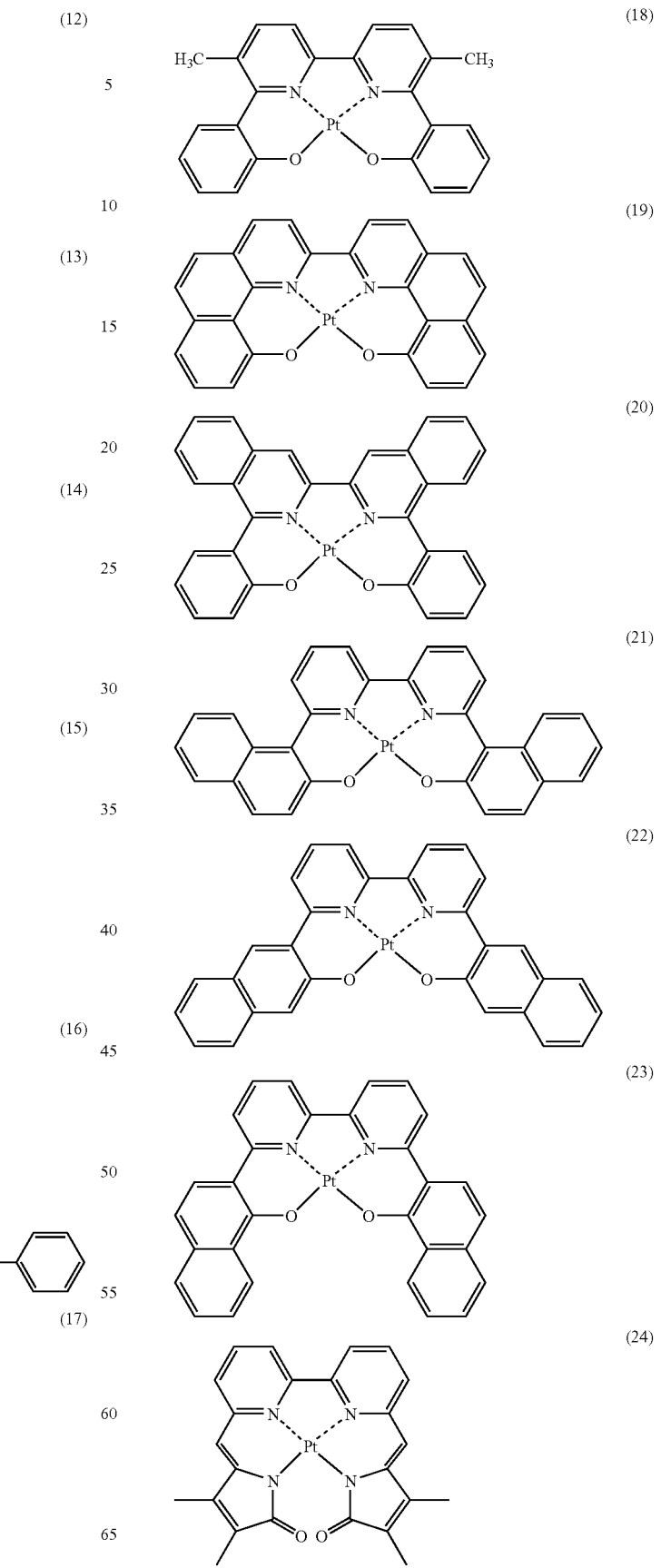

(25)
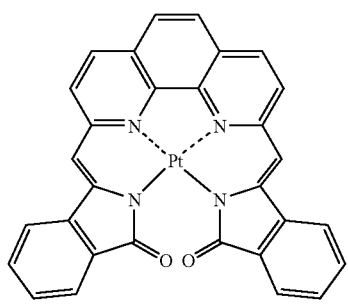
(26)
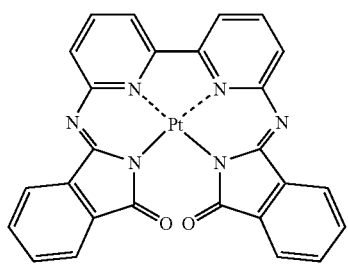
(27)
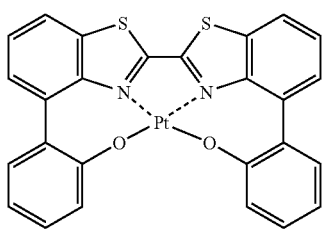
(28)
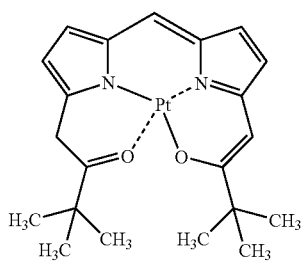
(29)
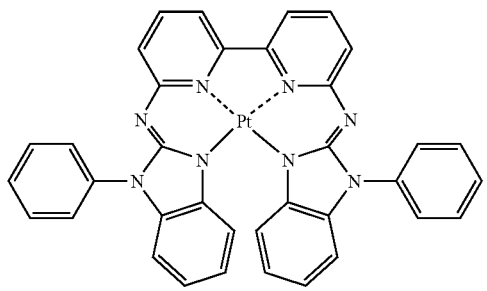
(30)
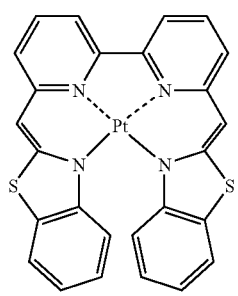
(31)
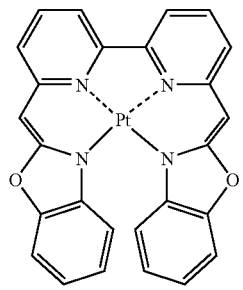
(32)
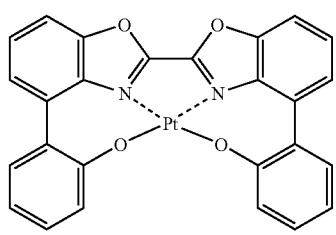
(33)
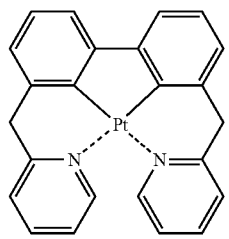
(34)
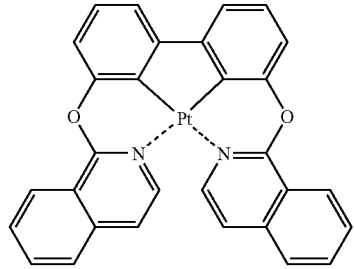
(35)
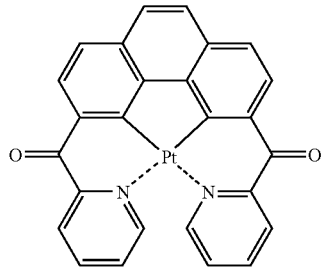
(36)
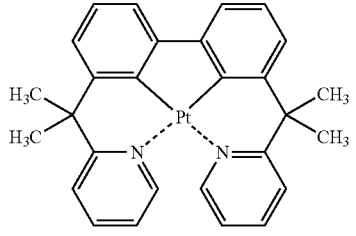

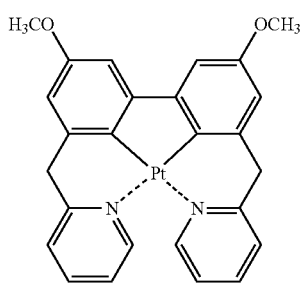
(37)
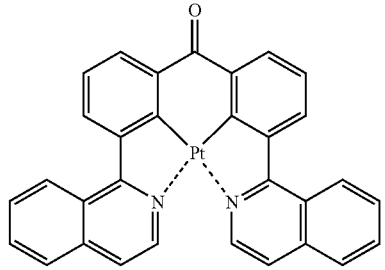
(42)
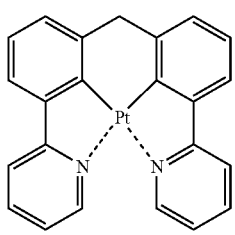
(38)
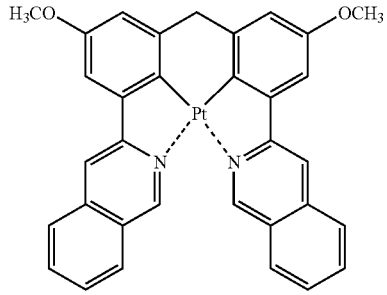
(43)
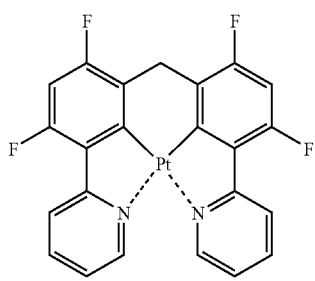
(39)
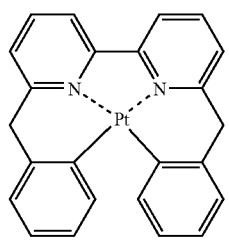
(44)
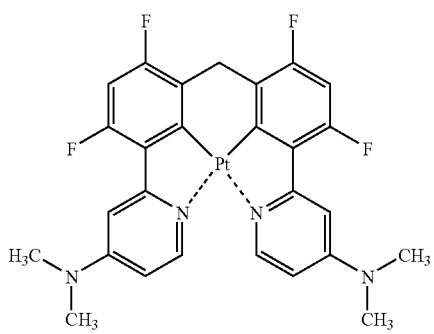
(40)
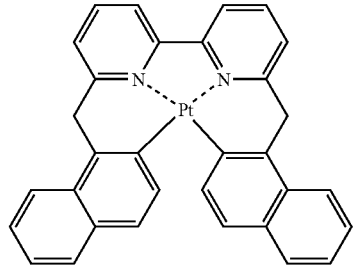
(45)
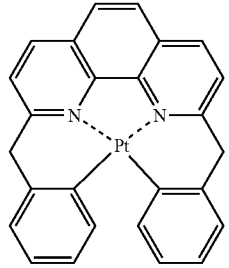
(46)
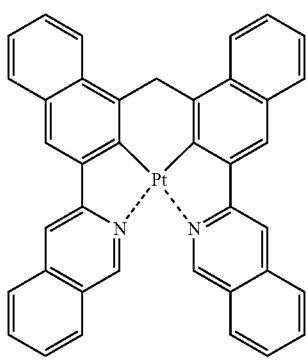
(41)
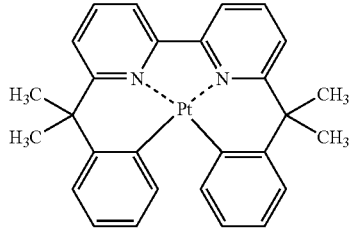
(47)

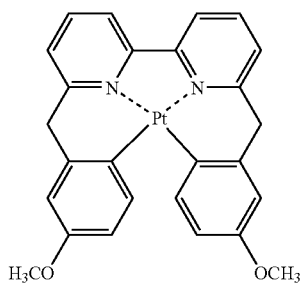
(47)
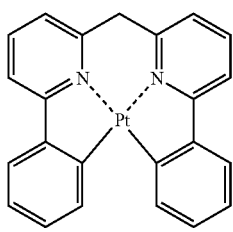
(48)
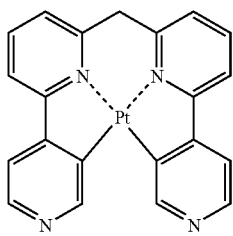
(49)
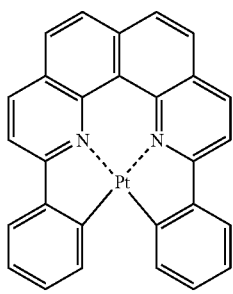
(50)
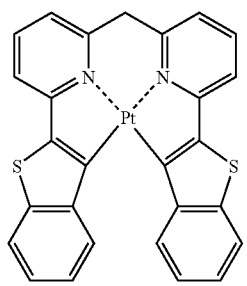
(51)
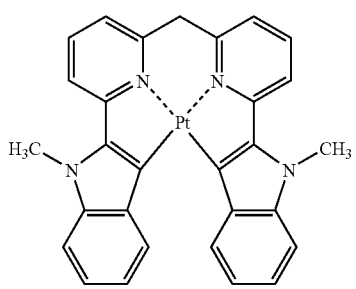
(52)
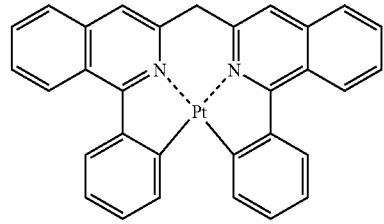
(53)
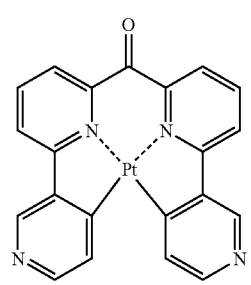
(54)
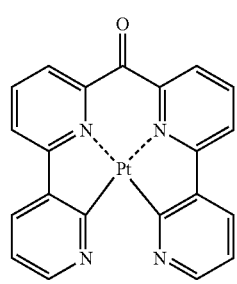
(55)
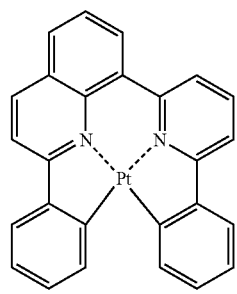
(56)
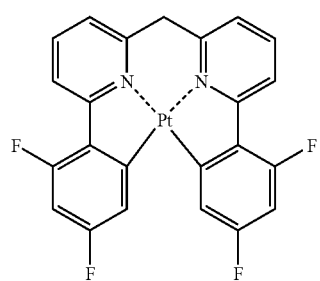
(57)

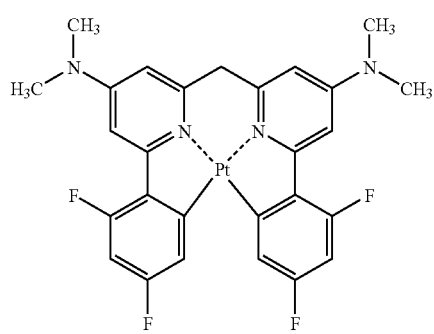
(59)
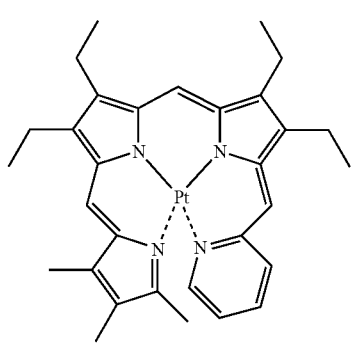
(64)
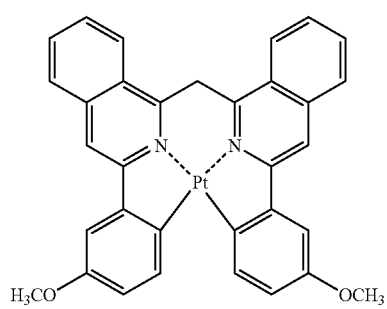
(60)
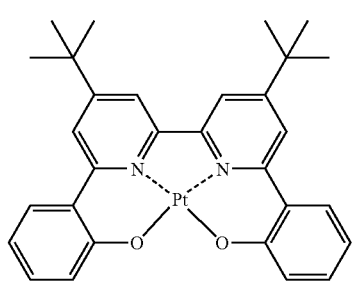
(65)
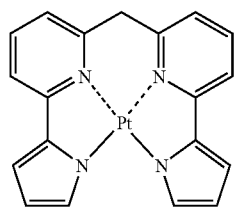
(61)
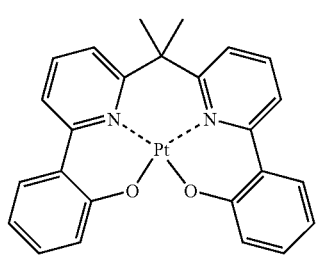
(66)
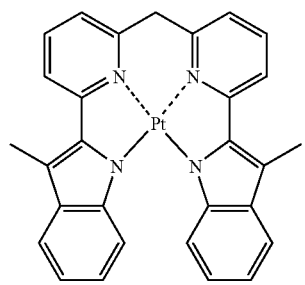
(62)
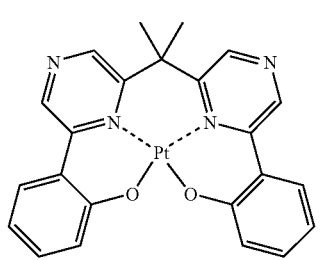
(67)
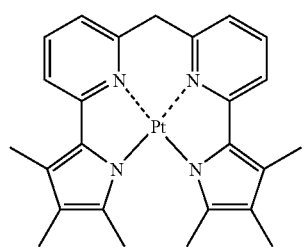
(63)
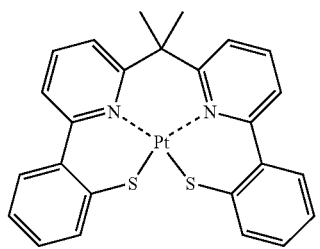
(68)

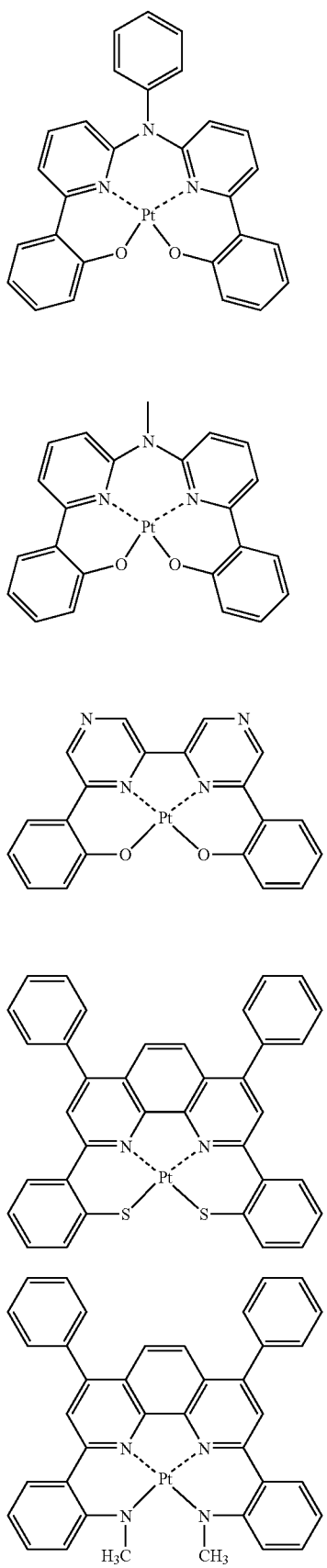
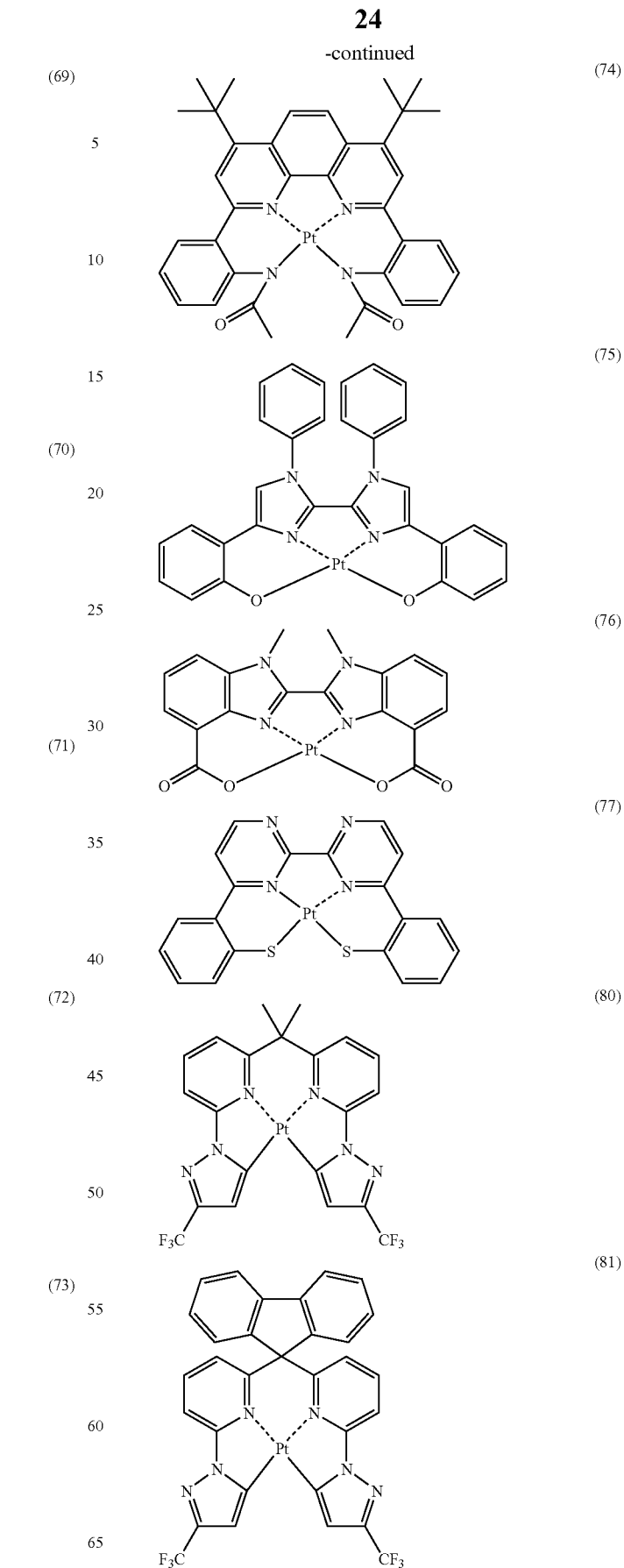

-continued
(82) 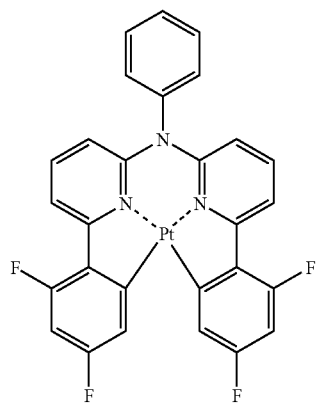
(83) 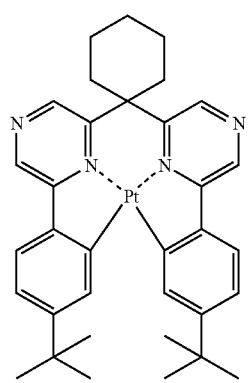
(84) 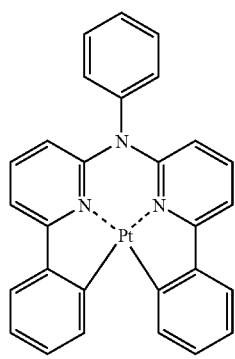
(85) 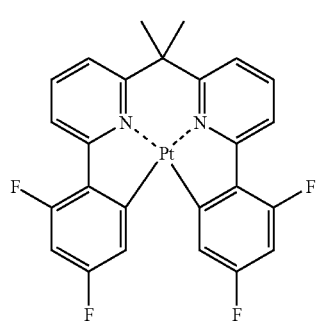
-continued
(86) 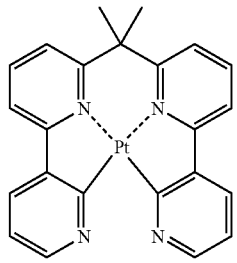
(87) 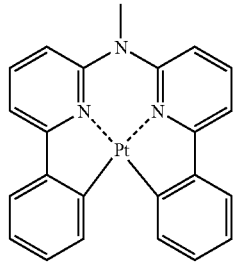
(88) 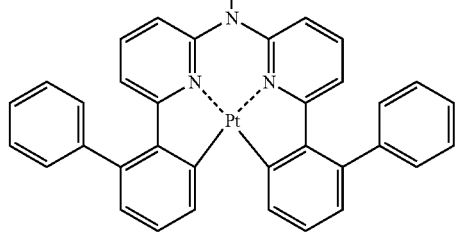
(89) 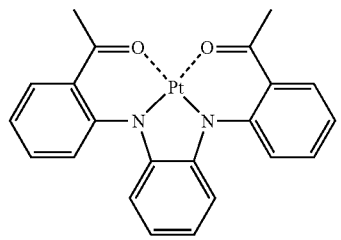
(90) 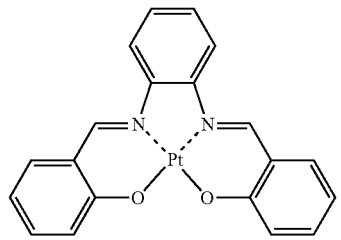
(91) 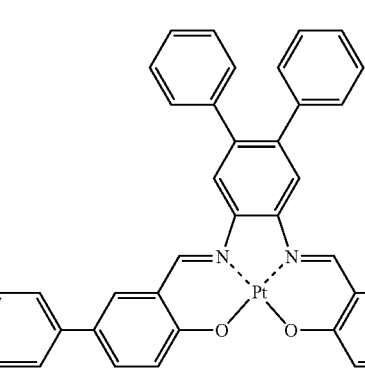

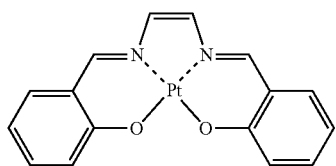
(92)
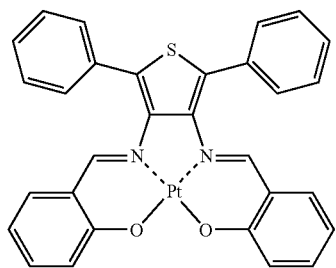
(93)
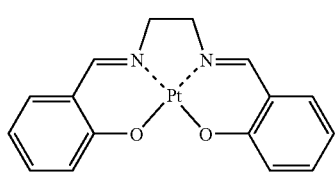
(94)
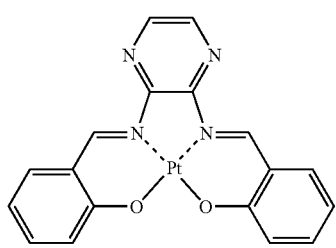
(95)
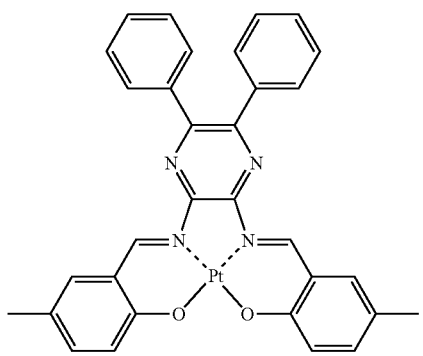
(96)
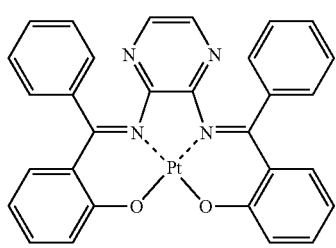
(97)
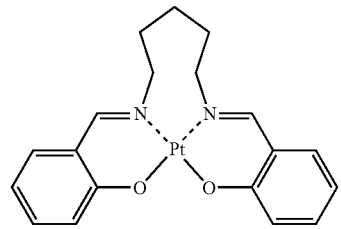
(98)
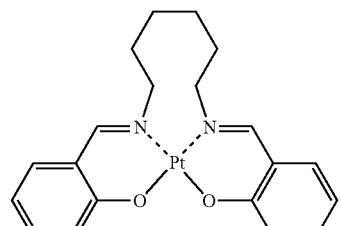
(99)
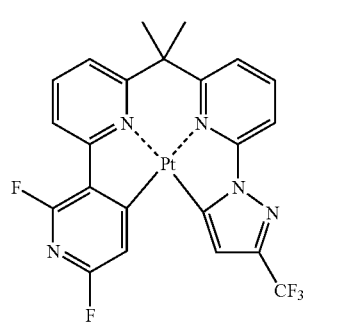
(100)
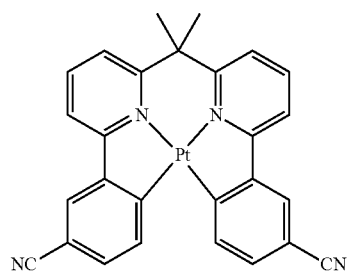
(101)
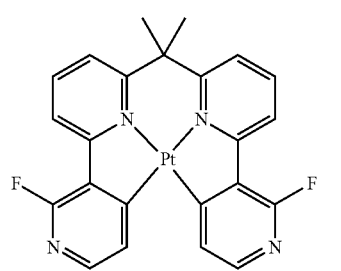
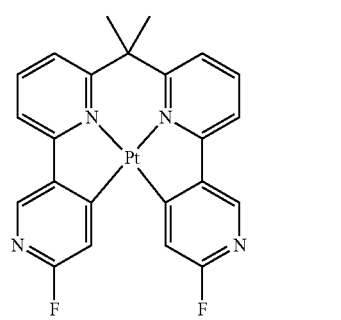

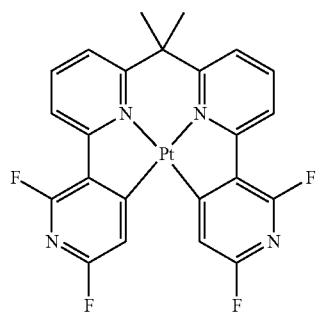
3
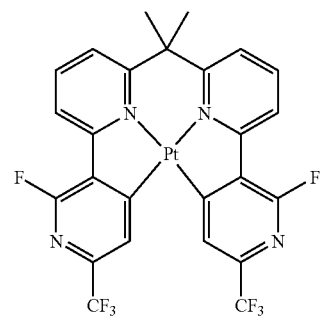
5
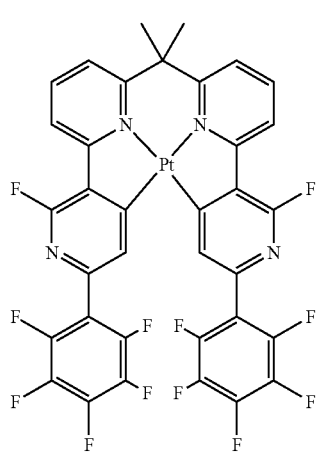
4
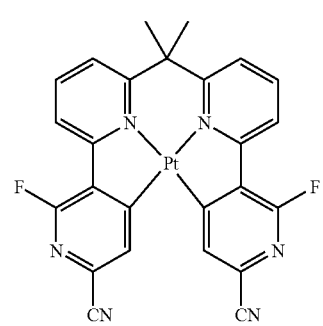
8
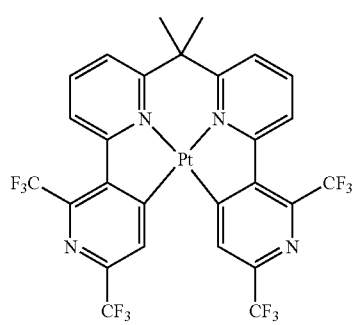
5
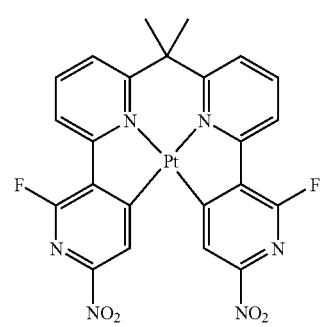
9
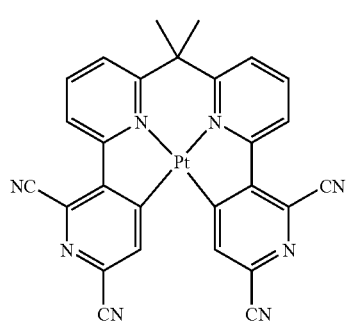
6
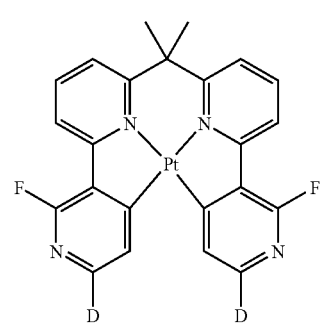
11

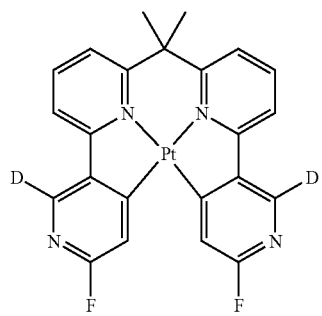 12
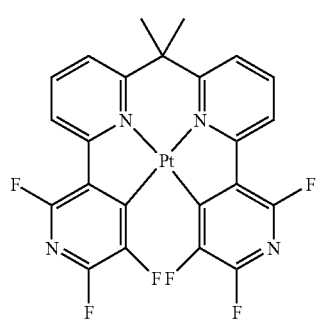 13
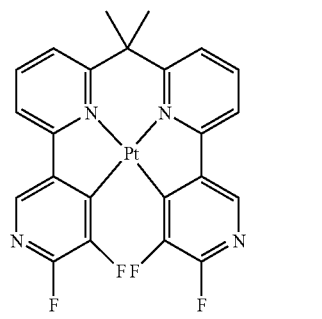 14
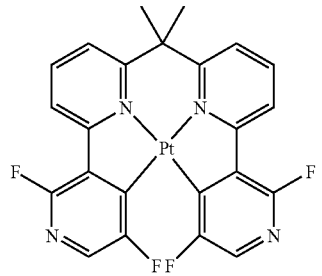 15
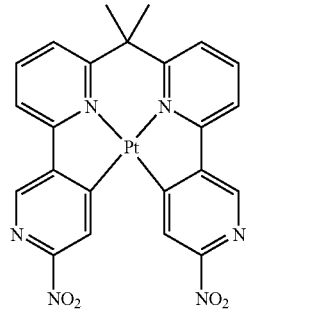 16
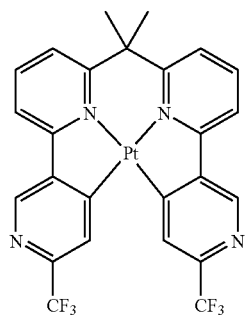 17
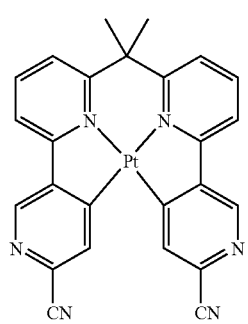 18
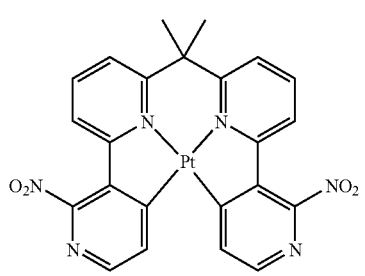 19
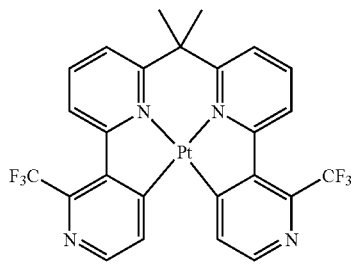 20
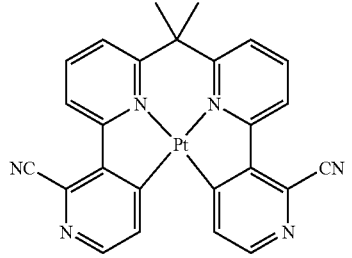 21

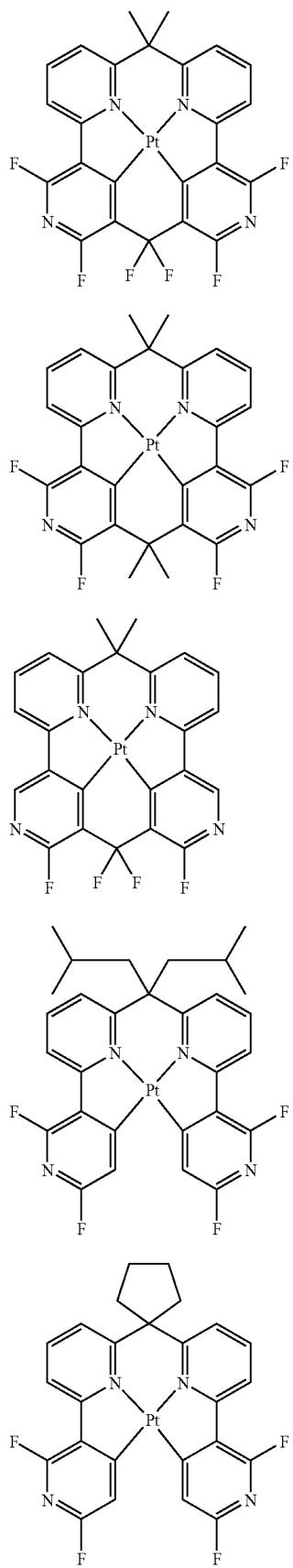
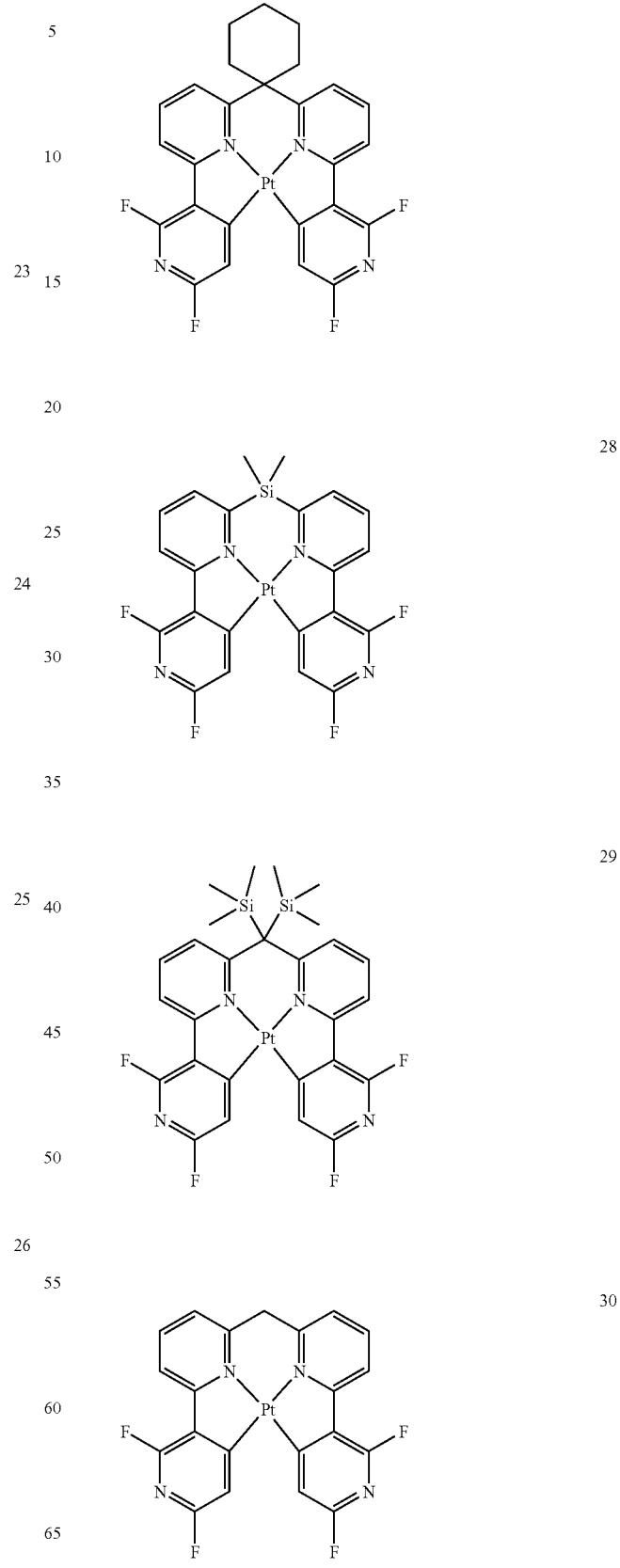

-continued
31 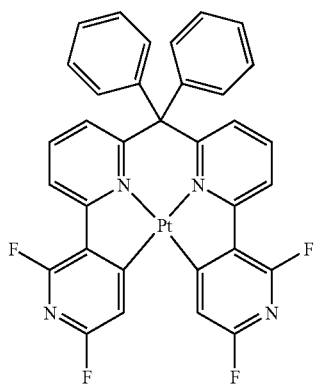
32 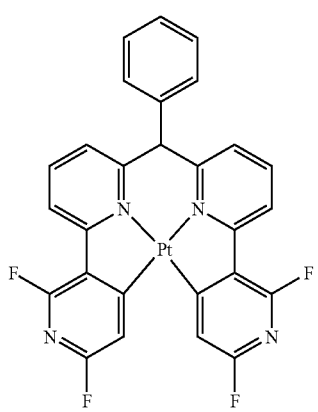
33 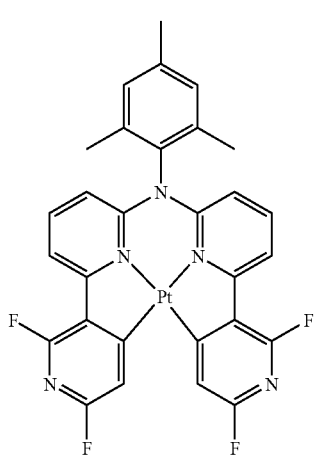
-continued
37 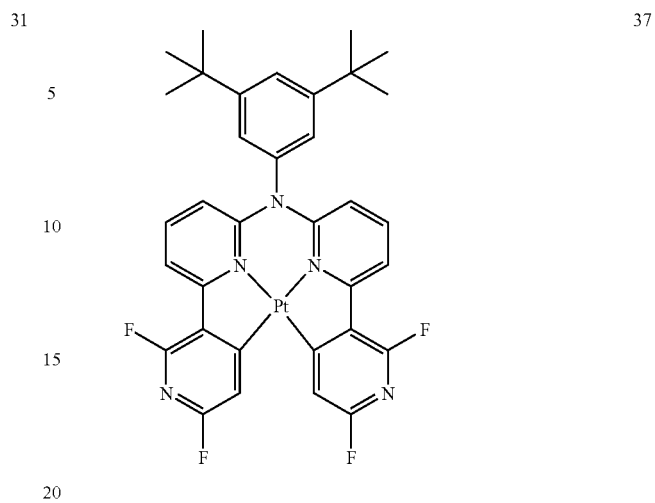
38 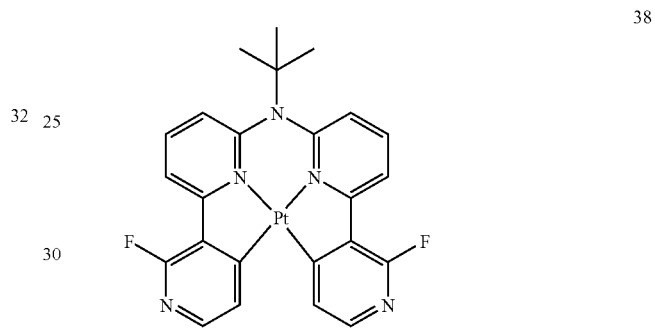
39 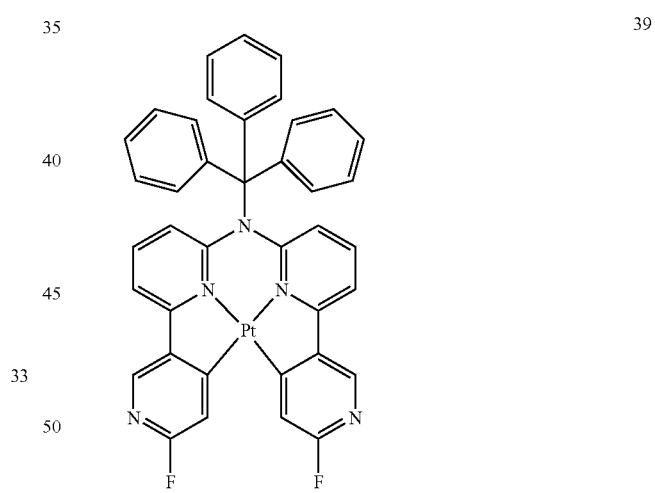
40 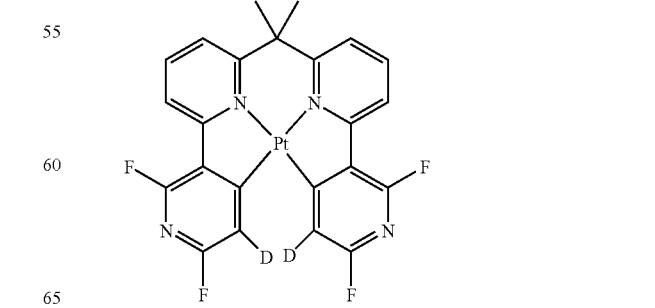

37
-continued
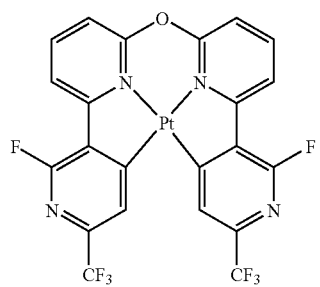
41
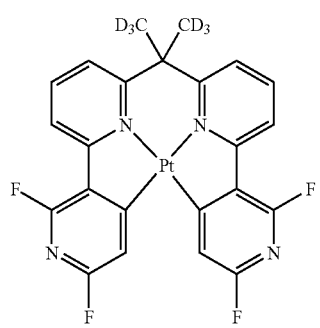
42
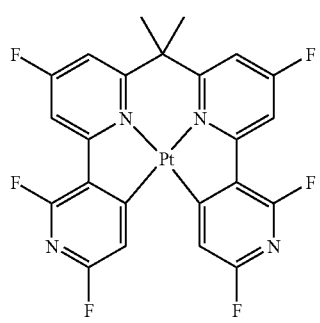
43
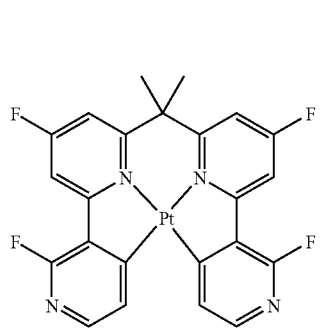
44
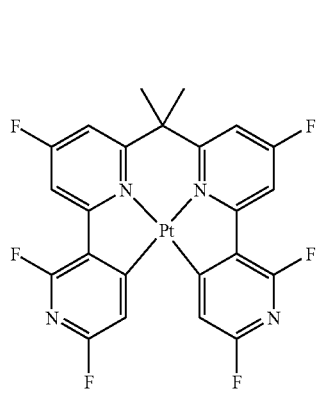
45
38
-continued
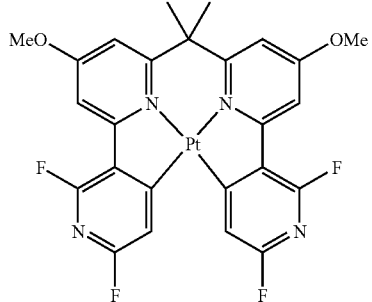
46
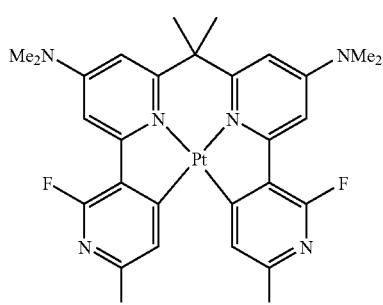
47
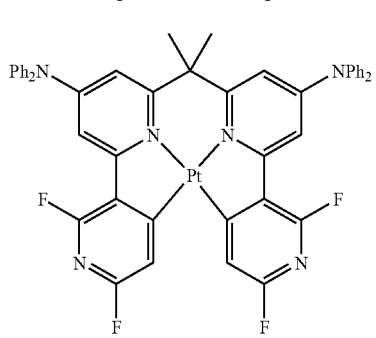
48
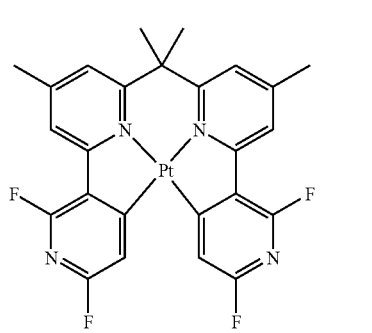
49
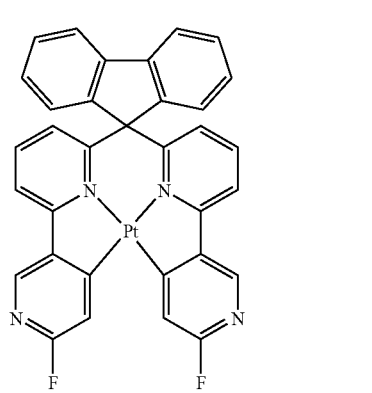
50

51
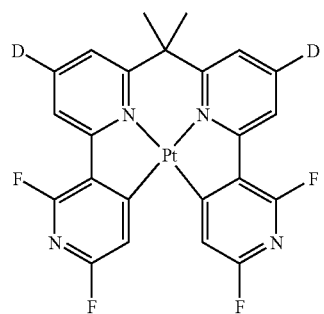
52
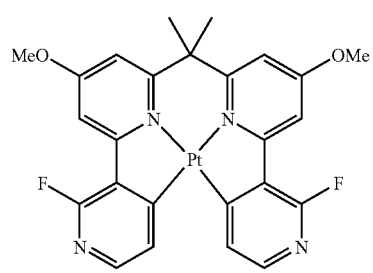
53
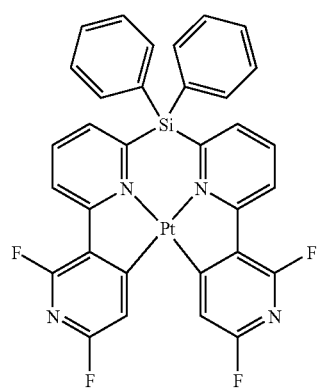
54
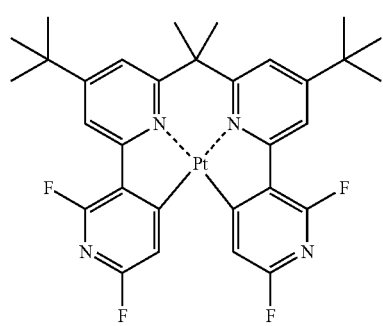
55
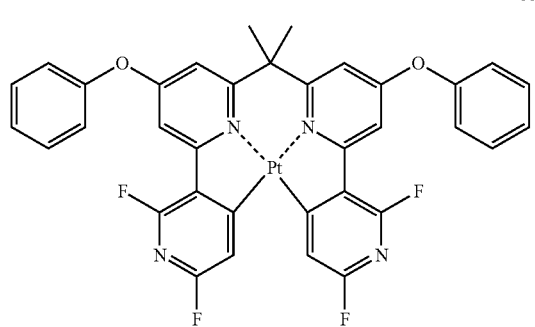
56
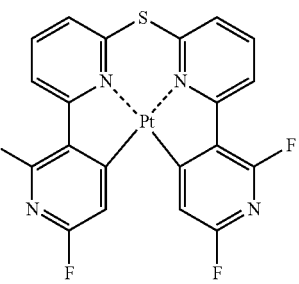
57
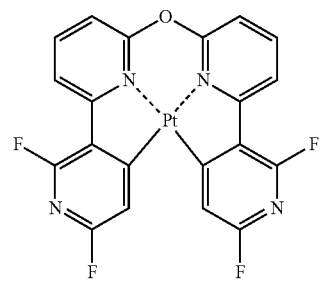
58
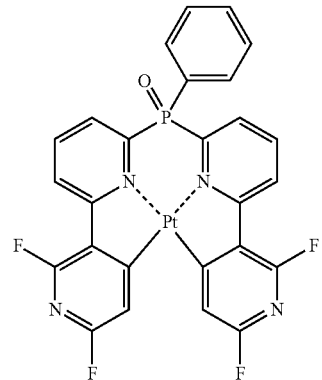
59
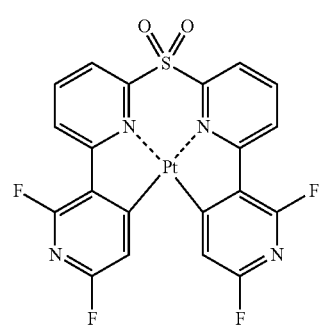

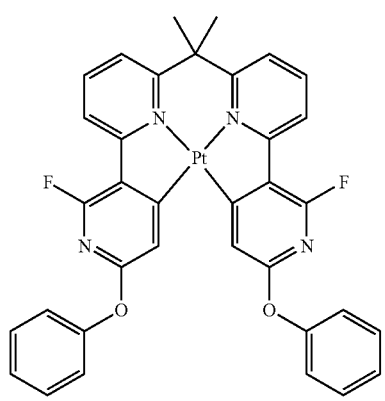
60
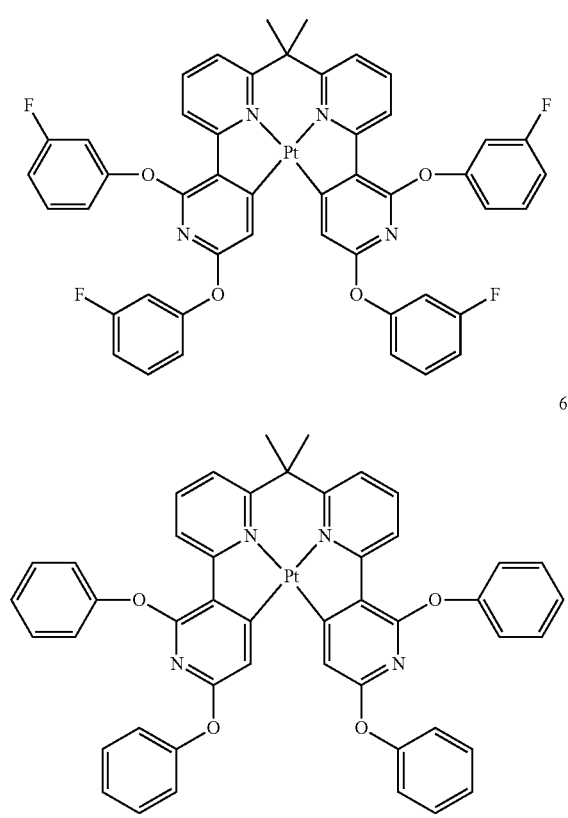
61
62
63
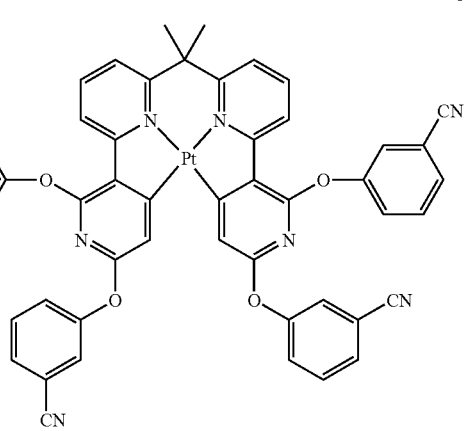
64
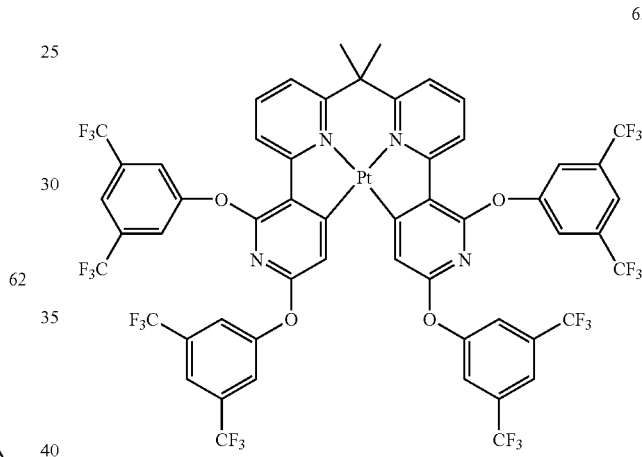
65
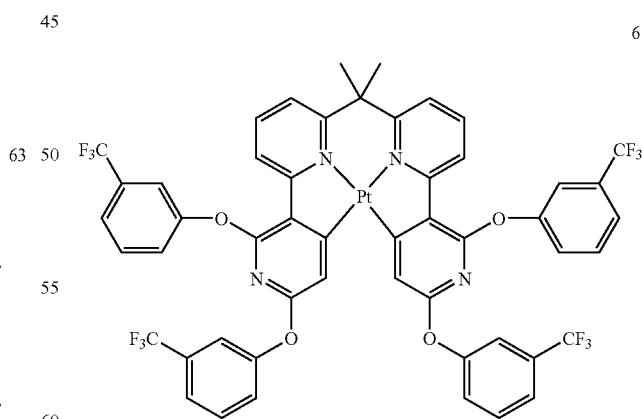
66
The following are specific examples of the iridium complex as a phosphorescent material, but the invention is not limited thereto.

D-1 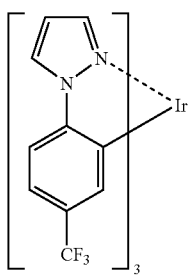
D-2 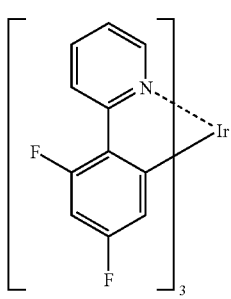
D-3 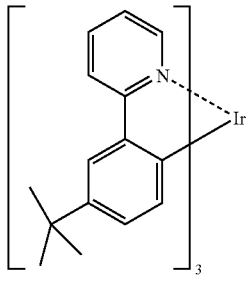
D-4 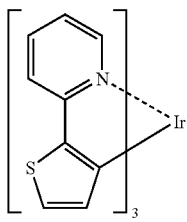
D-5 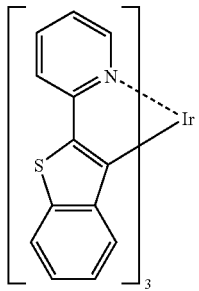
D-6 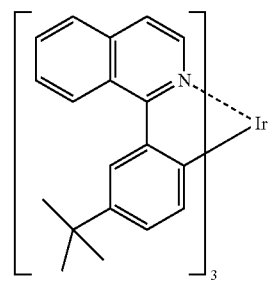
D-7 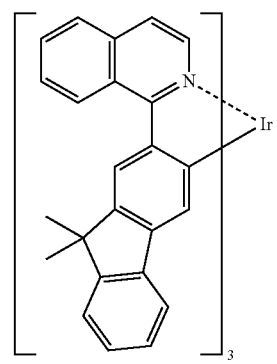
D-8
D-9 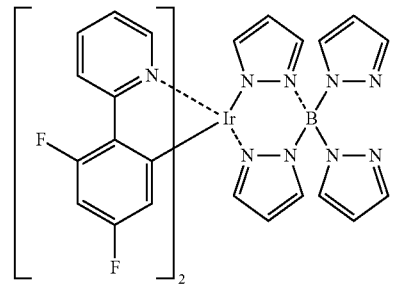
D-10 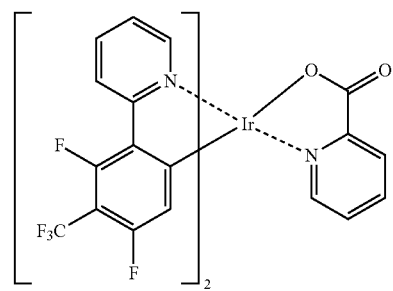

D-11 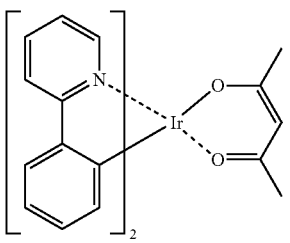

D-12 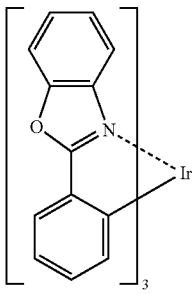

D-13 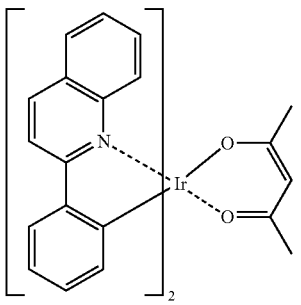

D-14 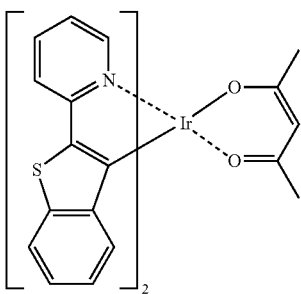

D-15 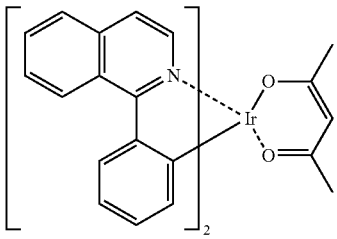

D-16 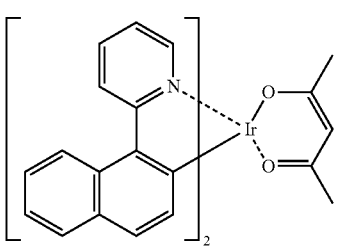

D-18 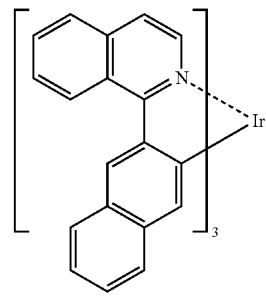

D-19 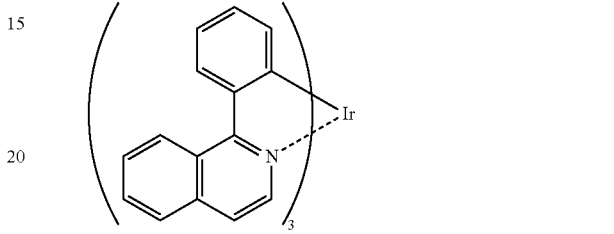

—Electrically Inert Material—

In the invention, the electrically inert material that may be included in luminescent layer 30 refers to a material that does not has a charge transportability and, although does not directly contribute to light emission, suppresses the energy transfer of excitons. Such a material is also referred to as a binder material, and is preferably an organic material having an energy difference (Eg) between the highest occupied molecular orbital and the lowest unoccupied molecular orbital of 4.0 eV or more. An organic compound having an Eg of 4.0 eV or more is typically electrically inert and exhibits a blocking effect against holes and/or electrons. In the invention, the electrically inert material (hereinafter, referred to as a binder material sometimes) more preferably has an Eg of 4.1 eV or more, particularly preferably 4.2 eV or more.

Further, the lowest excited triplet energy level (T1) of the binder material is preferably higher than the T1 of the phosphorescent material included in the same luminescent layer. For example, since the T1 of a blue phosphorescent material is approximately 2.6 eV, the T1 of the binder material is preferably higher than that, i.e., 2.7 eV or more, more preferably 2.9 eV or more, in view of suppressing the dispersion of triplet excitons from the blue phosphorescent material. In this case, even when a green or red phosphorescent material having a lower T1 is included in the same luminescent layer, the energy transfer of excitons from the blue phosphorescent material to the green or red phosphorescent material can be suppressed in a more effective manner, and a favorable color balance can be maintained in a more reliable manner.

The binder material preferably has an ionization potential (Ip) of 6.1 eV or more. By including a binder material having an Ip of 6.1 eV or more, transfer of holes from the luminescent material in the luminescent layer can be suppressed and the light-emission efficiency can be further improved. The Ip of the binder material is more preferably 6.2 eV or more, particularly preferably 6.3 eV or more. In particular, when the luminescent material is a blue phosphorescent material, the ionization potential thereof is from 5.8 to 5.9 eV. Therefore, in order to prevent the transfer of holes from the blue phosphorescent material to the electrically inert organic compound, the organic compound preferably has an ionization potential above this range, i.e, 6.0 eV or more. In this case, even when a blue phosphorescent material is included in luminescent layer 30, the light-emission efficiency of a blue color can be further improved. In particular, when using N,N'-dicarbazolyl-1,3-benzene (mCP), which is widely used as a host material together with a phosphorescent material and has an Ip of 5.9 eV, the Ip of the binder material is preferably higher than that of mCP, i.e., 6.1 eV or more, in order to prevent the transfer of holes from mCP to an adjacent layer in the luminescent layer at the cathode side, thereby further improving the light-emission efficiency.

The binder material preferably has an electron affinity (Ea) of 2.3 eV or less. By using a binder material having an Ea of 2.3 eV or less, transfer of electrons from the luminescent layer (mainly the transfer of electrons from the host material included in the luminescent layer) can be suppressed and the light-emission efficiency can be further improved. Since the electron affinity of mCP, which is widely used as a host material in the luminescent layer, is 2.4 eV, the binder material preferably has an Ea that is lower than that of mCP, i.e., 2.3 eV or less, in view of suppressing the transfer of electrons from the mCP to a layer adjacent to the luminescent layer at the anode side and further improving the light-emission efficiency.

The binder material that forms the luminescent layer according to the invention may be used alone or in combination of two or more kinds. When two kinds of binder material are used, the mixture ratio thereof is preferably from 1:99 to 50:50 by mass, more preferably from 20:80 to 50:50 by mass. By using two or more kinds of binder material in combination, the light-emission efficiency or driving durability can be improved, as well as suppressing the transfer of excitons.

The following are specific examples of the binder material according to the invention, but the invention is not limited thereto.

(Adamantane Compound)

One example of the electrically inert material that forms the luminescent layer of the organic EL device according to the invention is an adamantane compound represented by the following Formula (1).

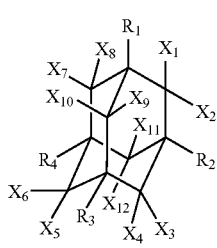

Formula (1)

In Formula (1), $R_1$ to $R_4$ each independently represent a hydrogen atom, an alkyl group having 1 to 6 carbon atoms, an alkenyl group having 2 to 6 carbon atoms, an alkynyl group having 2 to 6 carbon atoms, an aryl group, a heteroaryl group, an alkoxy group having 1 to 6 carbon atoms, an acyl group, an acyloxy group, an amino group, a nitro group, a cyano group, an ester group, an amide group, a halogen atom, a perfluoroalkyl group having 1 to 6 carbon atoms, or a silyl group. At least one of $R_1$ to $R_4$ is a group having a double bond or a triple bond. $X_1$ to $X_{12}$ each independently represent a hydrogen atom, an alkyl group having 1 to 6 carbon atoms, an alkenyl group having 2 to 6 carbon atoms, an alkynyl group having 2 to 6 carbon atoms, an aryl group, a heteroaryl group, an alkoxy group having 1 to 6 carbon atoms, an acyl group, an acyloxy group, an amino group, a nitro group, a cyano group, an ester group, an amide group, a halogen atom, a perfluoroalkyl group having 1 to 6 carbon atoms, and a silyl group.

Examples of the alkyl group having 1 to 6 carbon atoms represented by $R_1$ to $R_4$ and $X_1$ to $X_{12}$ include a methyl group, an ethyl group, an n-propyl group, an isopropyl group, an n-butyl group, a sec-butyl group (2-butyl group), an isobutyl group, a tert-butyl group, an n-pentyl group, an isopentyl group, an n-hexyl group, a cyclopropyl group, a cyclobutyl group, a cyclopentyl group, and a cyclohexyl group.

Examples of the alkenyl group having 2 to 6 carbon atoms represented by $R_1$ to $R_4$ and $X_1$ to $X_{12}$ include a vinyl group, an allyl group (1-(2-propenyl) group)), a 1-(1-propenyl) group, a 2-propenyl group, a 1-(1-butenyl) group, a 1-(2-butenyl) group, a 1-(3-butenyl) group, a 1-(1,3-butadienyl) group, a 2-(2-butenyl) group, a 1-(1-pentenyl) group, a 5-(cyclopentadienyl) group, and a 1-(1-cyclohexenyl) group.

Examples of the alkynyl group having 2 to 6 carbon atoms represented by $R_1$ to $R_4$ and $X_1$ to $X_{12}$ include an ethynyl group, a propargyl group (1-(2-propynyl) group), a 1-(1-propynyl) group, a 1-butadiynyl group, and a 1-(1,3-pentadiynyl) group.

Examples of the aryl group represented by $R_1$ to $R_4$ and $X_1$ to $X_{12}$ include a phenyl group, an o-tolyl group (1-(2-methylphenyl) group), an m-tolyl group, a p-tolyl group, a 1-(2,3-dimethylphenyl) group), a 1-(3,4-dimethylphenyl) group), a 2-(1,3-dimethylphenyl group), a 1-(3,5-dimethylphenyl) group, a 1-(2,5-dimethylphenyl) group, a p-cumenyl group, a mesityl group, a 1-naphthyl group, a 2-naphthyl group, a 1-anthranyl group, a 2-anthranyl group, a 9-anthranyl group, biphenylyl groups such as a 4-biphenylyl group (1-(4-phenyl)phenyl group), a 3-biphenylyl group and a 2-biphenylyl group, and terphenylyl groups such as a 4-p-terphenylyl group (1-4-(4-biphenylyl)phenyl) group and a 4-m-terphenylyl group (1-4-(3-biphenylyl) group).

Examples of the heteroaryl group represented by $R_1$ to $R_4$ and $X_1$ to $X_{12}$ include a heteroaryl group including a nitrogen atom, an oxygen atom, a sulfur atom or the like as a hetero atom, such as an imidazolyl group, a pyrazolyl group, a pyridyl group, a pyrazinyl group, a pyrimidyl group, a triazinyl group, a quinolyl group, an isoquinolyl group, a pyrrolyl group, an indolyl group, a furyl group, a thienyl group, a benzoxanyl group, a benzimidazolyl group, a benzthiazolyl group, a carbazolyl group, and an azepinyl group.

Examples of the alkoxy group represented by $R_1$ to $R_4$ and $X_1$ to $X_{12}$ having 1 to 6 carbon atoms include a methoxy group, an ethoxy group, an isopropoxy group, a cyclopropoxy group, an n-butoxy group, a tert-butoxy group, a cyclohexyloxy group, and a phenoxy group.

Examples of the acyl group represented by $R_1$ to $R_4$ and $X_1$ to $X_{12}$ include an acetyl group, a benzoyl group, a formyl group, and a pivaloyl group.

Examples of the acyloxy group represented by $R_1$ to $R_4$ and $X_1$ to $X_{12}$ include an acetoxy group, and a benzoyloxy group.

Examples of the amino group represented by $R_1$ to $R_4$ and $X_1$ to $X_{12}$ include an amino group, a methylamino group, a dimethylamino group, a diethylamino group, a dibenzylamino group, a diphenylamino group, a ditolylamino group, a pyrrolyzino group, a piperidyno group, and a morpholino group.

Examples of the ester group represented by $R_1$ to $R_4$ and $X_1$ to $X_{12}$ include a methylester group (methoxycarbonyl group), an ethylester group, an isopropylester group, a phenylester group, and a benzylester group.

Examples of the amide group represented by $R_1$ to $R_4$ and $X_1$ to $X_{12}$ include an amide group that is bound via a carbon atom in the amide structure, such as a N,N-dimethylamide group (dimethylaminocarbonyl group), a N-phenylamide group, and a N,N-diphenylamide group, and an amide group that is bound via a nitrogen atom in the amide structure, such as a N-methylacetoamide group (acetylmethylamino group), a N-phenylacetoamide group, and a N-phenylbenzamide group.

Examples of the halogen atom represented by $R_1$ to $R_4$ and $X_1$ to $X_{12}$ include a fluorine atom, a chlorine atom, a bromine atom, and an iodine atom.

Examples of the perfluoroalkyl group having 1 to 6 carbon atoms represented by $R_1$ to $R_4$ or $X_1$ to $X_{12}$ include a trifluoromethyl group, a pentafluoroethyl group, a 1-perfluoropropyl group, a 2-perfluoropropyl group, and a perfluoropentyl group.

Examples of the silyl group having 1 to 18 carbon atoms represented by $R_1$ to $R_4$ and $X_1$ to $X_{12}$ include a trimethylsilyl group, a triethylsilyl group, a triisopropylsilyl group, a triphenylsilyl group, a methyldiphenylsilyl group, a dimethylphenylsilyl group, a tert-butyldimethylsilyl group, and a tert-butyldiphenylsilyl group.

$R_1$ to $R_4$ or $X_1$ to $X_{12}$ may be further substituted by a substituent. Examples of the alkyl group substituted by an aryl group include a benzyl group, a 9-fluorenyl group, a 1-(2-phenylethyl) group and a 1-(4-phenyl)cyclohexyl group, and examples of the aryl group substituted by a heteroaryl group include a 1-(4-N-carbazolyl)phenyl group, a 1-(3,5-di(N-carbazolyl))phenyl group, and a 1-(4-(2-pyridyl)phenyl) group.

Preferable examples of $R_1$ to $R_4$ include a hydrogen atom, an alkyl group, an alkenyl group, an alkynyl group, an aryl group, a heteroaryl group, an alkoxy group, an amino group, an ester group, and a silyl group; more preferably a hydrogen atom, an alkyl group, an aryl group, a heteroaryl group, an alkoxy group, an amino group, and a silyl group; particularly preferably a hydrogen atom, an alkyl group, and an aryl group.

Preferable examples of $X_1$ to $X_{12}$ include a hydrogen atom, an alkyl group, an alkenyl group, an alkynyl group, an aryl group, a heteroaryl group, an alkoxy group, an amino group, an ester group, and a silyl group; more preferably a hydrogen atom, an alkyl group, and an aryl group; particularly preferably a hydrogen atom.

Preferable examples of the alkyl group having 1 to 6 carbon atoms represented by $R_1$ to $R_4$ or $X_1$ to $X_{12}$ include a methyl group, an ethyl group, an n-propyl group, an isopropyl group, an n-butyl group, an isobutyl group, a tert-butyl group, an n-pentyl group, an n-hexyl group, a cyclopentyl group, and a cyclohexyl group; more preferably a methyl group, an ethyl group, a tert-butyl group, an n-hexyl group, and a cyclohexyl group; particularly preferably a methyl group and an ethyl group.

Preferable examples of the aryl group represented by $R_1$ to $R_4$ and $X_1$ to $X_{12}$ include a phenyl group, an o-tolyl group, a 1-(3,4-dimethylphenyl) group), a 1-(3,5-dimethylphenyl) group, a 1-naphthyl group, a 2-naphthyl group, a 9-anthranyl group, biphenylyl groups, and terphenylyl groups; more preferably a phenyl group, biphenylyl groups, and terphenylyl groups; particularly preferably a phenyl group.

The hydrogen atom represented by $R_1$ to $R_4$ and $X_1$ to $X_{12}$ may be, and preferably, a deuterium atom.

All or part of the hydrogen atoms in the compound represented by Formula (1) may be substituted by a deuterium atom.

At least one of $R^1$ to $R^4$ is a group having a double bond or a triple bond, and examples of the double bond include C=C, C=O, C=S, C=N, N=N, S=O, and P=O, preferably C=C, C=O, C=N, S=O and P=O, more preferably C=C, C=O and C=N, particularly preferably C=C. Examples of the triple bond include C≡C and C≡N, preferably C≡C.

The group having a double bond or a triple bond represented by $R^1$ to $R^4$ is preferably an aryl group, more preferably a phenyl group, a biphenylyl group or a terphenylyl group as shown below, and a phenyl group is particularly preferred.

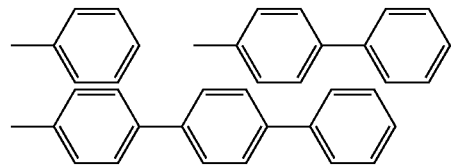

At least one of $R^1$ to $R^4$ is a group having a double bond or a triple bond, preferably two to four of $R^1$ to $R^4$, more preferably three or four of $R^1$ to $R^4$, particularly preferably all four of $R^1$ to $R^4$.

When one to three of $R^1$ to $R^4$ is a group having a double bond or a triple bond, the rest of $R^1$ to $R^4$ including only a single bond is preferably a hydrogen atom, an alkyl group, an alkoxy group or a silyl group, more preferably a hydrogen group, an alkyl group or a silyl group, particularly preferably a hydrogen atom or an alkyl group.

$R_1$ to $R_4$ and $X_1$ to $X_{12}$ may bind to each other to form a cyclic structure. For example, as shown below, $X_2$, $X_3$ and $X_9$ may bind to each other to form a diamantane structure. Further, $X_4$, $X_5$ and $X_{12}$ may bind to each other, in addition to $X_2$, $X_3$ and $X_9$, to form a triamantane structure. The diamantane structure or triamantane structure may further have a substituent.

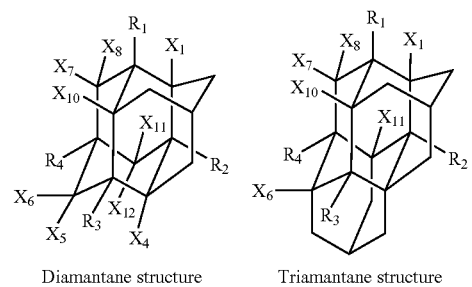

Diamantane structure     Triamantane structure

In the invention, the compound represented by Formula (1) is preferably used in combination of two or more kinds. Specifically, compounds having different groups having a double bond, or different substitution numbers thereof, are preferably used in combination. Examples of the above compounds include those having a phenyl group, a biphenylyl group or a terphenylyl group as mentioned above as a group having a double bond, with a substitution number of 1 to 4. For example, a mono-substituted compound with one group having a double bond and a tetra-substituted compound with four groups having a double bond may be used in combination.

The following are specific examples of the adamantane compound represented by Formula (1) used in the invention, but the invention is not limited thereto.
(1-1)
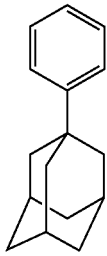
(1-2)
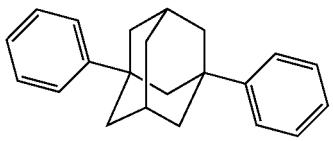
(1-3)
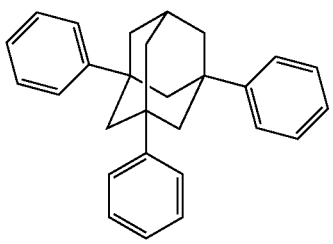
(1-4)
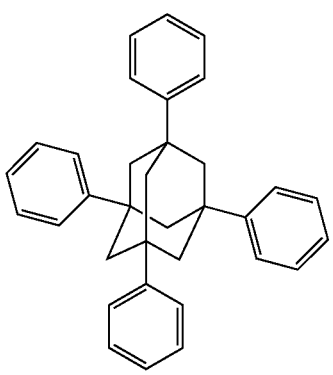
(1-5)
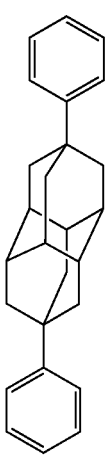
(1-6)
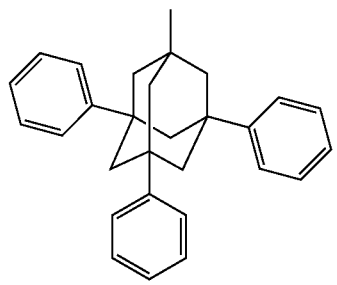
(1-7)
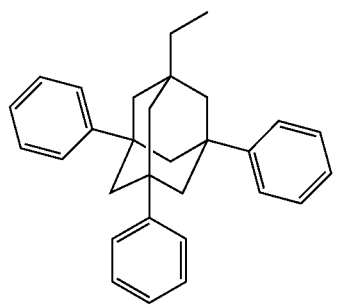
(1-8)
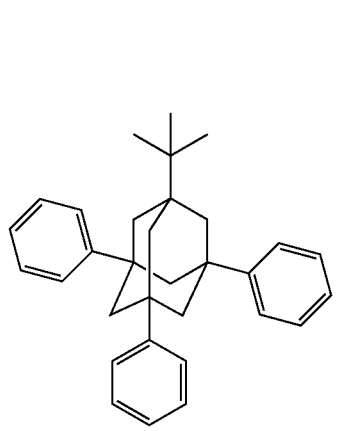
(1-9)
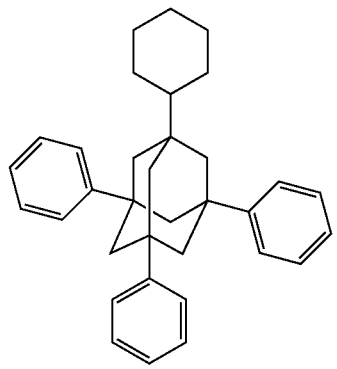

(1-10)
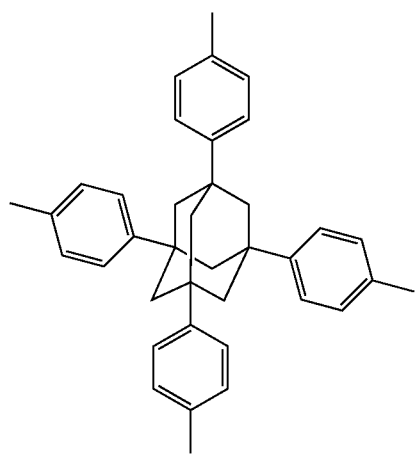
(1-11)
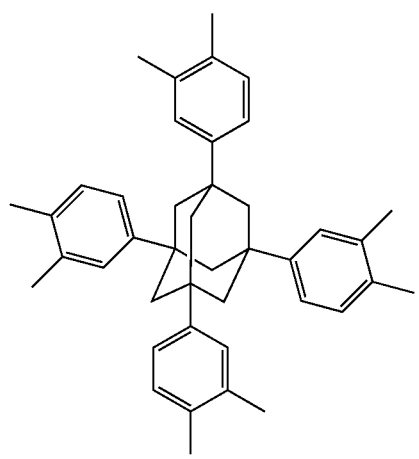
(1-12)
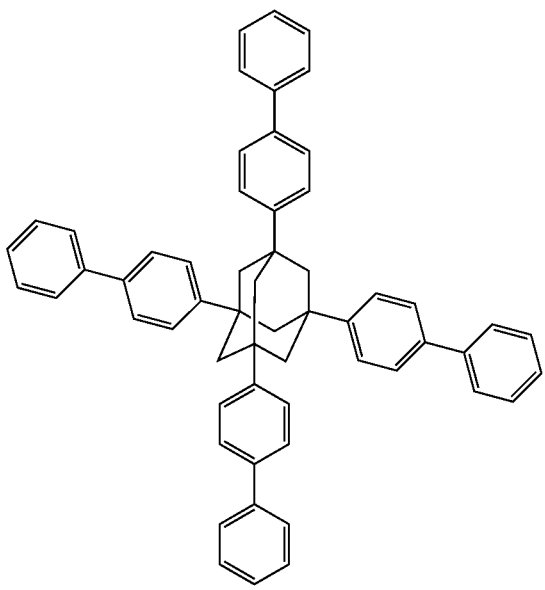
(1-13)
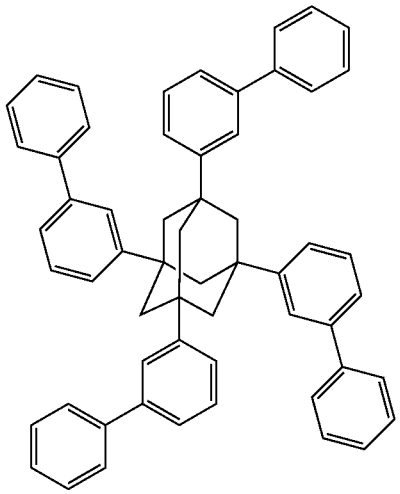
(1-14)
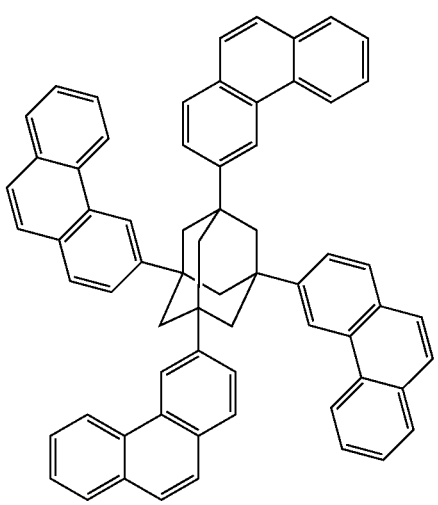
(1-15)
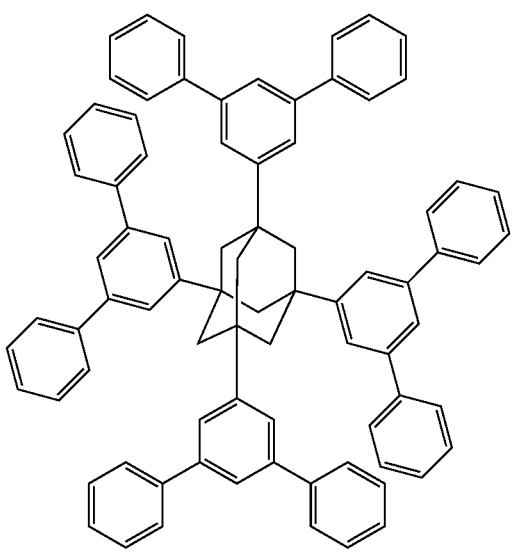

(1-16)
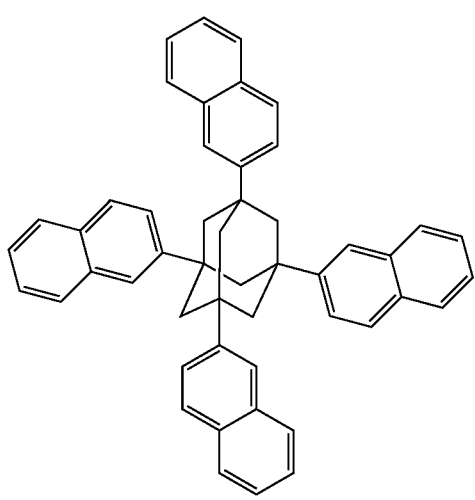
(1-17)
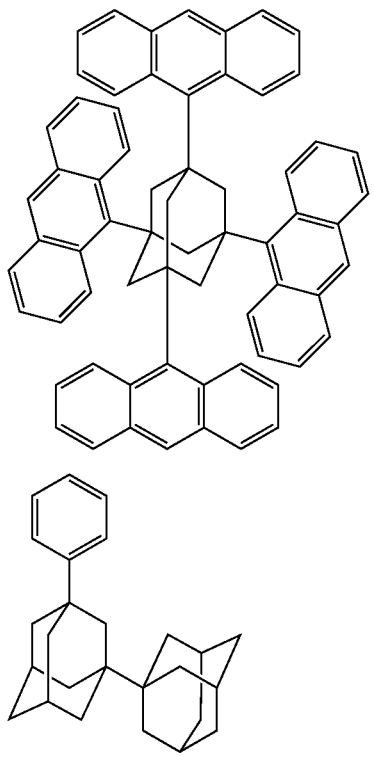
(1-18)
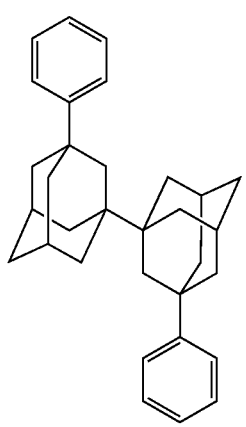
(1-19)
(1-20)
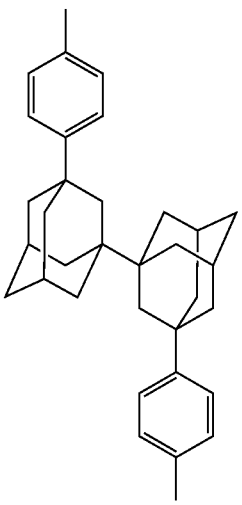
(1-21)
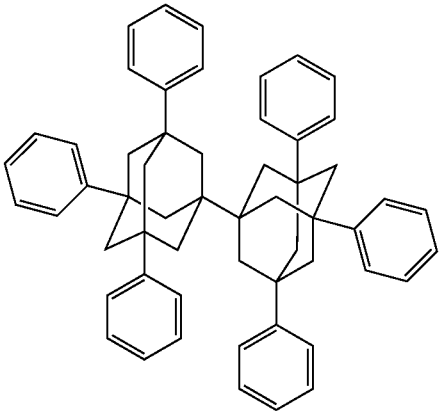
(1-22)
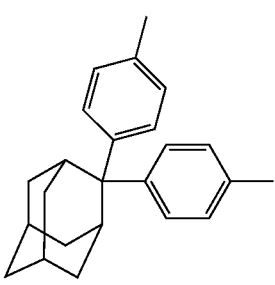

(1-23)
(1-24)
(1-25)
(1-26)
(1-27)
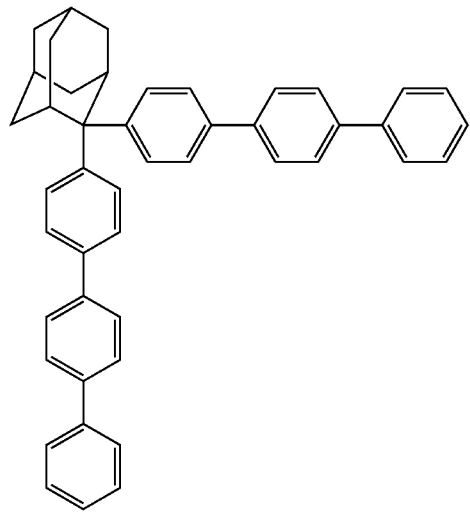
(1-28)
(1-29)
(1-30)
(1-31)
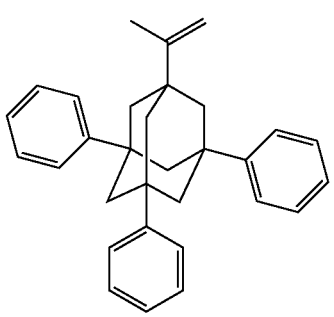
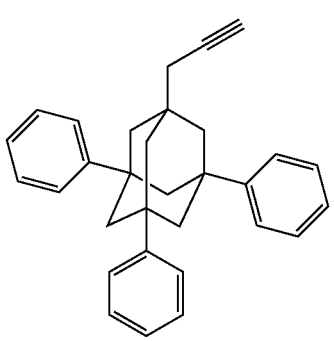
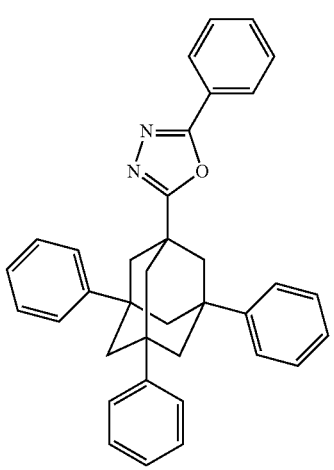
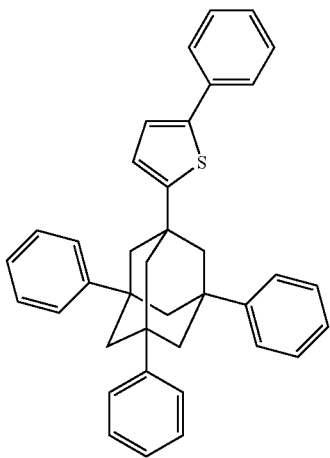

(1-32)
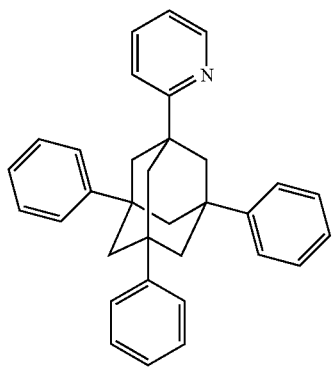
(1-33)
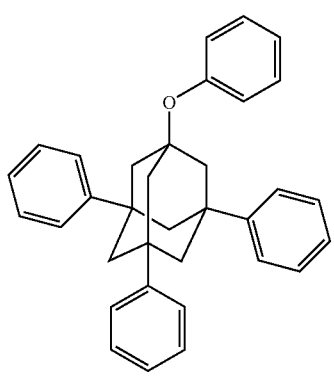
(1-34)
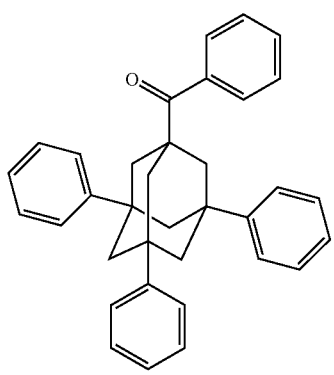
(1-35)
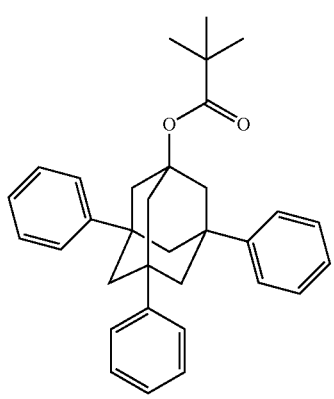
(1-36)
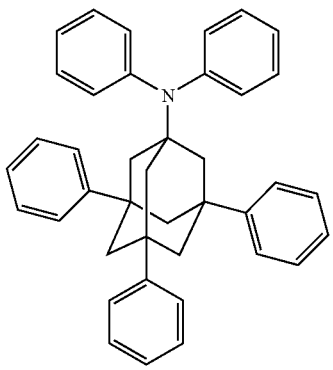
(1-37)
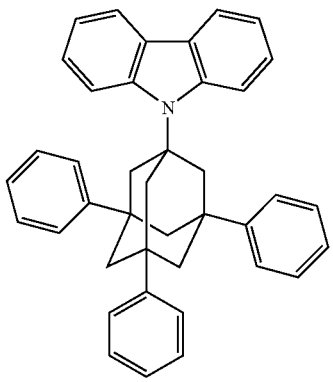
(1-38)
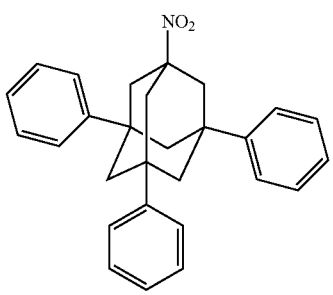
(1-39)
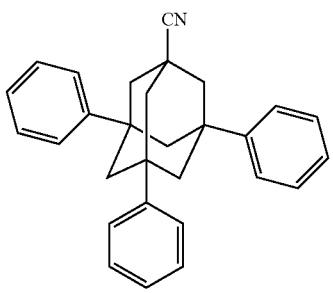
(1-40)
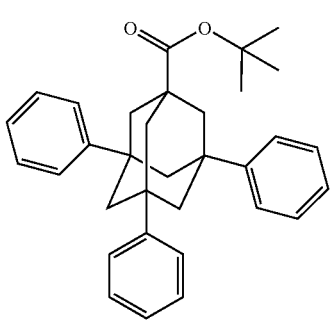

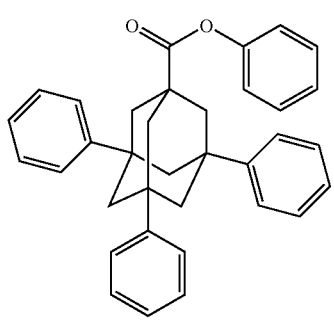
(1-41)
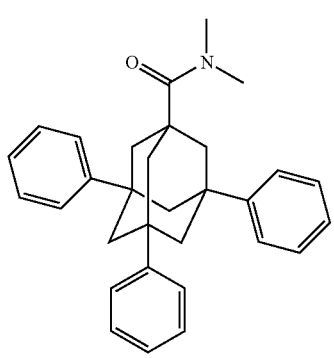
(1-42)
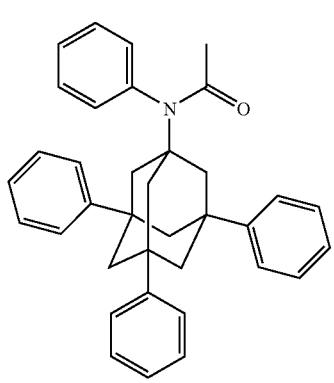
(1-43)
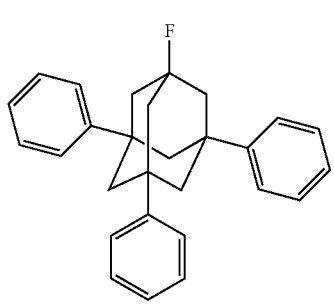
(1-44)
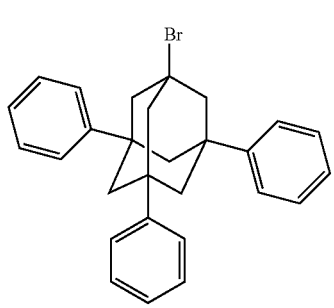
(1-45)
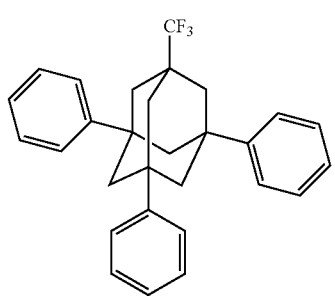
(1-46)
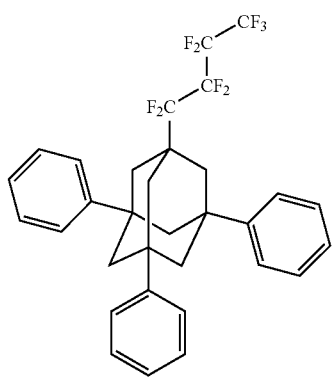
(1-47)
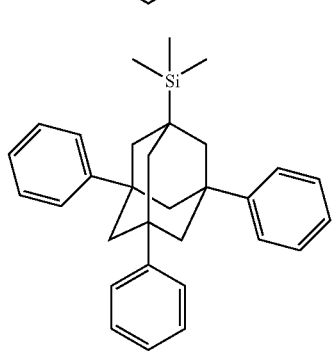
(1-48)
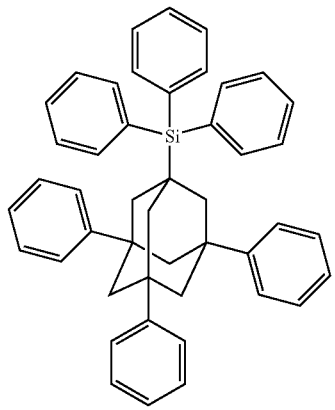
(1-49)
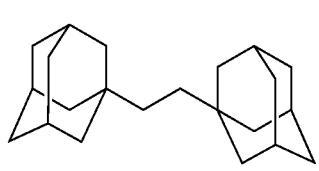
3-1

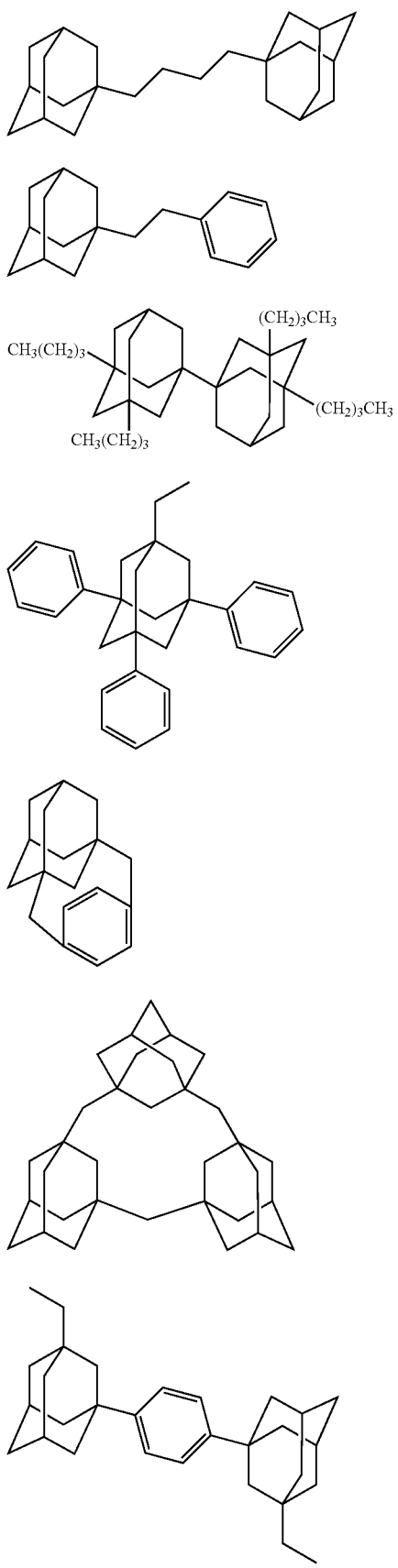

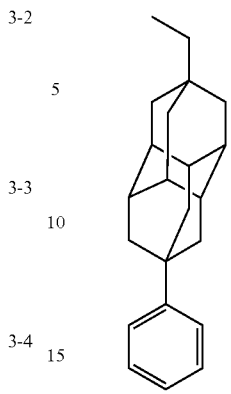

The adamantane compound represented by Formula (1) has a high degree of Eg and Ip and a low degree of Ea, and does not contribute to electron transportation, hole transportation, exciton quenching, and exciton dispersion. As a result, the adamantane compound represented by Formula (1) is thought to exhibit an effect of suppressing the energy transfer among the luminescent materials via a host material.

(Hydrocarbon Compound Having an Alkyl Structure)

A hydrocarbon compound having an alkyl group of 7 or more carbon atoms (hydrocarbon compound having an alkyl structure) may also be used as an electrically inert material included in luminescent layer 30. The hydrocarbon compound having an alkyl structure such as the above is preferably a saturated hydrocarbon compound including no double bond but including an ethylene structure (—CH$_2$CH$_2$—) in view of forming a film by performing evaporation at a relatively low temperature, more preferably a straight-chain saturated hydrocarbon compound. Further, in order to form an organic layer (luminescent layer) after the film formation, the hydrocarbon compound having an alkyl structure is preferably in the form of a solid at room temperature (25° C.). Specific examples of the hydrocarbon compound having an alkyl structure include the following structures 1-1 to 7-5.

| | |
|---|---|
| CH$_3$(CH$_2$)$_{18}$CH$_3$ | 1-1 |
| CH$_3$(CH$_2$)$_{28}$CH$_3$ | 1-2 |
| CH$_3$(CH$_2$)$_{38}$CH$_3$ | 1-3 |
| CH$_3$(CH$_2$)$_{42}$CH$_3$ | 1-4 |
| CH$_3$(CH$_2$)$_{48}$CH$_3$ | 1-5 |
| CH$_3$(CH$_2$)$_{58}$CH$_3$ | 1-6 |
| CH$_3$(CH$_2$)$_{68}$CH$_3$ | 1-7 |
| CH$_3$(CH$_2$)$_{80}$CH$_3$ | 1-8 |
| CH$_3$(CH$_2$)$_{98}$CH$_3$ | 1-9 |
| CH$_3$(CH$_2$)$_{148}$CH$_3$ | 1-10 |

2-1

CH$_3$(CH$_2$)$_{14}$ ⟨CH⟩ (CH$_2$)$_{14}$CH$_3$

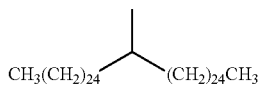
CH₃(CH₂)₂₄ ─ CH(CH₃) ─ (CH₂)₂₄CH₃
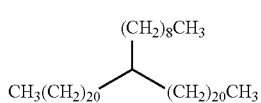
(CH₂)₈CH₃
CH₃(CH₂)₂₀ ─ CH ─ (CH₂)₂₀CH₃
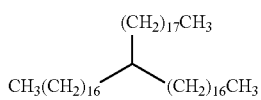
(CH₂)₁₇CH₃
CH₃(CH₂)₁₆ ─ CH ─ (CH₂)₁₆CH₃
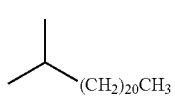
(CH₂)₂₀CH₃
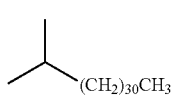
(CH₂)₃₀CH₃
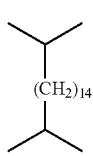
(CH₂)₁₄
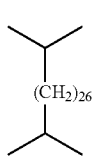
(CH₂)₂₆
(CH₂)₂₄
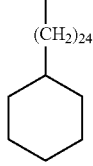
(CH₂)₃₅CH₃
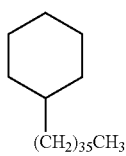
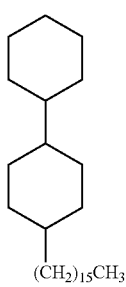
(CH₂)₁₅CH₃
2-2
2-3
2-4
2-5
2-6
2-7
2-8
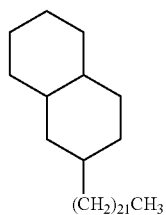
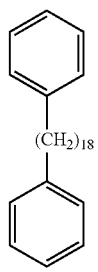
(CH₂)₂₁CH₃
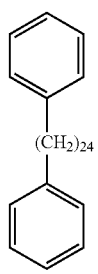
(CH₂)₁₈
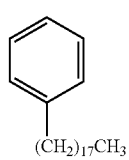
(CH₂)₂₄
4-1
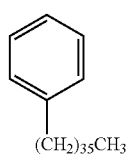
(CH₂)₁₇CH₃
4-2
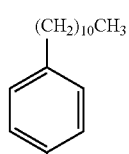
(CH₂)₃₅CH₃
4-3
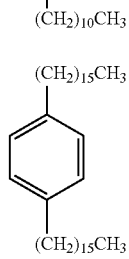
(CH₂)₁₀CH₃
(CH₂)₁₀CH₃
(CH₂)₁₅CH₃
(CH₂)₁₅CH₃
4-4
5-1
5-2
5-3
5-4
5-5
5-6

6-1 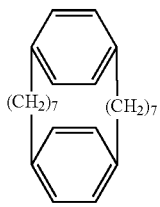

6-2 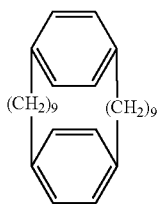

7-1 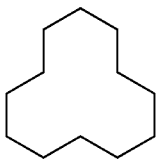

7-2 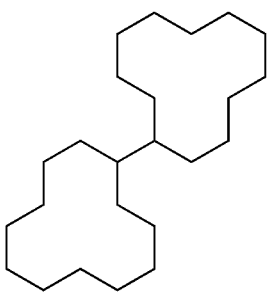

7-3 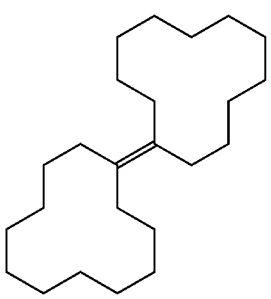

7-4 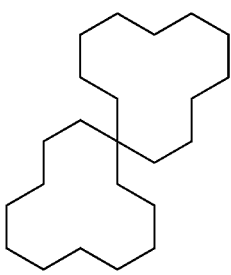

7-5 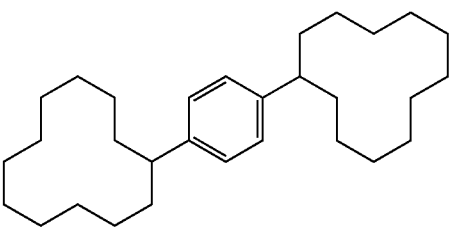

An aromatic hydrocarbon compound represented by the following Formula (x) or Formula (z) is also preferably used as an electrically inert material included in the luminescent layer, and the following compounds are applicable, for example.

$$L\text{-}(Ar)_m \qquad \text{Formula (x)}$$

In Formula (x), Ar represents a group represented by the following Formula (y), L represents a trivalent or higher-valent benzene skeleton, and m represents an integer of 3 or more.

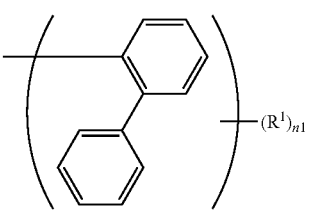

Formula (y)

In Formula (y), $R^1$ represents a substituent; when there are two or more of $R^1$, each $R^1$ may be the same or different; and n1 represents an integer of 0 to 9.

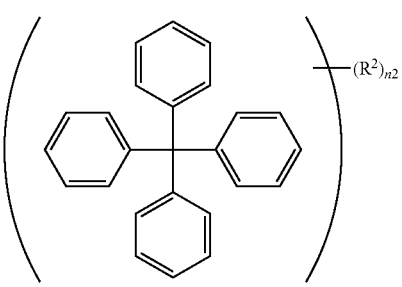

Formula (z)

In Formula (z), $R^2$ represents a substituent; when there are two or more of $R^2$, each $R^2$ may be the same or different; and n2 represents an integer of from 0 to 20.

—Formula (x)—

The L included in Formula (x) represents a trivalent or higher-valent benzene skeleton, Ar represents a group represented by Formula (y), and m represents an integer of 3 or more. m is preferably from 3 to 6, more preferably 3 or 4.

—Formula (y)—

The $R^1$ included in Formula (y) represents a substitutent, and examples thereof include an alkyl group (preferably having 1 to 30 carbon atoms, more preferably 1 to 20 carbon atoms, particularly preferably 1 to 10 carbon atoms, such as a methyl group, an ethyl group, an iso-propyl group, a tert-butyl group, an n-octyl group, an n-decyl group, an n-hexadecyl group, a cyclopropyl group, a cyclopentyl group, and a cyclohexyl group), an alkenyl group (preferably having 2 to 30 carbon atoms, more preferably 2 to 20 carbon atoms, particularly preferably 2 to 10 carbon atoms, such as a vinyl group, an allyl group, a 2-butenyl group, and a 3-pentenyl group), an alkynyl group (preferably having 2 to 30 carbon atoms, more preferably 2 to 20 carbon atoms, particularly preferably 2 to 10 carbon atoms, such as a propargyl group and a 3-penthynyl group), an aryl group (preferably having 6 to 30 carbon atoms, more preferably 6 to 20 carbon atoms, particularly preferably 6 to 12 carbon atoms, such as a phenyl group, a p-methylphenyl group, a naphthyl group, and an anthranyl group), an amino group (preferably having 0 to 30 carbon atoms, more preferably having 0 to 20 carbon atoms, particularly preferably 0 to 10 carbon atoms, such as an amino group, a methylamino group, a dimethylamino group, a diethylamino group, a dibenzylamino group, a diphenylamino group, and a ditolylamino group), an alkoxy group (preferably having 1 to 30 carbon atoms, more preferably 1 to 20 carbon atoms, particularly preferably 1 to 10 carbon atoms, such as a methoxy group, an ethoxy group, a butoxy group, and a 2-ethylhexyloxy group), an aryloxy group (preferably having 6 to 30 carbon atoms, more preferably 6 to 20 carbon atoms, particularly preferably 6 to 12 carbon atoms, such as a phenyloxy group, a 1-naphthyloxy group, and a 2-naphthyloxy group), a heteroaryloxy group (preferably having 1 to 30 carbon atoms, more preferably 1 to 20 carbon atoms, particularly preferably 1 to 12 carbon atoms, such as a pyridyloxy group, a pyrazyloxy group, a pyrimidyloxy group, and a quinolyloxy group), an acyl group (preferably having 1 to 30 carbon atoms, more preferably 1 to 20 carbon atoms, particularly preferably 1 to 12 carbon atoms, such as an acetyl group, a benzoyl group, a formyl group, and a pivaloyl group), and an alkoxycarbonyl group (preferably having 2 to 30 carbon atoms, more preferably 2 to 20 carbon atoms, particularly preferably 2 to 12 carbon atoms, such as a methoxycarbonyl group, and an ethoxycarbonyl group), an aryloxycarbonyl group (preferably having 7 to 30 carbon atoms, more preferably 7 to 20 carbon atoms, particularly preferably 7 to 12 carbon atoms, such as a phenyloxycarbonyl group), an acyloxy group (preferably having 2 to 30 carbon atoms, more preferably 2 to 20 carbon atoms, particularly preferably 2 to 10 carbon atoms, such as an acetoxy group and a benzoyloxy group), an acylamino group (preferably having 2 to 30 carbon atoms, more preferably 2 to 20 carbon atoms, particularly preferably 2 to 10 carbon atoms, such as an acetylamino group and a benzoylamino group), an alkoxycarbonylamino group (preferably having 2 to 30 carbon atoms, more preferably 2 to 20 carbon atoms, particularly preferably 2 to 12 carbon atoms, such as a methoxycarbonylamino group), an aryloxycarbonylamino group (preferably having 7 to 30 carbon atoms, more preferably 7 to 20 carbon atoms, particularly preferably 7 to 12 carbon atoms, such as a phenyloxycarbonylamino group), a sulfonylamino group (preferably having 1 to 30 carbon atoms, more preferably 1 to 20 carbon atoms, particularly preferably 1 to 12 carbon atoms, such as a methanesulfonylamino group and a benzenesulfonylamino group), a sulfamoyl group (preferably having 0 to 30 carbon atoms, more preferably 0 to 20 carbon atoms, particularly preferably 0 to 12 carbon atoms, such as a sulfamoyl group, a methylsulfamoyl group, a dimethylsulfamoyl group, and a phenylsulfamoyl group), a carbamoyl group (preferably having 1 to 30 carbon atoms, more preferably 1 to 20 carbon atoms, particularly preferably 1 to 12 carbon atoms, such as a carbamoyl group, a methylcarbamoyl group, a diethylcarbamoyl group, and a phenylcarbamoyl group), an alkylthio group (preferably having 1 to 30 carbon atoms, more preferably 1 to 20 carbon atoms, particularly preferably 1 to 12 carbon atoms, such as a methylthio group and an ethylthio group), an arylthio group (preferably having 6 to 30 carbon atoms, more preferably having 6 to 20 carbon atoms, particularly preferably having 6 to 12 carbon atoms, such as a phenylthio group), a heteroarylthio group (preferably having 1 to 30 carbon atoms, more preferably 1 to 20 carbon atoms, particularly preferably 1 to 12 carbon atoms, such as a pyridylthio group, a 2-benzimidazolylthio group, a 2-benzoxazolylthio group, and a 2-benzthiazolylthio group), a sulfonyl group (preferably having 1 to 30 carbon atoms, more preferably 1 to 20 carbon atoms, particularly preferably 1 to 12 carbon atoms, such as a mesyl group and a tosyl group), a sulfinyl group (preferably having 1 to 30 carbon atoms, more preferably having 1 to 20 carbon atoms, particularly preferably 1 to 12 carbon atoms, such as a methanesulfinyl group and a benzenesulfinyl group), an ureido group (preferably having 1 to 30 carbon atoms, more preferably 1 to 20 carbon atoms, particularly preferably 1 to 12 carbon atoms, such as an ureido group, a methylureido group, and a phenylureido group), an amide phosphate group (preferably having 1 to 30 carbon atoms, more preferably having 1 to 20 carbon atoms, particularly preferably having 1 to 12 carbon atoms, such as a diethyl amide phosphate group and a phenyl amide phosphate group), a hydroxyl group, a mercapto group, a halogen atom (such as a fluorine atom, a chlorine atom, a bromine atom, and an iodine atom), a cyano group, a sulfo group, a carboxyl group, a nitro group, a hydroxamic group, a sulfino group, a hydrazino group, an imino group, and a heterocyclic group (preferably having 1 to 30 carbon atoms, more preferably having 1 to 12 carbon atoms, preferably having a nitrogen atom, an oxygen atom or a sulfur atom as a hetero atom, such as an imidazolyl group, a pyridyl group, a quinolyl group, a furyl group, a thienyl group, a piperidyl group, a morpholino group, a benzoxazolyl group, and a benzimidazolyl group, a benzthiazolyl group, a carbazolyl group, and an azepinyl group), and a silyl group (preferably having 3 to 40 carbon atoms, more preferably having 3 to 30 carbon atoms, particularly preferably 3 to 24 carbon atoms, such as a trimethylsilyl group and a triphenylsilyl group).

When there are two or more $R^1$, each $R^1$ may be the same or different, and may bind to each other to form a ring. $R^1$ may be further substituted.

n1 represents an integer of from 0 to 9, preferably from 0 to 6, more preferably from 0 to 3.

—Formula (z)—

In Formula (z), $R^2$ represents a substituent, and the preferred examples thereof are the same as those of the aforementioned substituent $R^1$.

n2 is an integer of from 0 to 20, preferably from 0 to 10, more preferably from 0 to 5.

The following are specific examples of the compound represented by Formula (x) or Formula (z), but the invention is not limited thereto.

(1)
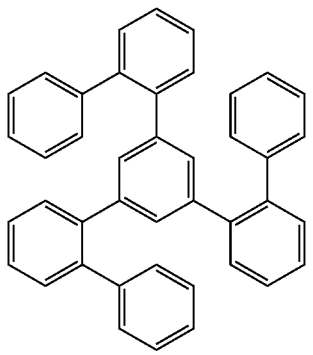
(2)
(3)
(4)
(5)
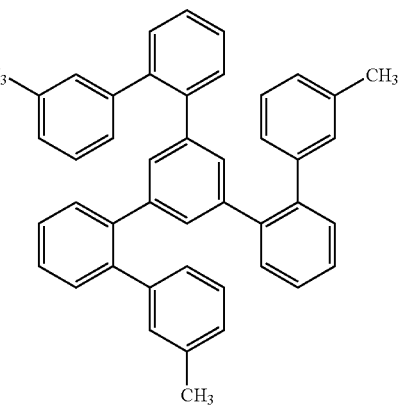
(6)
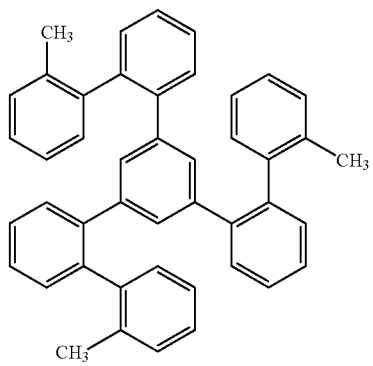
(7)
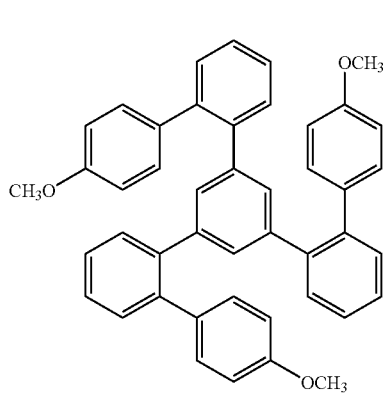
(8)
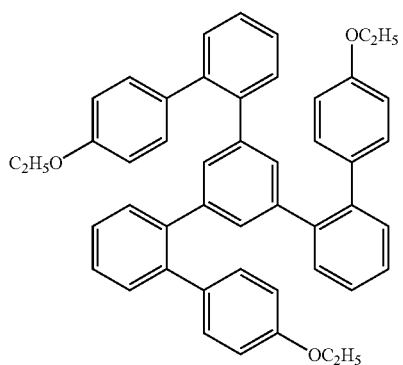

(9)
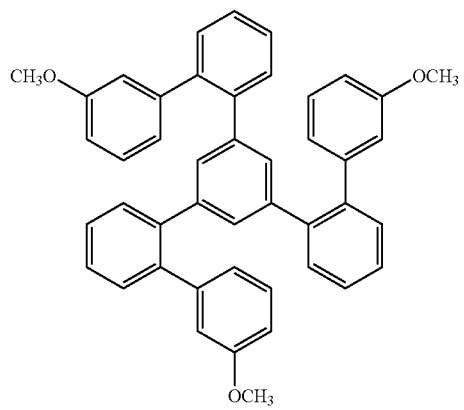
(10)
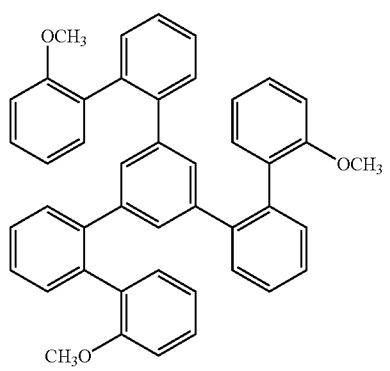
(11)
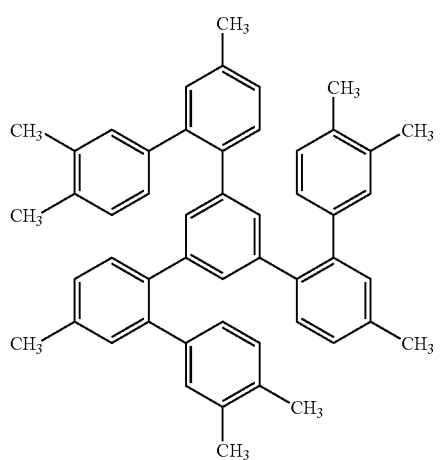
(12)
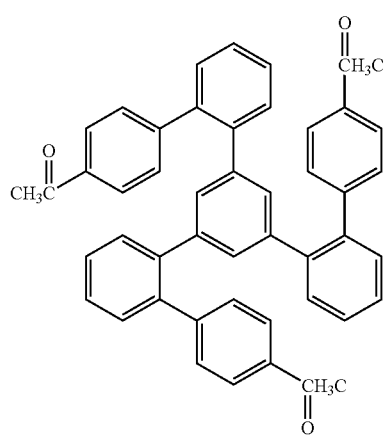
(13)
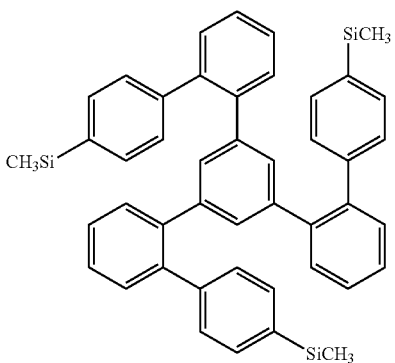
(14)
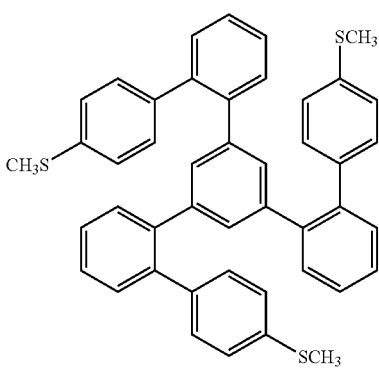
(15)
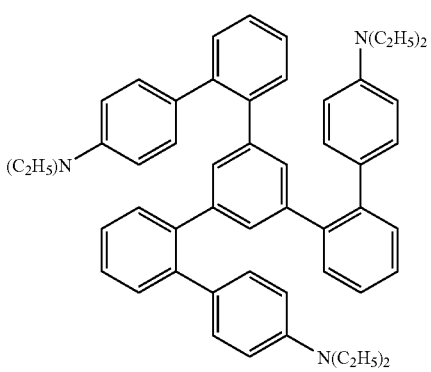
(16)
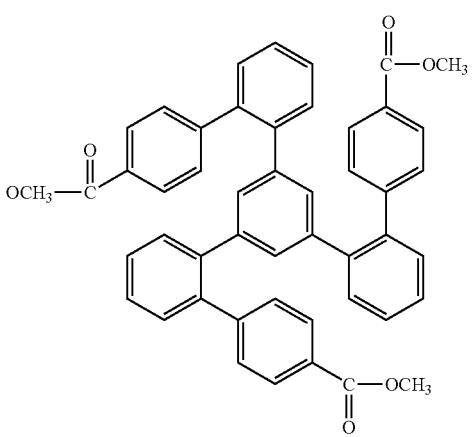

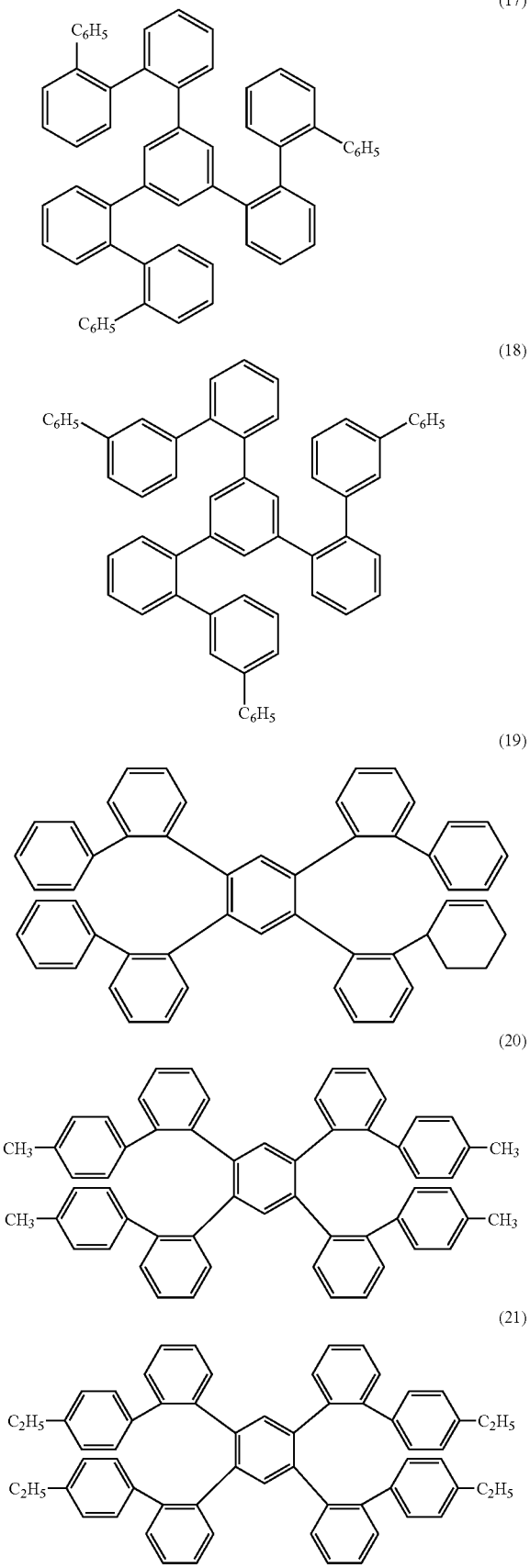
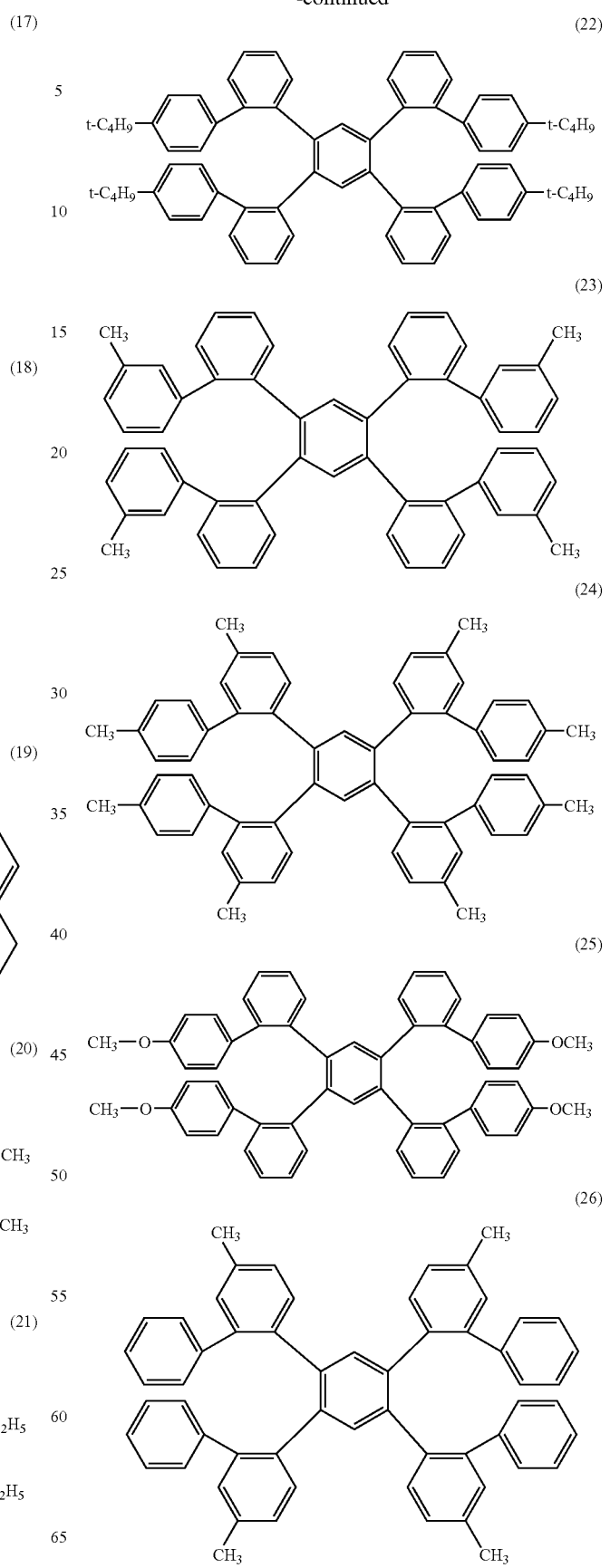

77
-continued
(27)
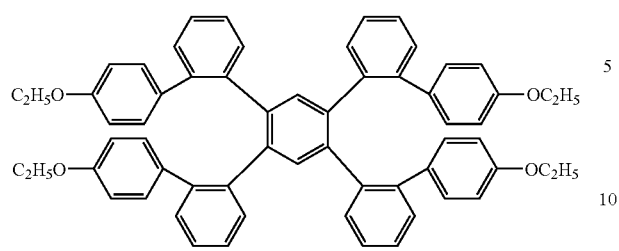
(28)
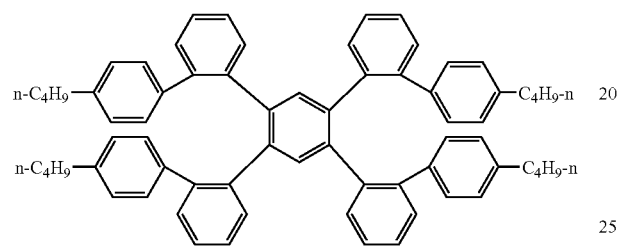
(29)
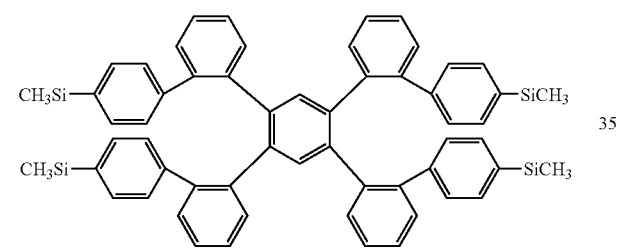
(30)
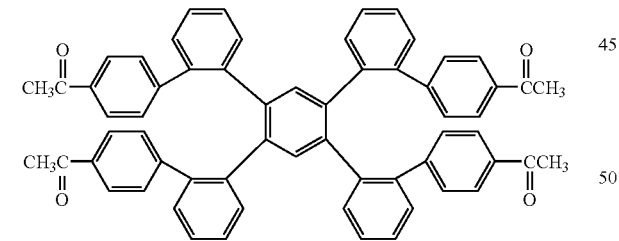
(31)
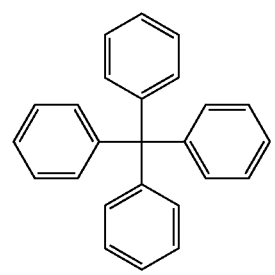
78
-continued
(32)
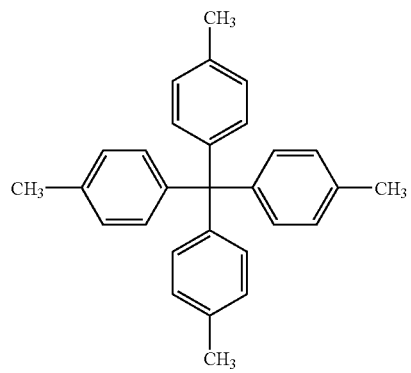
(33)
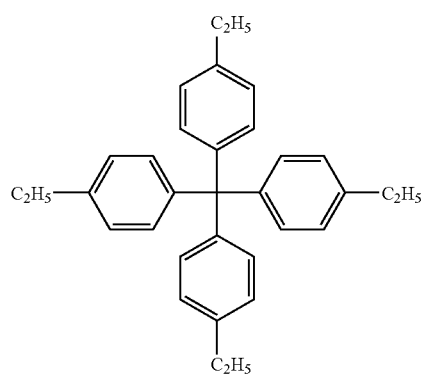
(34)
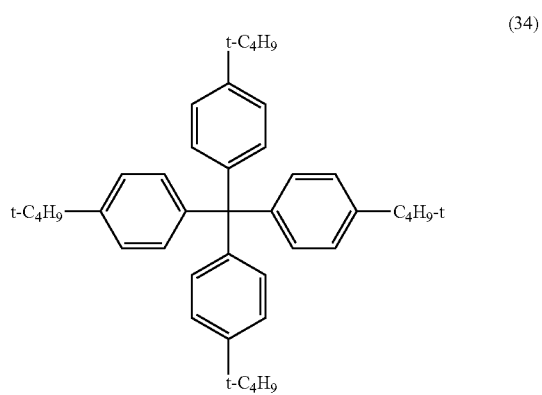
(35)
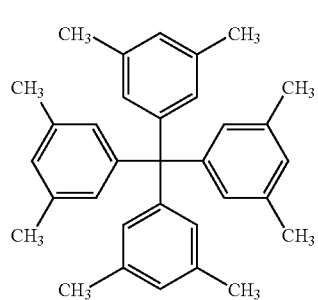

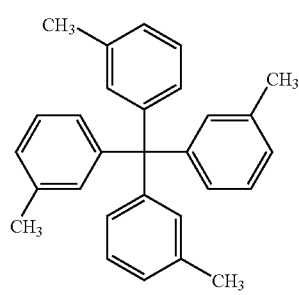 (36)
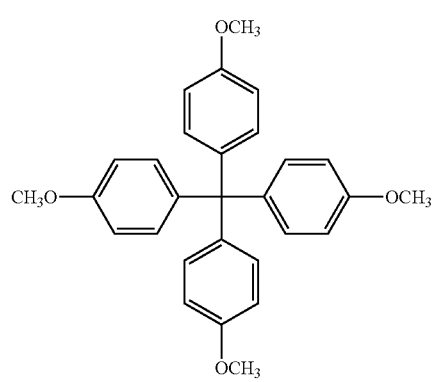 (37)
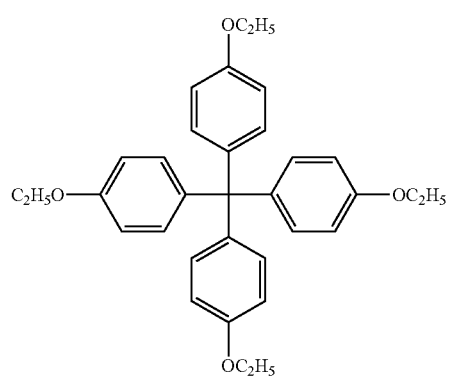 (38)
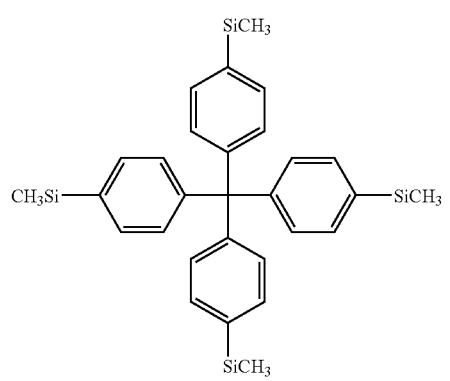 (39)
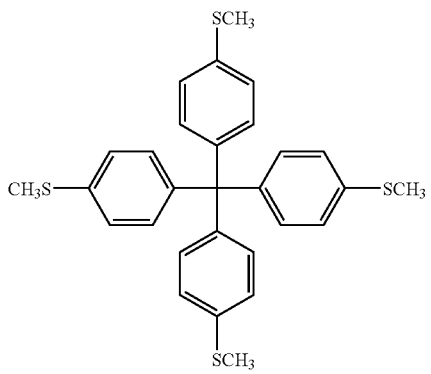 (40)
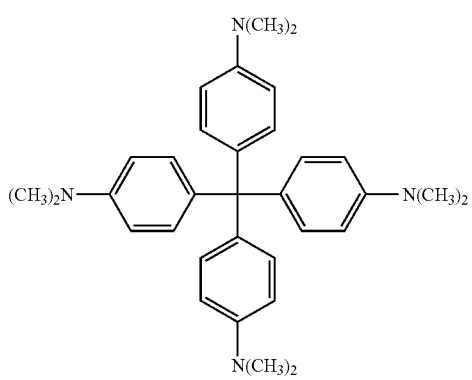 (41)
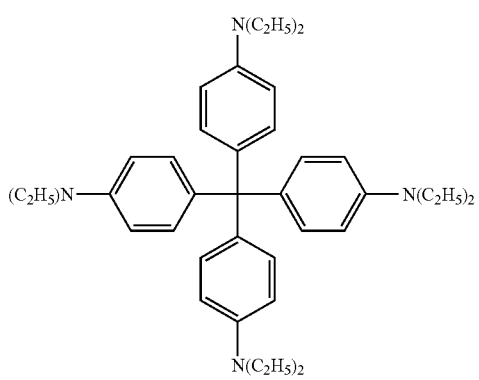 (42)
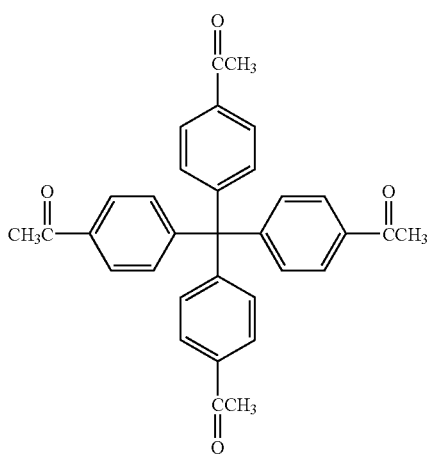 (43)

(44)
(45)
(46)
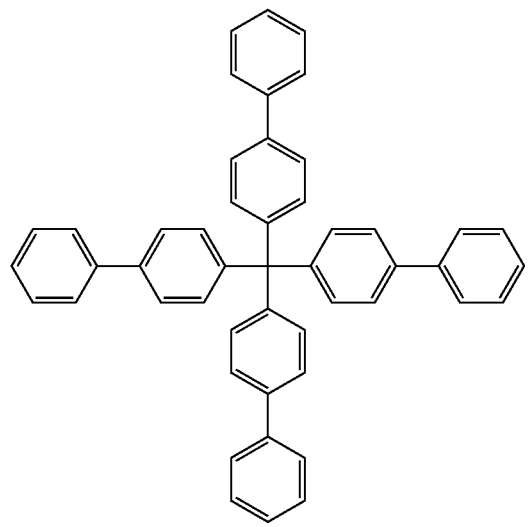
(47)
(48)
(49)
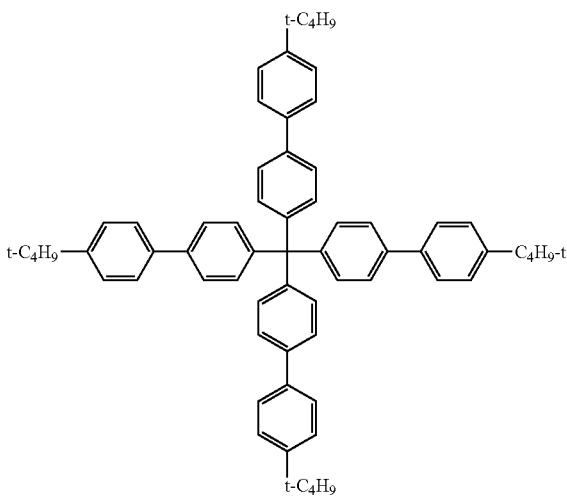

-continued
(50)
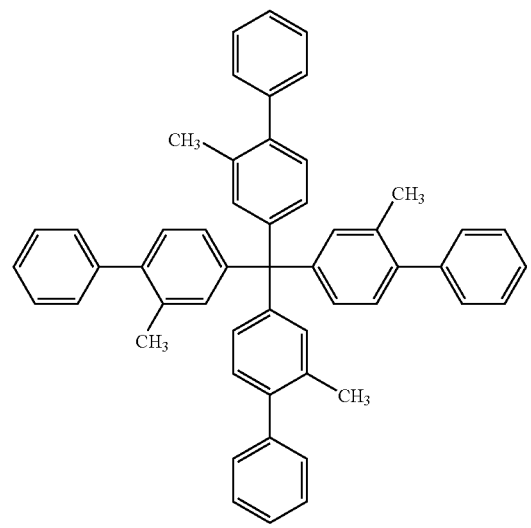
(51)
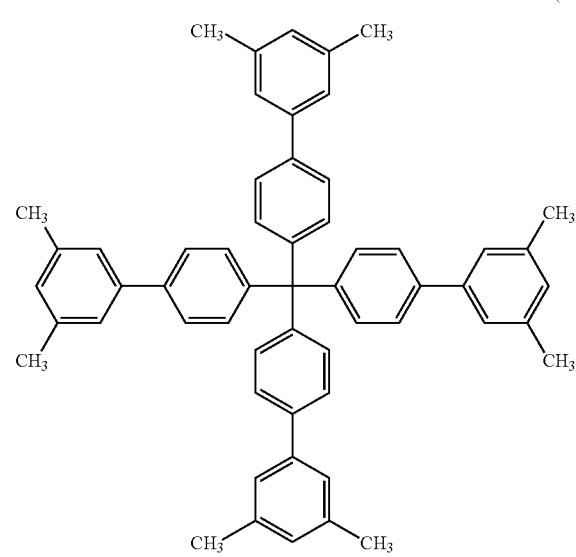
(52)
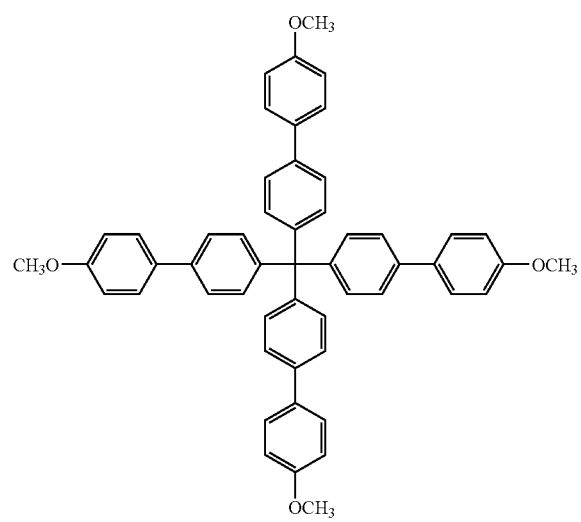
-continued
(53)
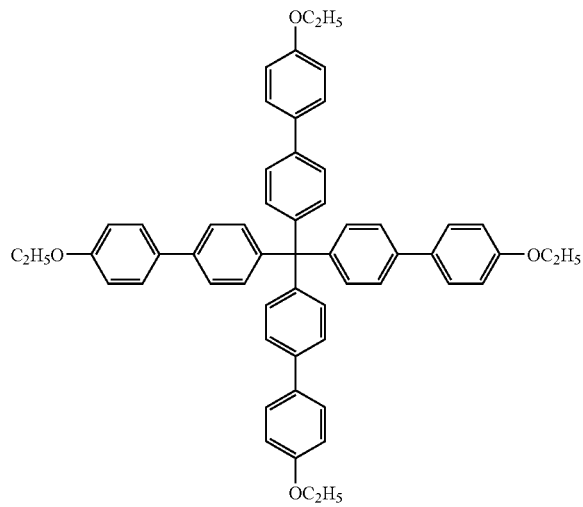
(54)
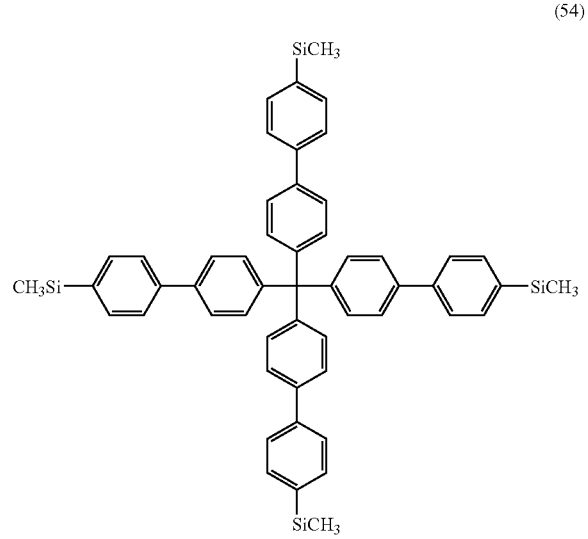
(55)
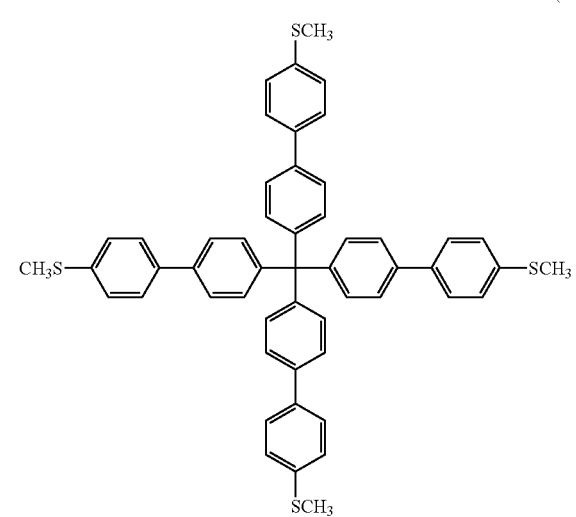

(56)

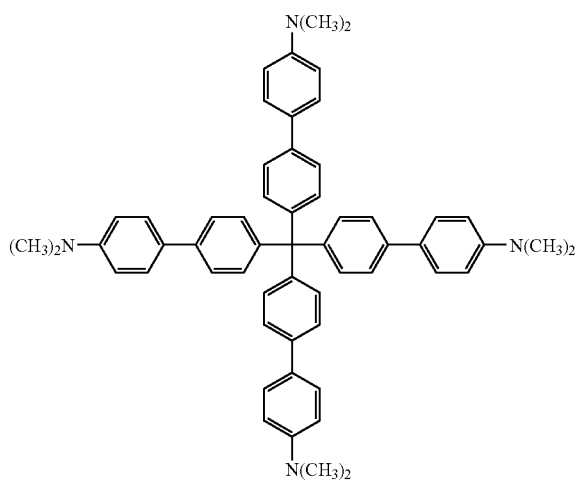

(57)

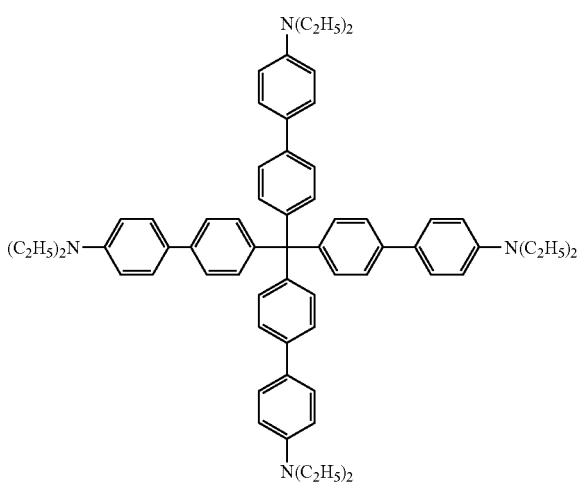

(58)

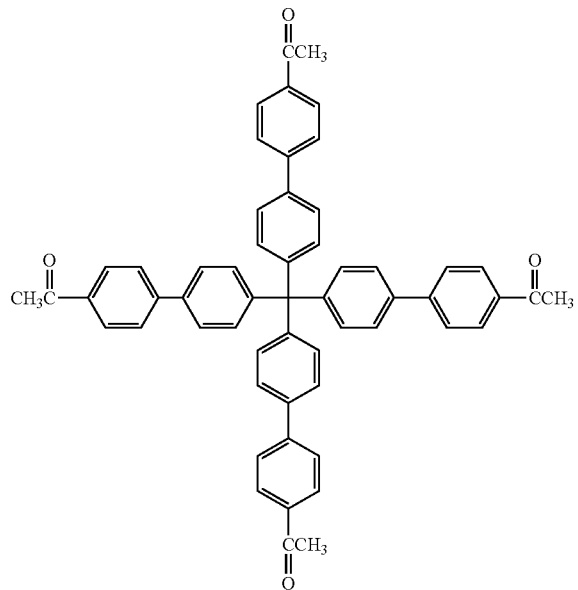

—Charge-Transporting Material—

The charge-transporting material included in luminescent layer 30 is preferably a hole-transporting material. The hole-transporting material that may be used in the luminescent layer of the invention preferably has an ionization potential (Ip) of 5.1 eV or more and 6.4 eV or less, more preferably 5.4 eV or more and 6.2 eV or less, and further preferably 5.6 eV or more and 6.0 eV or less, in view of improving the durability and reducing the driving voltage. Further, the hole-transporting material that may be used in the luminescent layer of the invention preferably has an electron affinity (Ea) of 1.2 eV or more and 3.1 eV or less, more preferably 1.4 eV or more and 3.0 eV or less, and further preferably 1.8 eV or more and 2.8 eV or less, in view of improving the durability and reducing the driving voltage.

Examples of the hole-transporting material having the above characteristics include pyrrole, indole, carbazole, azaindole, azacarbazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidene compounds, porphyrin compounds, polysilane compounds, poly(N-vinylcarbazole), aniline copolymers, conductive polymeric oligomers such as thiophene oligomers or polythiophene, organic silane, carbon, and derivatives of these compounds.

Among these, indole derivatives, carbazole derivatives, azaindole derivatives, azacarbazole derivatives, aromatic tertiary amine compounds, and thiophene derivatives are preferred, and those having two or more of at least one of an indole skeleton, a carbazole skeleton, an azaindole skeleton, an azacarbazole skeleton, and an aromatic tertiary amine skeleton are particularly preferred.

The following are specific examples of the hole-transporting material having the above characteristics, but the invention is not limited thereto.

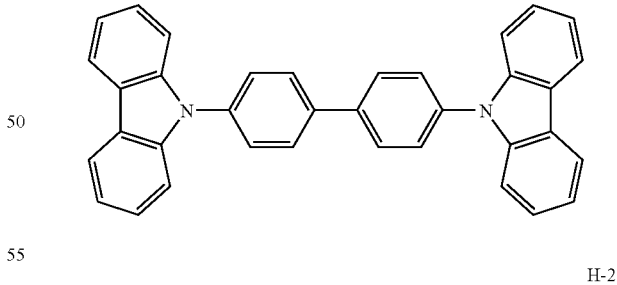

H-1

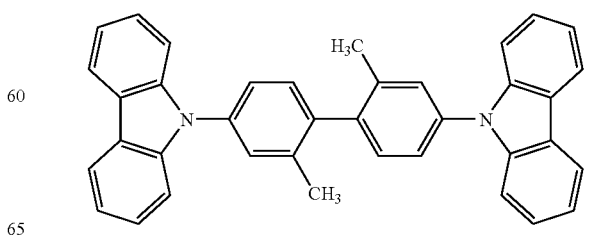

H-2

-continued
H-3
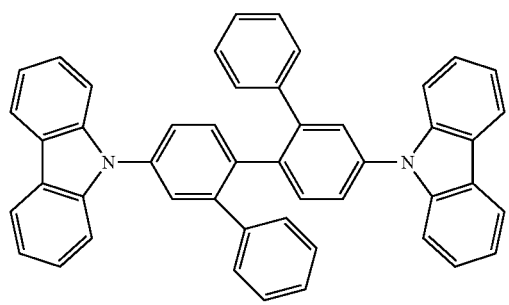
H-4
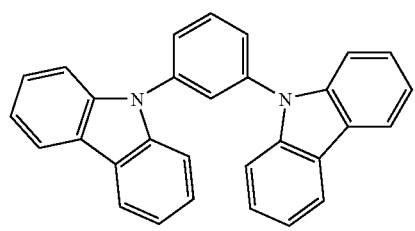
H-5
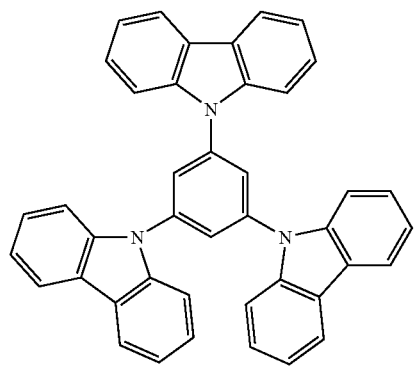
H-6
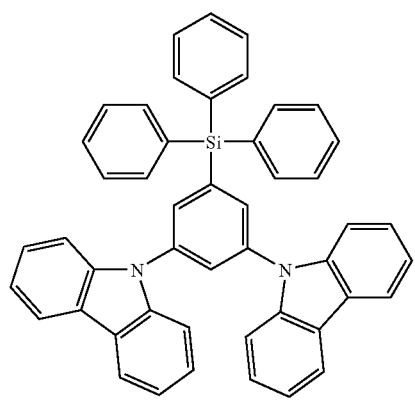
-continued
H-7
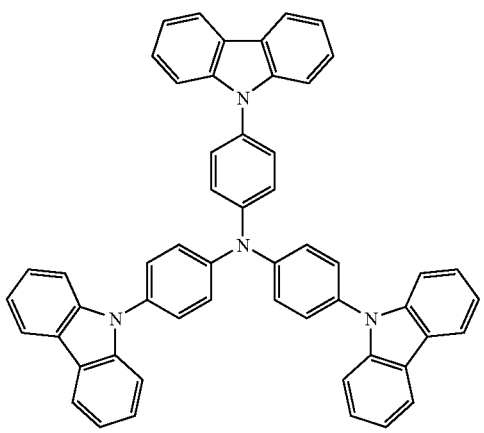
H-8
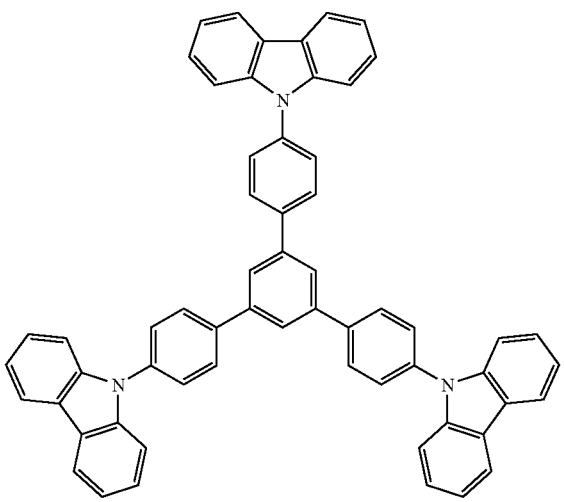
H-9
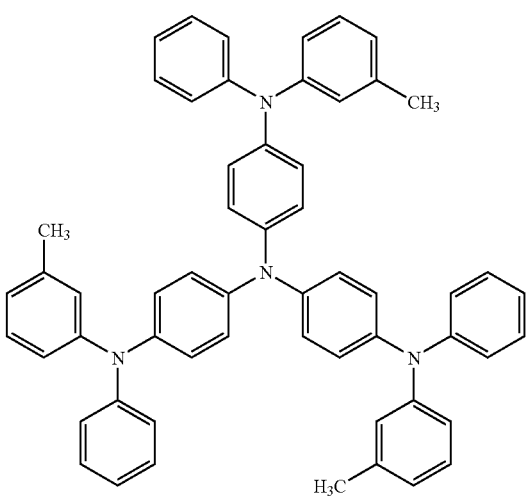

H-10
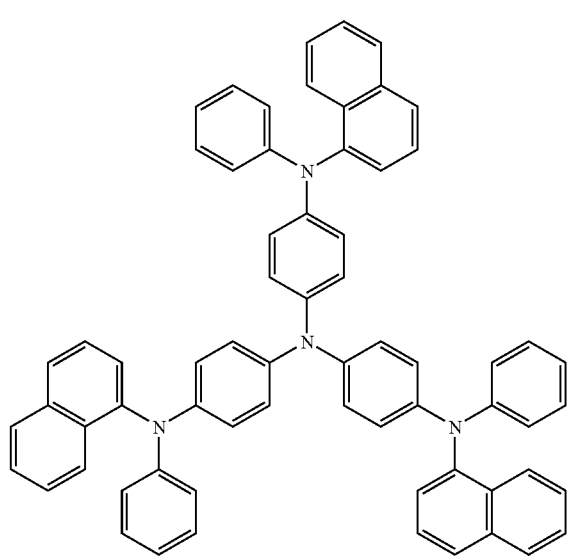
H-14
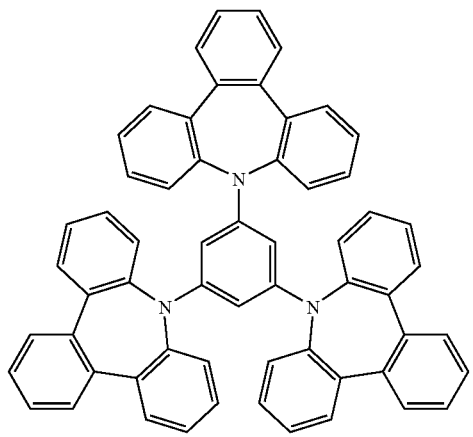
H-15
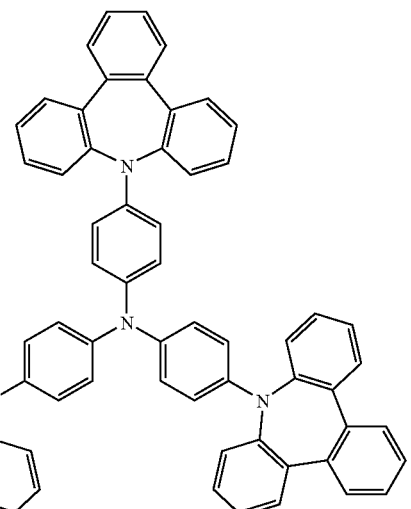
H-11
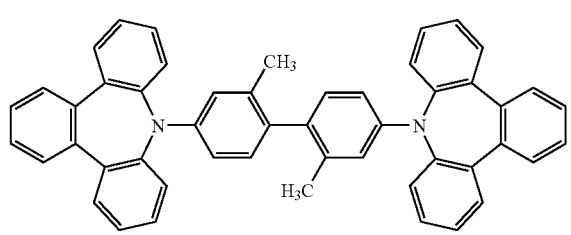
H-16
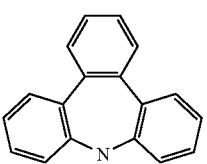
H-12
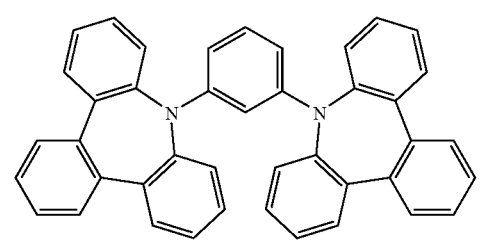
H-13
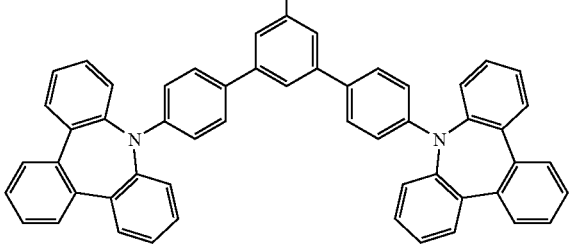

-continued
H-17
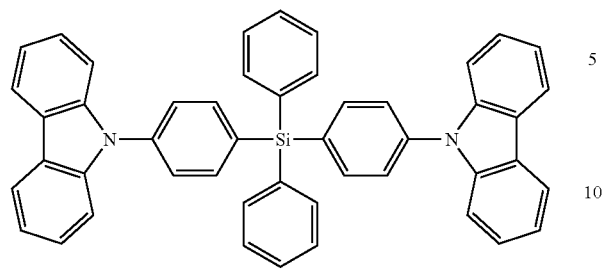
H-18
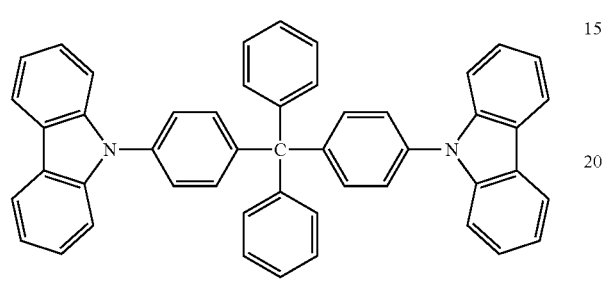
H-19
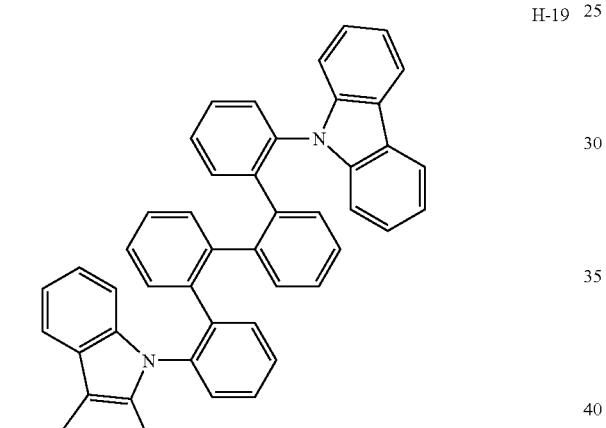
H-20
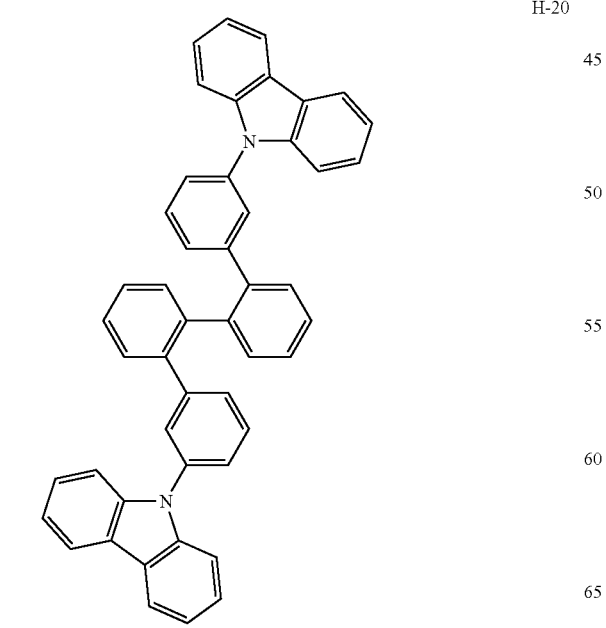
H-21
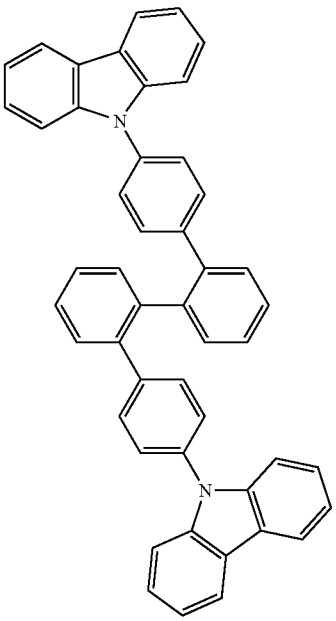
H-22
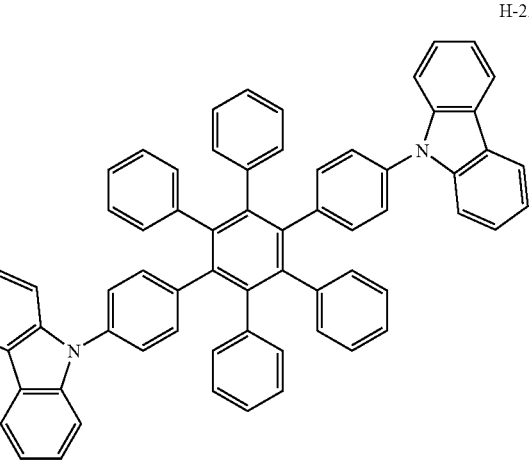
H-23
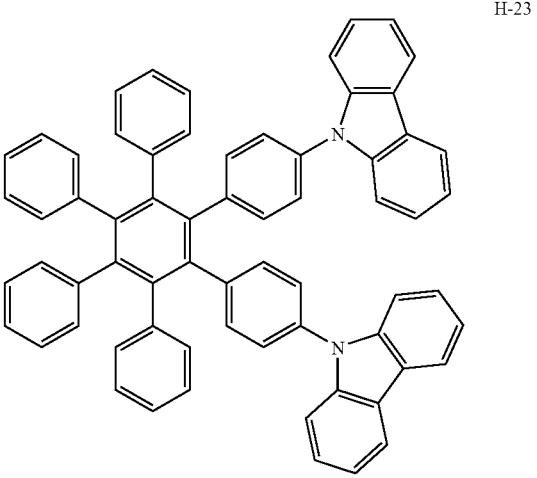

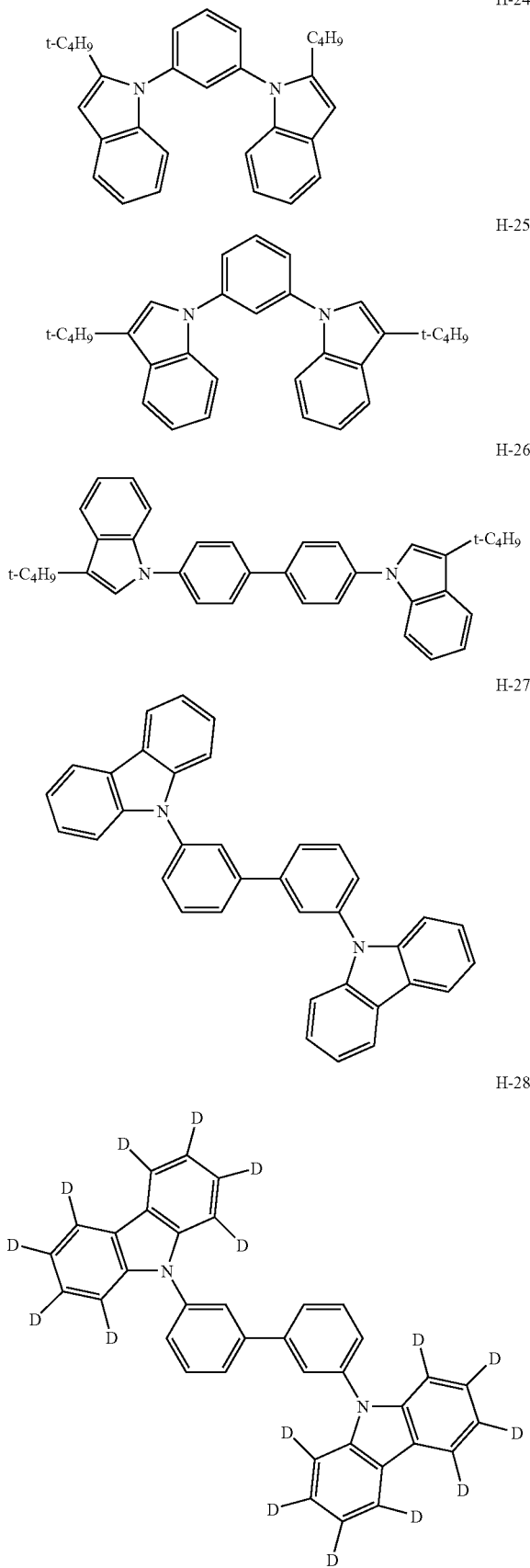

In compound H-28, D represents a deuterium.

The method of forming luminescent layer 30 is not particularly limited, and may be selected from a known method such as transfer, printing, application, inkjet or spraying, as well as a dry method such as evaporation or sputtering.

For example, the luminescent layer may be formed by performing co-evaporation using two or more kinds of phosphorescent material having different T1 values, a binder material, and a charge-transporting material at a certain rate, in accordance with the desired color of light to be emitted by mixing different colors. In this way, the energy transfer among the phosphorescent materials can be suppressed by the binder material. As a result, the dope concentration of green and red phosphorescent materials having a smaller T1 can be increased as compared with the case where no binder material is used, even when the phosphorescent materials for RGB are used, for example. In particular, from the viewpoint of production stability, the dope concentration of each phosphorescent material included in luminescent layer 30 is preferably 0.2% by mass or more, more preferably 1% by mass or more, and particularly preferably 2% by mass or more. In this way, a luminescent layer having a peak length based on each luminescent material and exhibiting a favorable color balance can be produced in a stable manner.

The thickness of luminescent layer 30 is not particularly limited, but is preferably from 1 nm to 500 nm, more preferably from 5 nm to 200 nm, and further preferably from 10 nm to 100 nm.

The organic EL device 10 of the invention may include a further organic layer in between electrodes 14 and/or 16 and luminescent layer 30. For example, a charge-blocking layer or the like may be included in between hole-transporting layer 20 and luminescent layer 30, or in between electron-transporting layer 40 and luminescent layer 30. Further, a hole-injection layer may be included in between anode 14 and hole-transporting layer 20, or an electron-injection layer may be included in between cathode 16 and electron-transporting layer 40. Each of the above layers may be formed from plural secondary layers.

Details of organic layers, electrodes, support substrate or the like will be described later.

Second Exemplary Embodiment

Figure 2:
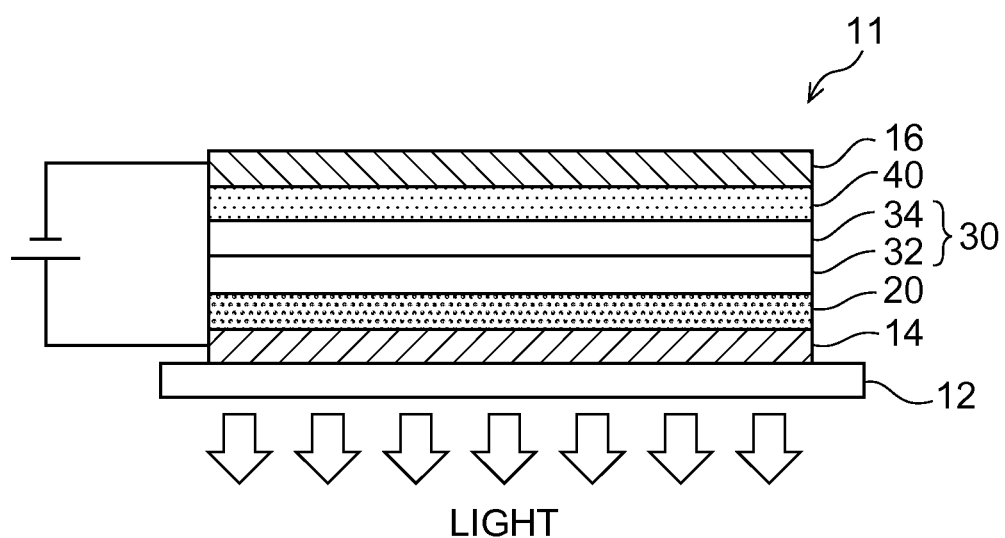
FIG. 2 is a schematic view of another exemplary embodiment (second exemplary embodiment) of the organic EL device according to the invention.

FIG. 2 shows a schematic view of a further exemplary embodiment of the organic EL device according to the invention (second exemplary embodiment). Organic EL device 11 according to this exemplary embodiment includes, as luminescent layer 30, two luminescent layers positioned adjacent to each other (first luminescent layers 32 and second luminescent layer 34). In this case, at least one of the luminescent layers includes two or more kinds of phosphorescent material having different T1 values, a binder material, and a charge-transporting material, and has a luminescence spectrum having a peak length based on each of the two or more phosphorescent materials.

The phosphorescent materials included in respective luminescent layers 32 and 34 may be selected according to usage or the like. For example, in order to emit white light by mixing the colors of RGB, it is preferred that the first luminescent layer includes a blue phosphorescent material having a luminescence peak in a range of from 420 nm to less than 500 nm and a charge-transporting material, and the second luminescent layer includes a green phosphorescent material having a luminescence peak in a range of from 500 nm to less than 570 nm and a red phosphorescent material having a luminescence peak in a range of from 570 nm to 650 nm, a binder material, and a charge-transporting material. First luminescent layer 32 and second luminescent layer 34 may be positioned in an inverted manner, or the composition thereof may be changed in an inverted manner.

—First Luminescent Layer—

First luminescent layer 32 includes a phosphorescent material having a luminescence peak in a range of from 420 nm to less than 500 nm (blue phosphorescent material) and a charge-transporting material, and the layer emits blue light. Examples of the blue phosphorescent material having a peak length within the above range include the following, but the invention is not limited thereto.

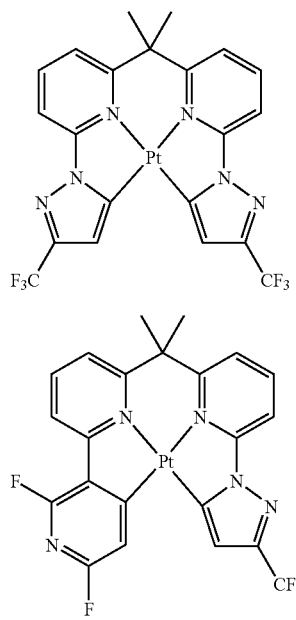

First luminescent layer 32 is preferably formed by doping a blue phosphorescent material in a charge-transporting material (host material). Two or more kinds of phosphorescent material may be used in combination, as long as each phosphorescent material has a luminescence peak in a range of from 420 nm to less than 500 nm.

The charge-transporting material may be selected from those described in the first exemplary embodiment, and may be used alone or in combination of two or more kinds. Further, first luminescent layer 32 may include an electrically inert material (binder material) as mentioned in the first exemplary embodiment.

The blue phosphorescent material may be included in first luminescent layer 32 in an amount of from 5% by mass to 30% by mass, more preferably from 5% by mass to 20% by mass. When the concentration of the blue phosphorescent material in first luminescent layer 32 is 5% by mass or more, emission of blue light can be ensured, and the dope concentration of the phosphorescent material can be easily adjusted during the film formation. On the other hand, when the concentration of the blue phosphorescent material in first luminescent layer 32 is 30% by mass or less, particularly 20% or less, the blue color can be controlled not to be too strong with respect to the color of light emitted from second luminescent layer 34 (green and red), thereby ensuring the production of an organic EL device that emits white color by mixing the RGB colors.

The thickness of first luminescent layer 32 is not particularly limited, but is preferably from 1 nm to 200 nm, more preferably from 5 nm to 100 nm, further preferably from 10 nm to 70 nm, in view of improving light-emission efficiency and reducing the driving voltage.

—First Luminescent Layer—

Second luminescent layer 34 includes a phosphorescent material having a luminescence peak in a range of from 500 nm to less than 570 nm (green phosphorescent material), a phosphorescent material having a luminescence peak in a range of from 570 nm to 650 nm (red phosphorescent material), an electrically inert material, and a charge-transporting material. Second luminescent layer 34 emits light of a mixed color of green and red.

Examples of the green phosphorescent material having a luminescence peak in a range of from 500 nm to less than 570 nm include the following compound, but the invention is not limited thereto.

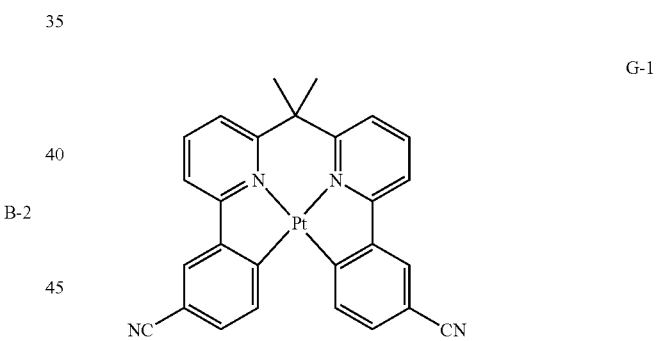

The concentration of the green phosphorescent material in second luminescent layer 34 is preferably from 0.2 to 5% by mass, more preferably from 0.2 to 2% by mass. When the concentration of the green phosphorescent material in second luminescent layer 34 is 0.2% by mass or more, emission of green light can be ensured and the dope amount can be easily adjusted during the film formation, thereby enabling formation of a film in a stable manner. On the other hand, when the concentration of the green phosphorescent material in second luminescent layer 34 is 5% by mass or less, particularly 2% by mass or less, the green color can be suppressed not to be too strong with respect to the other colors (blue and red), and an organic EL device that emits white color by color mixing in a more stable manner can be produced.

Examples of the red phosphorescent material having a luminescence peak in a range of from 570 nm to 650 nm include the following compound, but the invention is not limited thereto.

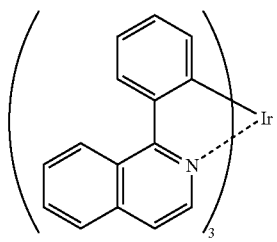

R-1

The concentration of the red phosphorescent material in second luminescent layer 34 is preferably from 0.2 to 5% by mass, more preferably from 0.2 to 2% by mass. When the concentration of the red phosphorescent material in second luminescent layer 34 is 0.2% by mass or more, emission of red light can be ensured and the dope amount can be easily adjusted during the film formation, thereby enabling the formation of a film in a stale manner. On the other hand, when the concentration of the red phosphorescent material in second luminescent layer 34 is 5% by mass or less, particularly 2% by mass or less, the red color can be suppressed not to be too strong with respect to the other colors (blue and green), and an organic EL device that emits white color by color mixing in a more stable manner can be produced.

The electrically inert material and the charge-transporting material included in second luminescent layer 34 may be the same material as mentioned in the first exemplary embodiment above, and the contents thereof may also be the same. By including an electrically inert material in second luminescent layer 34, transfer of excitons between the green phosphorescent material and the red phosphorescent material can be suppressed, and the transfer of excitons from the adjacent first luminescent layer 32 can be also suppressed.

The thickness of second luminescent layer 34 is not particularly limited, but is preferably from 1 to 200 nm, more preferably from 5 to 100 nm, further preferably from 10 to 70 nm, in view of improving the light-emission efficiency, reducing the driving voltage, or the like.

Further, the total thickness of luminescent layer 30, including first and second luminescent layers 32 and 24, is preferably from 1 to 500 nm, more preferably from 5 to 200 nm, further preferably from 10 to 100 nm, in view of improving the light-emission efficiency, reducing the driving voltage, or the like. In particular, when the total thickness of luminescent layer 30 is 25 nm or more, the light-emission efficiency can be further improved, while when the total thickness is 35 nm or less, increase of the driving voltage can be further suppressed.

The ratio of thickness of first luminescent layer 32 (X) to second luminescent layer 34 (Y) (X/Y) is preferably from 1 to 8, more preferably from 2 to 5. When the ratio X/Y is within a range of from 2 to 5, in view of durability and chromaticity.

The ratio of peak intensity in the luminescence spectrum of luminescent layer 30 in total, i.e., the ratio of minimum luminescence intensity to maximum luminescence intensity of the peak wavelength based on each phosphorescent material included in each luminescent layer 32 and 34, is preferably within the same range as that of the organic EL device 10 according to the first exemplary embodiment.

Each of luminescent layers 32 and 34 may be formed by a transfer method, a printing method, an application method, an inkjet method, a spray method, or the like, as well as by a dry method such as evaporation or sputtering.

The concentration of each material in each of luminescent layers 32 and 34 may be selected as appropriate according to applications or the like of organic EL device 11. When producing white light by mixing phosphorescent materials of RGB, for example, it is preferable that first luminescent layer 32 includes a phosphorescent material having a luminescence peak in a range of from 420 nm to less than 470 nm in an amount of from 5 to 20% by mass and a charge-transporting material in an amount of from 50 to 95% by mass, while second luminescent layer 34 includes a phosphorescent material having a luminescence peak in a range of from 500 nm to less than 570 nm in an amount of from 0.2 to 5% by mass, a phosphorescent material having a luminescence peak in a range of from 570 nm to 650 nm in an amount of from 0.2 to 5% by mass, an electrically inert material in an amount of from 3 to 40% by mass, and a charge-transporting material in an amount of from 50 to 95% by mass, respectively. When each material is included in the above-mentioned amounts, first luminescent layer 32 emits blue light and second luminescent layer 34 emits green light and red light, while suppressing energy transfer of excitons due to the presence of the electrically inert material, thereby producing white color having a favorable color balance of RGB as a total organic EL device.

As with the case of the first exemplary embodiment, organic EL device 11 according to the present exemplary embodiment having plural luminescent layers may also include a further organic layer between luminescent layer 30 and electrode 14 and/or electrode 16, or the like. For example, it is possible to provide a charge-blocking layer or the like between hole-transporting layer 20 and first luminescent layer 32 or between second luminescent layer 34 and electron-transporting layer 40; a hole-injection layer between anode 14 and hole-transporting layer 20; or an electron-injection layer between cathode 16 and electron-transporting layer 40. Further, each of these layers may be formed of plural secondary layers.

The combination of materials included in first luminescent layer 32 and second luminescent layer 34 is not particularly limited to the above exemplary embodiments, and the following combination are also applicable.

For example, it is possible that first luminescent layer 32 includes a blue phosphorescent material having a luminescence peak in a range of from 420 nm to less than 500 nm, a green phosphorescent material having a luminescence peak in a range of from 500 nm to less than 570 nm, a charge-transporting material, and an electrically inert material, while second luminescent layer 34 includes a red phosphorescent material having a luminescence peak in a range of from 570 nm to 650 nm and a charge-transporting material.

Further, it is possible that first luminescent layer 32 includes a blue phosphorescent material having a luminescence peak in a range of from 420 nm to less than 500 nm, a red phosphorescent material having a luminescence peak in a range of from 570 nm to 650 nm, a charge-transporting material, and an electrically inert material, while second luminescent layer 34 includes a green phosphorescent material having a luminescence peak in a range of from 500 nm to less than 570 nm and a charge-transporting material.

In the following, the layers other than luminescent layer 30 included in organic EL devices 10 and 11 according to the invention, such as an organic layer, an electrode, or a support substrate are described.

—Hole-Injection Layer and Hole-Transporting Layer—

A hole-injection layer and a hole-transporting layer have a function of receiving holes from the anode or the anode side, and transporting the same to the cathode side. These layers preferably include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, organic silane derivatives, carbon, metal complexes having phenylazole or phenylamine as a ligand, represented by Ir complexes, or the like.

The hole-injection layer and the hole-transporting layer preferably have a thickness of from 500 nm or less, respectively, from the viewpoint of reducing the driving voltage.

The thickness of the hole-transporting layer is preferably from 1 nm to 500 nm, more preferably from 5 nm to 200 nm, and further preferably from 10 nm to 200 nm.

The thickness of the hole-injection layer is preferably from 0.1 nm to 200 nm, more preferably from 0.5 nm to 200 nm, and further preferably from 1 nm to 200 nm.

The hole-injection layer and the hole-transporting layer may have a monolayer structure formed of one or more kinds of the aforementioned material, or may have a multilayer structure formed of plural layers having the same or different compositions.

—Electron-Injection Layer and Electron-Transporting Layer—

An electron-injection layer and an electron-transporting layer have a function of receiving electrons from the cathode or the cathode side, and transporting the same to the anode side. These layers preferably include triazole derivatives, oxazole derivatives, oxadiazole derivatives, imidazole derivatives, fluorenone derivatives, anthraquinodimethane derivatives, anthorone derivatives, diphenylquinone derivative, thiopyrandioxide derivatives, carbodiimide derivatives, fluorenylidene methane derivatives, distyrylpyrazine derivatives, aromatic tetracarboxylic acid anhydrides such as naphthalene and perylene, phthalocyanine derivatives and metal complexes of 8-quinolinol derivatives, metal phthalocyanine, metal complexes having benzoxazole or benzthiazole as a ligand, organic silane derivatives, or the like.

The electron-injection layer and the electron-transporting layer preferably have a thickness of 500 nm or less, respectively, from the viewpoint of reducing the driving voltage.

The thickness of the electron-transporting layer is preferably from 1 nm to 500 nm, more preferably from 5 nm to 200 nm, and further preferably from 10 nm to 100 nm.

The thickness of the electron-injection layer is preferably from 0.1 nm to 200 nm, more preferably from 0.2 nm to 100 nm, and further preferably from 0.5 nm to 50 nm.

The electron-injection layer and the electron-transporting layer may have a monolayer structure formed of one or more kinds of the aforementioned material, or may have a multilayer structure formed of plural layers having the same or different compositions.

—Hole-Blocking Layer—

A hole-blocking layer has a function of blocking the holes that have been transferred from the anode side to luminescent layer 30 from passing through toward the cathode side. The hole-blocking layer may be formed as an organic compound layer adjacent to luminescent layer 30 at the cathode side.

Exemplary organic compounds for the hole-blocking layer include aluminum complexes such as BAlq, triazole derivatives, and phenanthroline derivatives such as BCP.

The hole-blocking layer preferably has a thickness of from 1 nm to 500 nm, more preferably from 5 nm to 200 nm, and further preferably from 10 nm to 100 nm.

The hole-blocking layer may have a monolayer structure formed of one or more kinds of the aforementioned material, or may have a multilayer structure formed of plural layers having the same or different compositions.

The organic compound layers other than luminescent layer 30, as mentioned above, may also be formed by a known method, in addition to a dry method such as evaporation or sputtering, such as a transfer method, a printing method, an application method, an inkjet method, a spray method, or the like.

—Anode—

At least one of the pair of electrodes 14 and 16 is transparent in order to transmit light generated in luminescent layer 30. Typically, electrode 14 (lower electrode) at the side of support substrate 12 is an anode and electrode 16 (upper electrode) at the side of sealing substrate (not shown) is a cathode, but it is also possible to design lower electrode 14 as a cathode and upper electrode 16 as an anode.

The shape, structure or size of the anode is not particularly limited as long as it has a function of supplying holes to the organic EL layer, and may be appropriately selected based on the applications of the organic EL device.

Exemplary materials for the anode include metals, alloys, metal oxides, conductive compounds, or mixtures thereof. Specific examples thereof include conductive metal oxides, such as tin oxide doped with antimony, fluorine or the like (ATO, FTO or the like), tin oxide, zinc oxide, indium oxide, indium tin oxide (ITO), indium zinc oxide (IZO), metals such as gold, silver, chromium, nickel or the like, a mixture or a layered material of the above metal and a conductive metal oxide, inorganic conductive materials such as copper iodide, copper sulfide or the like, organic conductive materials such as polyaniline, polythiophene, polypyrrole or the like, or a layered material of the above organic conductive material and ITO. Among these, ITO is preferred in view of productivity, conductivity or transparency.

The method of forming the anode may be appropriately selected in view of suitability to the raw material for the anode, and examples thereof include a wet method such as printing or coating, a physical method such as vacuum evaporation, sputtering or ion plating, or a chemical method such as CVD or plasma CVD. For example, when ITO is selected as the raw material, the anode may be formed by direct-current or high-frequency sputtering, vacuum evaporation, ion plating or the like.

The position of the anode in the device may be selected as appropriate according to applications or usage of organic EL device 10 or 11. For example, the anode may be formed on the entire surface of support substrate 12, or on a portion of support substrate 12.

The patterning of the anode may be conducted by chemical etching such as photolithography, or by physical etching using laser beams. Further, the patterning may be conducted by performing vacuum evaporation or sputtering using a mask, a lift-off method, or a printing method.

The thickness of the anode may be selected as appropriate according to the type of the raw material or the like, but is typically from 10 nm to 50 μm, preferably from 50 nm to 20 μm.

The resistivity of the anode is preferably $10^3$ Ω/square or less, more preferably $10^2$ Ω/square or less, in order to ensure the supply of holes to the organic EL layer.

When light is taken out from the anode side, the anode preferably has a transmittance of 60% or more, more preferably 70% or more. Details of a transparent anode are described in "New Development of Transparent Electrode Film", edited by Yutaka Sawada, published by CMC Publishing Co., Ltd. (1999), and the contents thereof may be applied to the present invention. When a plastic substrate having a low heat resistance is used, the anode is preferably formed using ITO or IZO at a temperature of 150° C. or less.

—Cathode—

The cathode typically has a function of injecting electrons to the organic compound layer. The shape, structure or size of the cathode is not particularly limited, and may be selected from known electrode materials as appropriate according to applications or usage of the organic EL device. Exemplary materials for the cathode include metals, alloys, metal oxides, conductive compounds or a mixture thereof. Specific examples thereof include alkali metals (such as Li, Na, K and Cs), alkaline earth metals (such as Mg and Ca), gold, silver, lead, aluminum, sodium-potassium alloy, lithium-aluminum alloy, magnesium-silver alloy, indium, and rare earth metals such as ytterbium. These raw materials may be used alone, but preferably in combination of two or more kinds in view of achieving both stability and electron-injection suitability at the same time.

Among the above, an alkali metal or an alkaline earth metal is preferred in view of electron-injection suitability, while a material including aluminum as a main component is preferred in view of storage stability. The material including aluminum as a main component refers to pure aluminum, or an alloy or a mixture of aluminum with 0.01 to 10% by mass of an alkali metal or an alkaline earth metal (such as lithium-aluminum alloy or magnesium-aluminum alloy). Details of the material for the cathode are described in JP-A No. 2-15595 and JP-A No. 5-121172, and the contents thereof may be applied to the present invention.

The method of forming the cathode is not particularly limited, and may be formed by a known method. For example, the cathode may be formed by a method selected as appropriate according to the suitability for its material, including a wet method such as printing or coating, a physical method such as vacuum evaporation, sputtering or ion plating, or a chemical method such as CVD or plasma CVD. For example, when the cathode is formed from a metal or the like, the cathode can be formed from one or more kinds of metal by performing sputtering, simultaneously or in separate processes.

The thickness of the cathode may be selected as appropriate according to the raw material for the cathode or the direction of taking out light, but is typically about from 1 nm to 5 μm. The cathode may be transparent or may not be transparent. When a transparent cathode is desired, the cathode can be obtained by forming a thin film having a thickness of about 1 nm to 10 nm from the material for the cathode, and then forming a layer of transparent conductive material such as ITO or IZO on the thin film.

The patterning of the cathode may be conducted by chemical etching such as photolithography, or by physical etching using laser beams. Alternatively, the cathode may be formed by vacuum evaporation or sputtering using a mask, a lift-off method, or a printing method. The position of the cathode is not particularly limited, and may be formed on the entire surface of the organic compound layer, or may be formed on a portion of the organic compound layer.

A dielectric layer having a thickness of from 0.1 nm to 5 nm may be formed from a fluoride, an oxide or the like of an alkali metal or an alkaline earth metal as mentioned above, in between the cathode and the organic compound layer. The dielectric layer may be regarded as a kind of electron-injection layer. The dielectric layer may be formed by vacuum evaporation, sputtering, ion plating, or the like.

—Support Substrate—

Support substrate 12 is not particularly limited as long as it can support the entire body of organic EL device and has heat-resistivity, strength, transmittance or the like. Specific examples thereof include inorganic materials such as YSZ (yttria-stabilized zirconia) or glass, organic materials such as polyesters (e.g., polyethylene terephthalate, polybutylene terephthalate and polyethylene naphthalate), polystyrene, polycarbonate, polyether sulfone, polyarylate, polyimide, polycycloolefin, norbornene resin, and poly(chlorotrifluoroethylene).

When glass is used for support substrate 12, non-alkali glass is preferably used in order to reduce the elusion of ions from the glass. When soda-lime glass is used, a barrier coating of silica or the like is preferably formed thereon.

When an organic material is used for support substrate 12, the material preferably has excellent heat-resistance, dimension stability, solvent resistance, electric insulation property, and processability. When a plastic material is used for support substrate 12, a moisture proof layer or a gas barrier layer is preferably formed on one or both surfaces thereof, in order to suppress the permeation of moisture or oxygen. Suitable materials for the moisture proof layer or the gas barrier layer are inorganic materials such as silicon nitride or silicon oxide. The moisture proof layer or the gas barrier layer may be formed by high-frequency sputtering or the like.

When a thermoplastic material is used for support substrate 12, a hard coat layer, an undercoat layer or the like may be formed thereon, as necessary.

The shape, structure, size or the like of support substrate 12 is not particularly limited, and may be selected as appropriate according to applications of organic EL device 10 or 11. The shape of support substrate 12 is typically plate-like, in view of handleability or the ease of formation of the organic EL device. Support substrate 12 may have a monolayer structure or a multilayer structure. Further, support substrate 12 may be formed of a single member or formed of two or more members.

When producing a top emission-type organic EL device in which light is taken out from the side opposite to support substrate 12, support substrate 12 may be formed from a metal substrate of stainless steel, Fe, Al, Ni, Co, Cu or an alloy thereof, a silicon substrate or the like, since light is not taken out from the side of support substrate 12. When metal is used, support substrate 12 having a high degree of strength and a high degree of gas barrier property with respect to moisture or oxygen in the air can be obtained, even with reduced thickness. A metal substrate can be used for support substrate 12 by providing an insulating film that ensures electric insulation in between support substrate 12 and lower electrode 14.

—Protection Layer—

Organic EL device 10 or 11 may be protected by a protection layer. The material for the protection layer is not particularly limited as long as it has a function of preventing the entering of a substance that promotes deterioration of the device, such as moisture or oxygen, into the device.

Specific examples of the material include metals such as In, Sn, Pb, Au, Cu, Al, Ti or Ni, metal oxides such as MgO, SiO, SiO$_2$, Al$_2$O$_3$, GeO, NiO, CaO, BaO, Fe$_2$O$_3$, Y$_2$O$_3$ or TiO$_2$, metal nitrides such as SiN$_x$ or SiN$_x$O$_y$, metal fluorides such as MgF$_2$, LiF, AlF$_3$ or CaF$_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtained by copolymerizing a monomer mixture including tetrafluoroethylene and at least one kind of comonomer, fluorine-containing copolymers having a cyclic structure in a copolymer main chain, water-absorbing materials having a water absorption of 1% or more, and moisture-proof materials having a water absorption of 0.1% or less.

The method of forming the protection layer is not particularly limited, and may be conducted by a vacuum evaporation method, a sputtering method, a reactive sputtering method, an MBE (Molecular Beam Epitaxy) method, a cluster ion beam method, an ion plating method, a plasma polymerization method (high-frequency excited ion plating method), a plasma CVD method, a laser CVD method, a thermal CVD method, a gas source CVD method, a coating method, a printing method, a transfer method, or the like.

—Sealing—

Organic EL device 10 or 11 may be sealed using a sealing member, such as a sealing container. Further, a water absorbing material or an inert liquid may be included in a space between the sealing container and the organic EL device.

The water absorbing material is not particularly limited, and examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited, and examples thereof include paraffins, fluid paraffins, fluorine-based solvents such as perfluoroalkane, perfluoroamine and perfluoroether, chlorine-based solvents, and silicone oils.

The organic EL device 10 or 11 according to the invention emits light by connecting electrodes 14 and 16 to an external wiring such as a control wring or a signal wiring. In this way, a luminescence apparatus having the organic EL device according to the invention can be produced. The driving method for the luminescence apparatus according to the invention is not particularly limited, and either a passive matrix system or an active matrix system is applicable.

The organic EL device 10 or 11 according to the invention emits light by applying a direct (an alternate component may be included, as necessary) voltage (typically from 2 to 15 V), or by applying a direct current.

The driving method described in JP-A Nos. 2-148687, 6-301355, 5-29080, 7-134558, 8-234685 and 8-241047, Japanese Patent No. 2784615, U.S. Pat. Nos. 5,828,429 and 6,023,308, and the like, may be applied to the method of driving the organic EL device 10 or 11 according to the invention.

—Applications—

The applications of the organic EL device 10 or 11 according to the invention is not particularly limited, and the organic EL device may be suitably used as display devices, displays, backlights, electrophotographic devices, illuminations, recording light sources, exposure light sources, reading light sources, signals, billboards, interior items, optical communication systems, or the like.

The following are exemplary embodiments of the invention. However, the invention is not limited thereto.

1. An organic EL device comprising a pair of electrodes and at least one luminescent layer between the pair of electrodes, the at least one luminescent layer comprising at least two phosphorescent materials, an electrically inert material, and a charge-transporting material, the at least two phosphorescent materials being selected from a blue phosphorescent material having a luminescence peak in a range of from 420 nm to less than 500 nm, a green phosphorescent material having a luminescence peak in a range of from 500 nm to less than 570 nm, or a red phosphorescent material having a luminescence peak in a range of from 570 nm to 650 nm.

2. The organic EL device according to 1, wherein the electrically inert material has a lowest excited triplet energy level of 2.7 eV or more.

3. The organic EL device according to 1, wherein the at least one luminescent layer comprises a first luminescent layer and a second luminescent layer, the first luminescent layer comprising the blue phosphorescent material having a luminescence peak in a range of from 420 nm to less than 500 nm and the charge-transporting material, and the second luminescent layer comprising the green phosphorescent material having a luminescence peak in a range of from 500 nm to less than 570 nm, the red phosphorescent material having a luminescence peak in a range of from 570 nm to 650 nm, the electrically inert material, and the charge-transporting material.

4. The organic EL device according to 1, wherein the at least one luminescent layer comprises a first luminescent layer and a second luminescent layer, the first luminescent layer comprising the blue phosphorescent material having a luminescence peak in a range of from 420 nm to less than 500 nm, the green phosphorescent material having a luminescence peak in a range of from 500 nm to less than 570 nm, the charge-transporting material, and the electrically inert material, and the second luminescent layer comprising the red phosphorescent material having a luminescence peak in a range of from 570 nm to 650 nm, and the charge-transporting material.

5. The organic EL device according to 1, wherein the at least one luminescent layer comprises a first luminescent layer and a second luminescent layer, the first luminescent layer comprising the blue phosphorescent material having a luminescence peak in a range of from 420 nm to less than 500 nm, the red phosphorescent material having a luminescence peak in a range of from 570 nm to 650 nm, the charge-transporting material, and the electrically inert material, and the second luminescent layer comprising the green phosphorescent material having a luminescence peak in a range of from 500 nm to less than 570 nm, and the charge-transporting material.

6. The organic EL device according to 1, wherein the at least two phosphorescent materials are each included in the luminescent layer at a concentration of 0.2% by mass or more, respectively.

7. The organic EL device according to 1, wherein the organic EL device emits white light.

8. The organic EL device according to 1, wherein the electrically inert material comprises an adamantane compound represented by the following Formula (1):

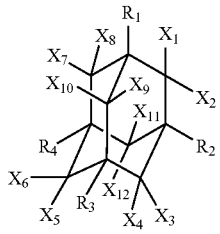

Formula (1)

wherein in Formula (1), $R_1$ to $R_4$ each independently represent a hydrogen atom, an alkyl group having 1 to 6 carbon atoms, an alkenyl group having 2 to 6 carbon atoms, an alkynyl group having 2 to 6 carbon atoms, an aryl group, a heteroaryl group, an alkoxy group having 1 to 6 carbon atoms, an acyl group, an acyloxy group, an amino group, a nitro group, a cyano group, an ester group, an amide group, a halogen atom, a perfluoroalkyl group having 1 to 6 carbon atoms, or a silyl group; wherein at least one of $R_1$ to $R_4$ is a group having a double bond or a triple bond; $X_1$ to $X_{12}$ each independently represent a hydrogen atom, an alkyl group having 1 to 6 carbon atoms, an alkenyl group having 2 to 6 carbon atoms, an alkynyl group having 2 to 6 carbon atoms, an aryl group, a heteroaryl group, an alkoxy group having 1 to 6 carbon atoms, an acyl group, an acyloxy group, an amino group, a nitro group, a cyano group, an ester group, an amide group, a halogen atom, a perfluoroalkyl group having 1 to 6 carbon atoms, or a silyl group.

9. The organic EL device according to 1, wherein the electrically inert material comprises a hydrocarbon compound having an alkyl group having 7 or more carbon atoms.

10. The organic EL device according to 9, wherein the hydrocarbon compound having an alkyl group having 7 or more carbon atoms is a straight-chain saturated hydrocarbon compound.

11. The organic EL device according to 9, wherein the hydrocarbon compound having an alkyl group having 7 or more carbon atoms is in the form of a solid at room temperature.

12. The organic EL device according to 1, wherein the electrically inert material comprises a compound represented by Formula (x): L-(Ar)m, wherein Ar represents a group represented by the following Formula (y), L represents a trivalent of higher-valent benzene skeleton, and m represents an integer of 3 or more:

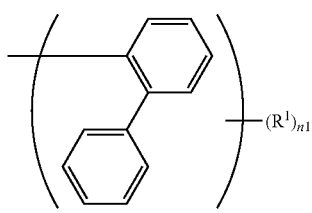

Formula (y)

wherein in Formula (y), $R^1$ represents a substituent; when there are two or more of $R^1$, each $R^1$ may be the same or different; and n1 represents an integer of from 0 to 9.

13. The organic EL device according to 1, wherein the electrically inert material comprises a compound represented by the following Formula (z):

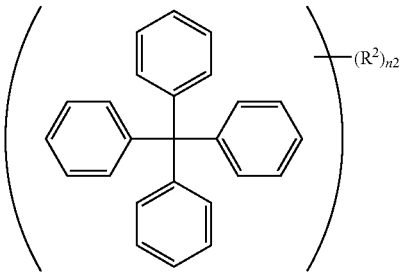

Formula (z)

wherein in Formula (z), $R^2$ represents a substituent; when there are two or more of $R^2$, each $R^2$ may be the same or different; and n2 represents an integer of from 0 to 20.

14. A luminescence apparatus comprising the organic EL device according to 1.

EXAMPLES

Hereinafter, the exemplary embodiments of the invention will be described according to the following Examples, but the invention is not limited thereto.

In the Examples, an organic EL device having the following standard structure was formed on a glass substrate. Each of the organic layers was formed using a vacuum evaporation apparatus ($1 \times 10^{-6}$ torr).

—Standard Structure of Organic EL Device—

The following is the standard structure of the organic EL device prepared in the Examples.

ITO (100 nm)/2-TNATA+1.0% F4-TCNQ (160 nm)/NPD (10 nm)/luminescent layer/BAlq (39 nm)/BCP (1 nm)/LiF (1 nm)/Al (100 nm)

In the above structure, ITO serves as an anode and Al serves as a cathode. The "%" represents the concentration of the material in each layer (% by mass), and the value described in the parenthesis represents the thickness of each layer. These layers were formed in the following manner, respectively.

1) Formation of Anode

A glass substrate having the size of 25 mm×25 mm×0.7 mm on which indium tin oxide (ITO) was evaporated to a thickness of 100 nm (manufactured by Sanyo Vacuum Industries, Co., Ltd.) was used as a transparent support substrate. An anode is prepared by patterning the ITO film of the transparent support substrate by etching, and then washing the same.

2) Formation of Hole-Injection Layer and Hole-Transporting Layer

A hole-injection layer having a thickness of 160 nm was formed on the anode by performing co-evaporation of 4,4',4''-tris(2-naphthylphenylamino)triphenylamine (2-TNATA) and 2,3,5,6-tetrafluoro-7,7,8,8-tetracyanoquinodimethane (F4-TCNQ), such that the content of F4-TCNQ was 1.0% by mass with respect to 2-TNATA.

A hole-transporting layer having a thickness of 10 nm was formed on the hole-injection layer by evaporating N,N'-dinaphthyl-N,N'-diphenyl-[1,1'-biphenyl]-4,4'-diamine (α-NPD).

3) Formation of Luminescent Layer

A luminescent layer was formed on the hole-transporting layer by performing co-evaporation. The composition and the structure of the luminescent layer is described below.

4) Formation of Electron-Transporting Layer and Electron-Injection Layer—

An electron-transporting layer having a thickness of 39 nm was formed on the luminescent layer by evaporating aluminum (III) bis(2-methyl-8-quinolato)-4-phenylphenolate (BAlp).

An electron-injection layer having a thickness of 1 nm was formed on the electron-transporting layer by evaporating bathocuproin (BCP).

5) Formation of Cathode

A layer of LiF having a thickness of 1 nm was evaporated on the electron-injection layer. Subsequently, a layer of Al having a thickness of 100 nm was formed as a cathode by performing patterning using a shadow mask. Each layer was formed by resistance heating vacuum evaporation.

The layered structure as prepared above was placed in a glove box filled with nitrogen, and the glove box was sealed with a stainless sealing can and a UV-curable adhesive (trade name, XNR5516HV, manufactured by Nagase ChemteX Corporation).

Organic EL devices having the above standard structure, but having a luminescent layer of different compositions and structure as mentioned below, were prepared. The structure, T1 value or the like of the materials used in the luminescent layer of the Examples and the Comparative Examples are described in the following.

A-3

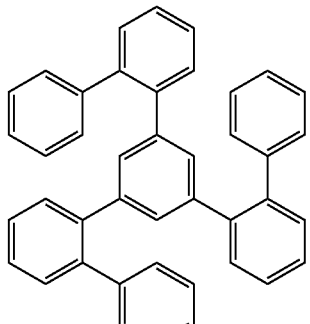

Ip = 6.6 eV
Ea = 2.5 eV
Eg = 4.1 eV
T1 = 2.73 eV

A-4

$CH_3(CH_2)_{28}CH_3$

T1 = 3.47 eV

A-1

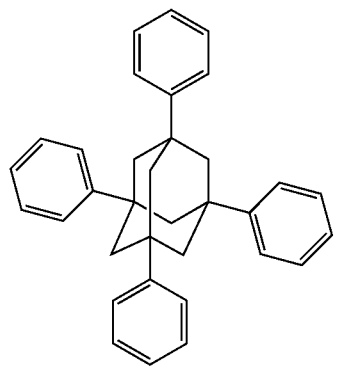

Eg = 4.59 eV
T1 = 3.25 eV

A-5

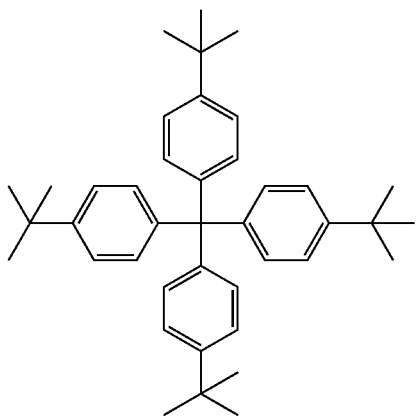

T1 = 3.19 eV

A-2

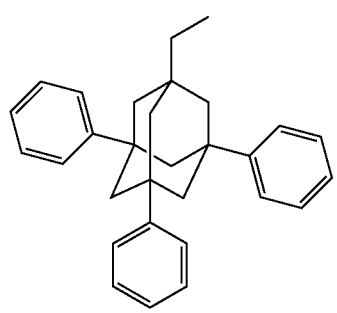

Eg = 5.38 eV
T1 = 3.21 eV

H-4

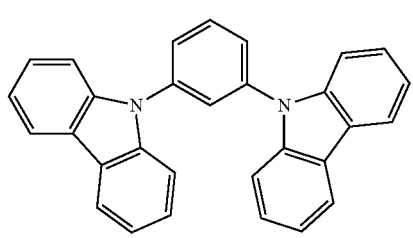

T1 = 2.89 eV

-continued
H-27
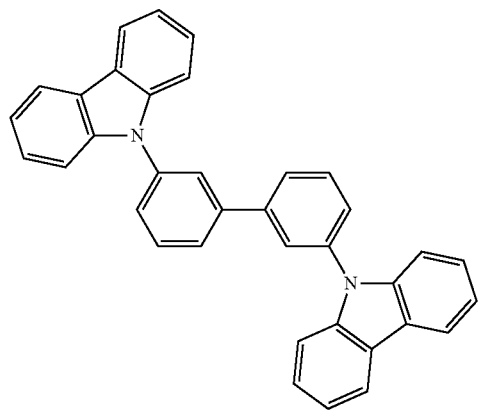
T1 = 2.86 eV
H-28
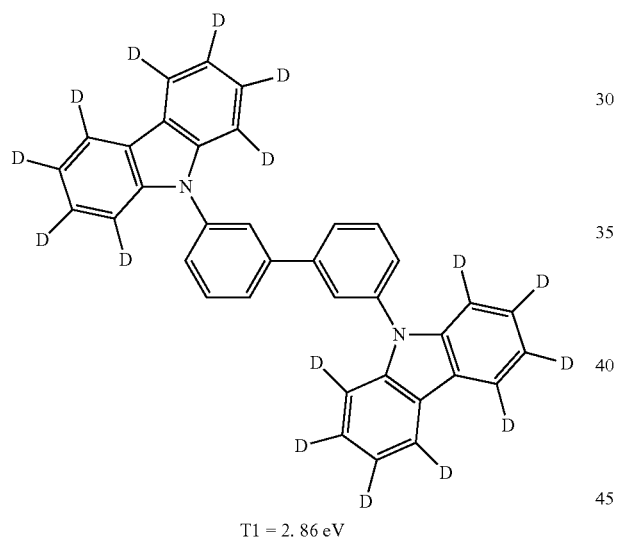
T1 = 2.86 eV
H-29
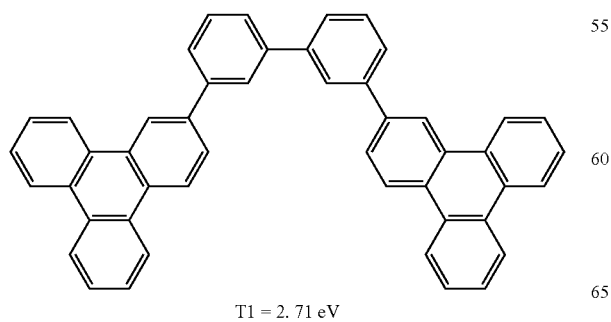
T1 = 2.71 eV
-continued
B-1
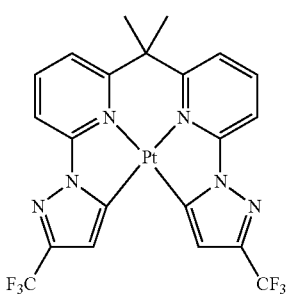
T1 = 2.82 eV
Luminescence peak: 456 nm
B-2
T1 = 2.74 eV
Luminescence peak: 466.8 nm
G-1
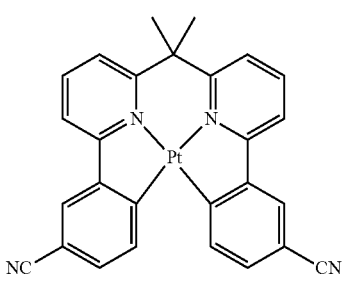
T1 = 2.52 eV
Luminescence peak: 503 nm
R-1
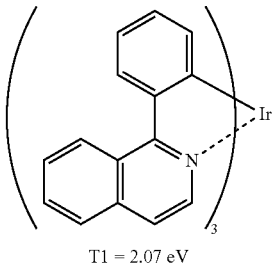
T1 = 2.07 eV
Luminescence peak: 620 nm -continued

R-2

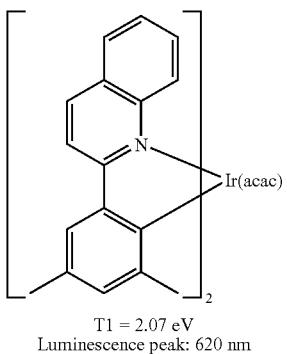

T1 = 2.07 eV
Luminescence peak: 620 nm

R-3

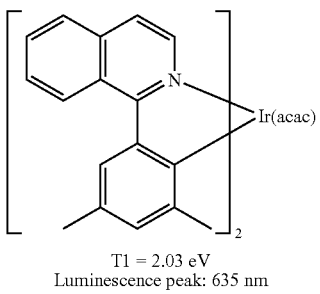

T1 = 2.03 eV
Luminescence peak: 635 nm

G-2

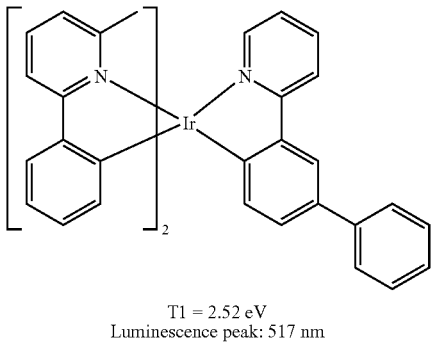

T1 = 2.52 eV
Luminescence peak: 517 nm

G-3

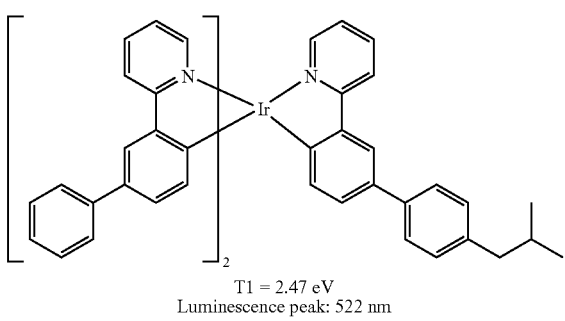

T1 = 2.47 eV
Luminescence peak: 522 nm

-continued

B-3

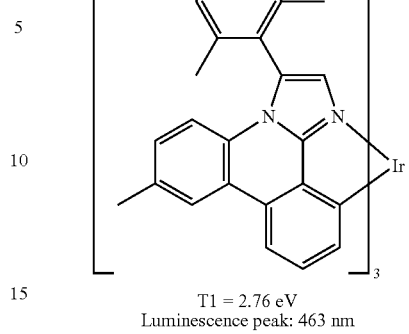

T1 = 2.76 eV
Luminescence peak: 463 nm

B-4

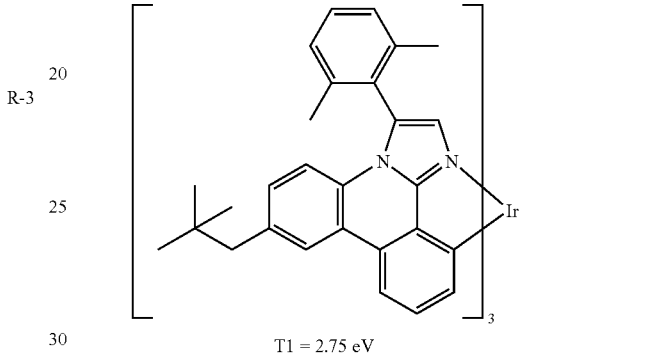

T1 = 2.75 eV
Luminescence peak: 465 nm

Example 1

An organic EL device having the above standard structure was prepared. The structure of the luminescent layer was as follows.

Luminescent layer: H-4+25%A-1+15%B-1+5%G-1+1%R-1 (30 nm)

The organic EL device was allowed to emit light upon application of a direct voltage using a source measure unit (product type: 2400, manufactured by Toyo Corporation), and the luminance thereof was measured using a measurement device (product type: BM-8, manufactured by Topcon Corporation). The luminescence spectrum and the wavelength were measured using a spectrum analyzer (product type: PMA-11, manufactured by Hamamatsu Photonics K.K.)

The chromaticity based on the CIE 1931 chromaticity coordinate was (x, y)=(0.31, 0.36). The luminescence intensity ratio at luminescence peaks of 456 nm, 503 nm and 620 nm was 0.72:1:0.79, and the color of emitted light in total was white.

Example 2

An organic EL device having the above standard structure was prepared. The structure of the luminescent layer was as follows.

First luminescent layer: H-4+15%B-1 (20 nm)
Second luminescent layer: H-4+25%A-1+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.32, 0.36). The luminescence intensity ratio at luminescence peaks of 456 nm, 503 nm and 620 nm was 0.7:1:0.8, and the color of emitted light in total was white.

Example 3

An organic EL device having the above standard structure was prepared. The structure of the luminescent layer was as follows.

Luminescent layer: H-27+25%A-2+15%B-2+5%G-1+1%R-1 (30 nm)

The organic EL device was allowed to emit light upon application of a direct voltage in the same manner as Example 1. The chromaticity based on the CIE 1931 chromaticity coordinate was (x, y)=(0.32, 0.36). The luminescence intensity ratio at luminescence peaks of 466.8 nm, 503 nm and 620 nm was 0.68:1:0.75, and the color of emitted light in total was white.

Example 4

An organic EL device having the above standard structure was prepared. The structure of the luminescent layer was as follows.

First luminescent layer: H-27+15%B-2 (20 nm)
Second luminescent layer: H-27+25%A-2+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.31, 0.36). The luminescence intensity ratio at luminescence peaks of 466.8 nm, 503 nm and 620 nm was 0.92:1:0.6, and the color of emitted light in total was white.

Example 5

An organic EL device having the above standard structure was prepared. The structure of the luminescent layer was as follows.

First luminescent layer: H-4+15%B-1 (20 nm)
Second luminescent layer: H-4+25%A-3+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.31, 0.36). The luminescence intensity ratio at luminescence peaks of 456 nm, 503 nm and 620 nm was 0.7:1:0.8, and the color of emitted light in total was white.

Comparative Example 1

An organic EL device having the above standard structure was prepared. The structure of the luminescent layer was as follows.

Luminescent layer: H-4+15%B-1+0.13%G-1+0.13%R-1 (30 nm)

The organic EL device emitted white light upon application of a direct voltage in the same manner as Example 1. The chromaticity based on the CIE 1931 chromaticity coordinate was (x, y)=(0.31, 0.35). The luminescence intensity ratio at luminescence peaks of 456 nm, 503 nm and 620 nm was 0.7:1:0.8, and the color of emitted light in total was white.

Comparative Example 2

An organic EL device having the above standard structure was prepared. The structure of the luminescent layer was as follows.

Luminescent layer: H-4+15%B-1+5%G-1+1%R-1 (30 nm)

The organic EL device was allowed to emit light upon application of a direct voltage in the same manner as Example 1. The chromaticity based on the CIE 1931 chromaticity coordinate was (x, y)=(0.59, 0.39). The luminescence intensity ratio at luminescence peaks of 456 nm, 503 nm and 620 nm was 0.2:0.15:1, and the color of emitted light in total was red.

Comparative Example 3

An organic EL device having the above standard structure was prepared. The structure of the luminescent layer was as follows.

First luminescent layer: H-4+15%B-1 (20 nm)
Second luminescent layer: H-4+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.55, 0.39). The luminescence intensity ratio at luminescence peaks of 456 nm, 503 nm and 620 nm was 0.3:0.2:1, and the color of emitted light in total was red.

Comparative Example 4

An organic EL device having the above standard structure was prepared. The structure of the luminescent layer was as follows.

Luminescent layer: H-27+15%B-2+5%G-1+1%R-1 (30 nm)

The organic EL device was allowed to emit light upon application of a direct voltage in the same manner as Example 1. The chromaticity based on the CIE 1931 chromaticity coordinate was (x, y)=(0.58, 0.42). The luminescence intensity ratio at luminescence peaks of 466.8 nm, 503 nm and 620 nm was 0.2:0.2:1, and the color of emitted light in total was red.

Comparative Example 5

An organic EL device having the above standard structure was prepared. The structure of the luminescent layer was as follows.

First luminescent layer: H-27+15%B-2 (20 nm)
Second luminescent layer: H-27+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.57, 0.41). The luminescence intensity ratio at luminescence peaks of 466.8 nm, 503 nm and 620 nm was 0.17:0.2:1, and the color of emitted light in total was red.

Example 6

An organic EL device having the above standard structure was prepared. The structure of the luminescent layer was as follows.

Luminescent layer: H-28+25%A-2+15%B-2+5%G-1+1%R-1 (30 nm)

The organic EL device was allowed to emit light upon application of a direct voltage in the same manner as Example 1. The chromaticity based on the CIE 1931 chromaticity coordinate was (x, y)=(0.31, 0.35). The luminescence intensity ratio at luminescence peaks of 466.8 nm, 503 nm and 620 nm was 0.7:1:0.76, and the color of emitted light in total was white.

Example 7

An organic EL device having the above standard structure was prepared. The structure of the luminescent layer was as follows.

First luminescent layer: H-28+15%B-2 (20 nm)
Second luminescent layer: H-28+25%A-2+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.31, 0.35). The luminescence intensity ratio at luminescence peaks of 466.8 nm, 503 nm and 620 nm was 0.9:1:0.63, and the color of emitted light in total was white.

Comparative Example 6

An organic EL device having the above standard structure was prepared. The structure of the luminescent layer was as follows.

Luminescent layer: H-28+15%B-2+5%G-1+1%R-1 (30 nm)

The organic EL device was allowed to emit light upon application of a direct voltage in the same manner as Example 1. The chromaticity based on the CIE 1931 chromaticity coordinate was (x, y)=(0.61, 0.39). The luminescence intensity ratio at luminescence peaks of 466.8 nm, 503 nm and 620 nm was 0.20:0.18:1, and the color of emitted light in total was red.

Comparative Example 7

An organic EL device having the above standard structure was prepared. The structure of the luminescent layer was as follows.

First luminescent layer: H-28+15%B-2 (20 nm)
Second luminescent layer: H-28+5%G-1+1%R-1 (10 nm)

The organic EL device was allowed to emit light upon application of a direct voltage in the same manner as Example 1. The chromaticity based on the CIE 1931 chromaticity coordinate was (x, y)=(0.59, 0.40). The luminescence intensity ratio at luminescence peaks of 466.8 nm, 503 nm and 620 nm was 0.19:0.21:1, and the color of emitted light in total was red.

Example 9

An organic EL device having the above standard structure was prepared. The structure of the luminescent layer was as follows.

Luminescent layer: H-4+25%A-4+15%B-1+2%G-1+1%R-1 (30 nm)

The organic EL device was allowed to emit light upon application of a direct voltage in the same manner as Example 1. The chromaticity based on the CIE 1931 chromaticity coordinate was (x, y)=(0.32, 0.36). The luminescence intensity ratio at luminescence peaks of 456 nm, 503 nm and 620 nm was 0.7:1:0.73, and the color of emitted light in total was white.

Comparative Example 9

An organic EL device having the above standard structure was prepared. The structure of the luminescent layer was as follows.

Luminescent layer: H-4+15%B-1+2%G-1+1%R-1 (30 nm)

The organic EL device was allowed to emit light upon application of a direct voltage in the same manner as Example 1. The chromaticity based on the CIE 1931 chromaticity coordinate was (x, y)=(0.61, 0.39). The luminescence intensity ratio at luminescence peaks of 456 nm, 503 nm and 620 nm was 0.05:0.15:1, and the color of emitted light in total was red.

Example 10

An organic EL device having the above standard structure was prepared. The structure of the luminescent layer was as follows.

Luminescent layer: H-4+25%A-5+15%B-3+2%G-2+1%R-2 (30 nm)

The organic EL device was allowed to emit light upon application of a direct voltage in the same manner as Example 1. The chromaticity based on the CIE 1931 chromaticity coordinate was (x, y)=(0.34, 0.37). The luminescence intensity ratio at luminescence peaks of 463 nm, 517 nm and 620 nm was 0.6:1:0.83, and the color of emitted light in total was white.

Comparative Example 10

An organic EL device having the above standard structure was prepared. The structure of the luminescent layer was as follows.

Luminescent layer: H-4+15%B-3+2%G-2+1%R-2 (30 nm)

The organic EL device was allowed to emit light upon application of a direct voltage in the same manner as Example 1. The chromaticity based on the CIE 1931 chromaticity coordinate was (x, y)=(0.60, 0.42). The luminescence intensity ratio at luminescence peaks of 463 nm, 517 nm and 620 nm was 0.1:0.20:1, and the color of emitted light in total was red.

Example 11

An organic EL device having the above standard structure was prepared. The structure of the luminescent layer was as follows.

Luminescent layer: H-4+25%A-5+15%B-4+2%G-3+1%R-3 (30 nm)

The organic EL device was allowed to emit light upon application of a direct voltage in the same manner as Example 1. The chromaticity based on the CIE 1931 chromaticity coordinate was (x, y)=(0.34, 0.37). The luminescence intensity ratio at luminescence peaks of 465 nm, 522 nm and 635 nm was 0.7:1:0.8, and the color of emitted light in total was white.

Comparative Example 11

An organic EL device having the above standard structure was prepared. The structure of the luminescent layer was as follows.

Luminescent layer: H-4+15%B-4+2%G-3+1%R-3 (30 nm)

The organic EL device was allowed to emit light upon application of a direct voltage in the same manner as Example 1. The chromaticity based on the CIE 1931 chromaticity coordinate was (x, y)=(0.62, 0.32). The luminescence intensity ratio at luminescence peaks of 465 nm, 522 nm and 635 nm was 0.05:0.10:1, and the color of emitted light in total was red.

Example 12

An organic EL device having the above standard structure was prepared. The structure of the luminescent layer was as follows.

First luminescent layer: H-29+25%A-5+2%G-3+1%R-3 (10 nm)

Second luminescent layer: H-4+15%B-4 (20 nm)

The organic EL device was allowed to emit light upon application of a direct voltage in the same manner as Example 1. The chromaticity based on the CIE 1931 chromaticity coordinate was (x, y)=(0.31, 0.34). The luminescence intensity ratio at luminescence peaks of 465 nm, 522 nm and 635 nm was 0.9:1:0.75, and the color of emitted light in total was white.

Comparative Example 12

An organic EL device having the above standard structure was prepared. The structure of the luminescent layer was as follows.

First luminescent layer: H-29+2%G-3+1%R-3 (10 nm)

Second luminescent layer: H-4+15%B-4 (20 nm)

The organic EL device was allowed to emit light upon application of a direct voltage in the same manner as Example 1. The chromaticity based on the CIE 1931 chromaticity coordinate was (x, y)=(0.56, 0.33). The luminescence intensity ratio at luminescence peaks of 465 nm, 522 nm and 635 nm was 0.20:0.05:1, and the color of emitted light in total was red.

Example 13

An organic EL device having the above standard structure was prepared. The structure of the luminescent layer was as follows.

First luminescent layer: H-29+2%R-3 (10 nm)

Second luminescent layer: H-4+25%A-5+10%B-4+1%G-3 (20 nm)

The organic EL device was allowed to emit light upon application of a direct voltage in the same manner as Example 1. The chromaticity based on the CIE 1931 chromaticity coordinate was (x, y)=(0.31, 0.40). The luminescence intensity ratio at luminescence peaks of 465 nm, 522 nm and 635 nm was 0.7:1:0.75, and the color of emitted light in total was white.

Comparative Example 13

An organic EL device having the above standard structure was prepared. The structure of the luminescent layer was as follows.

First luminescent layer: H-29+2%R-3 (10 nm)

Second luminescent layer: H-4+10%B-4+1%G-3 (20 nm)

The organic EL device was allowed to emit light upon application of a direct voltage in the same manner as Example 1. The chromaticity based on the CIE 1931 chromaticity coordinate was (x, y)=(0.40, 0.43). The luminescence intensity ratio at luminescence peaks of 465 nm, 522 nm and 635 nm was 0.20:0.6:1, and the color of emitted light in total was yellow.

Example 14

An organic EL device having the above standard structure was prepared. The structure of the luminescent layer was as follows.

First luminescent layer: H-29+2%G-3 (10 nm)

Second luminescent layer: H-4+25%A-5+10%B-4+1%R-3 (20 nm)

The organic EL device was allowed to emit light upon application of a direct voltage in the same manner as Example 1. The chromaticity based on the CIE 1931 chromaticity coordinate was (x, y)=(0.35, 0.38). The luminescence intensity ratio at luminescence peaks of 465 nm, 522 nm and 635 nm was 0.6:1:0.85, and the color of emitted light in total was white.

Comparative Example 14

An organic EL device having the above standard structure was prepared. The structure of the luminescent layer was as follows.

First luminescent layer: H-29+2%G-3 (10 nm)

Second luminescent layer: H-4+10%B-4+1%R-3 (20 nm)

The organic EL device was allowed to emit light upon application of a direct voltage in the same manner as Example 1. The chromaticity based on the CIE 1931 chromaticity coordinate was (x, y)=(0.43, 0.46). The luminescence intensity ratio at luminescence peaks of 465 nm, 522 nm and 635 nm was 0.10:0.7:1, and the color of emitted light in total was yellow.

Evaluation of Production Stability

Comparative Example 8

Three organic EL devices each having the structure of Comparative Example 1 were produced. The values of chromaticity of each device were as follows.

First device: (x, y)=(0.31, 0.32)

Second device: (x, y)=(0.24, 0.32)

Third device: (x, y)=(0.33, 0.37)

The significant degree of deviation in chromaticity as shown above is assumed to be duet to, in particular, the difference in the concentration ratio of phosphorescent materials among the devices, which is caused by the difficulty in performing co-evaporation of green and red phosphorescent materials at intended dope concentrations thereof (G-1: 0.13% and R-1: 0.13%).

Example 8

Three organic EL devices were produced in a similar manner to Example 1, except that the concentration of the adamantane compound (A-1) was fixed at 25% and the dope concentration of the green phosphorescent material (G-1) and the red phosphorescent material (R-1) were aimed at 0.26%, respectively. These devices exhibited a chromaticity deviation of both x and y being within 0.03, and emitted white light.

Three organic EL devices were produced in a similar manner to the above, while the dope concentrations of the green phosphorescent material (G-1) and the red phosphorescent material (R-1) were aimed at 0.5%, respectively. These devices exhibited a chromaticity deviation of both x and y being within 0.03, and emitted white light.

Three organic EL device were produced in a similar manner to the above, while the dope concentrations of the green phosphorescent material (G-1) and the red phosphorescent material (R-1) were aimed at 1%, respectively. These devices exhibited a chromaticity deviation of both x and y being within 0.03, and emitted white light.

Three organic EL devices were produced in a similar manner to the above, while the dope concentrations of the green phosphorescent material (G-1) and the red phosphorescent material (R-1) were aimed at 1.5%, respectively. These devices exhibited a suppressed chromaticity deviation of both x and y being within 0.01.

Three organic EL devices were produced in a similar manner to the above, while the dope concentrations of the green phosphorescent material (G-1) and the red phosphorescent material (R-1) were aimed at 2%, respectively. These devices exhibited a suppressed chromaticity deviation of both x and y being within 0.01.

The aforementioned explanation is not intended to limit the invention to the above exemplary embodiments of the Examples. For example, the organic EL device according to the invention may have a top emission-type structure, or may have a structure that emits light from both sides thereof. Moreover, the organic EL device according to the invention may have three or more luminescent layers.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic EL device comprising a pair of electrodes and a luminescent layer between the pair of electrodes, the luminescent layer comprising at least two phosphorescent materials, an electrically inert material, and a charge-transporting material,
    wherein the at least two phosphorescent materials are selected from the group consisting of a blue phosphorescent material having a luminescence peak in a range of from 420 nm to less than 500 nm, a green phosphorescent material having a luminescence peak in a range of from 500 nm to less than 570 nm, and a red phosphorescent material having a luminescence peak in a range of from 570 nm to 650 nm,
    wherein the at least two phosphorescent materials, the electrically inert material, and the charge-transporting material are co-deposited and have substantially uniform concentrations in the luminescent layer; and
    wherein the ratio of minimum luminescence spectrum to maximum luminescence spectrum of the at least two phosphorescent materials emitted from the device is within the range of from 5:95 to 50:50.

2. The organic EL device according to claim 1, wherein the electrically inert material has a lowest excited triplet energy level of 2.7 eV or more.

3. The organic EL device according to claim 1, wherein the device further comprises a second luminescent layer,
    wherein the luminescent layer comprises a green phosphorescent material having a luminescence peak in a range of from 500 nm to less than 570 nm, a red phosphorescent material having a luminescence peak in a range of from 570 nm to 650 nm, an electrically inert material, and a charge-transporting material, and
    wherein the second luminescent layer comprises a blue phosphorescent material having a luminescence peak in a range of from 420 nm to less than 500 nm and a charge-transporting material.

4. The organic EL device according to claim 1, wherein the device further comprises a second luminescent layer,
    wherein the luminescent layer comprises a blue phosphorescent material having a luminescence peak in a range of from 420 nm to less than 500 nm, a green phosphorescent material having a luminescence peak in a range of from 500 nm to less than 570 nm, a charge-transporting material, and an electrically inert material, and
    wherein the second luminescent layer comprises a red phosphorescent material having a luminescence peak in a range of from 570 nm to 650 nm, and a charge-transporting material.

5. The organic EL device according to claim 1, wherein the device further comprises a second luminescent layer,
    wherein the luminescent layer comprises a blue phosphorescent material having a luminescence peak in a range of from 420 nm to less than 500 nm, a red phosphorescent material having a luminescence peak in a range of from 570 nm to 650 nm, a charge-transporting material, and an electrically inert material, and
    wherein the second luminescent layer comprises a green phosphorescent material having a luminescence peak in a range of from 500 nm to less than 570 nm, and a charge-transporting material.

6. The organic EL device according to claim 1, wherein the at least two phosphorescent materials are each included in the luminescent layer at a concentration of 0.2% by mass or more, respectively.

7. The organic EL device according to claim 1, wherein the organic EL device emits white light.

8. The organic EL device according to claim 1, wherein the electrically inert material comprises an adamantane compound represented by the following Formula (1):

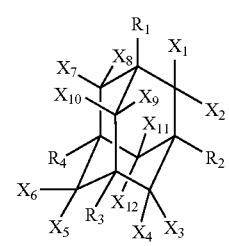

Formula (1)

wherein in Formula (1), $R_1$ to $R_4$ each independently represent a hydrogen atom, an alkyl group having 1 to 6 carbon atoms, an alkenyl group having 2 to 6 carbon atoms, an alkynyl group having 2 to 6 carbon atoms, an aryl group, a heteroaryl group, an alkoxy group having 1 to 6 carbon atoms, an acyl group, an acyloxy group, an amino group, a nitro group, a cyano group, an ester group, an amide group, a halogen atom, a perfluoroalkyl group having 1 to 6 carbon atoms, or a silyl group; wherein at least one of $R_1$ to $R_4$ is a group having a double bond or a triple bond; $X_1$ to $X_{12}$ each independently represent a hydrogen atom, an alkyl group having 1 to 6 carbon atoms, an alkenyl group having 2 to 6 carbon atoms, an alkynyl group having 2 to 6 carbon atoms, an aryl group, a heteroaryl group, an alkoxy group having 1 to 6 carbon atoms, an acyl group, an acyloxy group, an amino group, a nitro group, a cyano group, an ester group, an amide group, a halogen atom, a perfluoroalkyl group having 1 to 6 carbon atoms, or a silyl group.

9. The organic EL device according to claim 1, wherein the electrically inert material comprises a hydrocarbon compound having an alkyl group having 7 or more carbon atoms.

10. The organic EL device according to claim 9, wherein the hydrocarbon compound having an alkyl group having 7 or more carbon atoms is a straight-chain saturated hydrocarbon compound.

11. The organic EL device according to claim 9, wherein the hydrocarbon compound having an alkyl group having 7 or more carbon atoms is in the form of a solid at room temperature.

12. The organic EL device according to claim 1, wherein the electrically inert material comprises a compound represented by Formula (x): L-(Ar)m, wherein Ar represents a group represented by the following Formula (y), L represents a trivalent of higher-valent benzene skeleton, and m represents an integer of 3 or more:

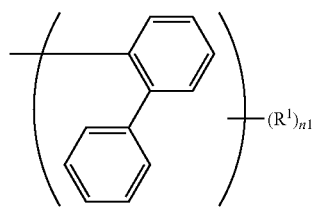

Formula (y)

wherein in Formula (y), $R^1$ represents a substituent; when there are two or more of $R^1$, each $R^1$ may be the same or different; and n1 represents an integer of from 0 to 9.

13. The organic EL device according to claim 1, wherein the electrically inert material comprises a compound represented by the following Formula (z):

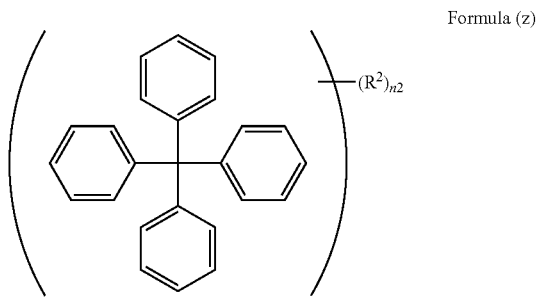

Formula (z)

wherein in Formula (z), $R^2$ represents a substituent; when there are two or more of $R^2$, each $R^2$ may be the same or different; and n2 represents an integer of from 0 to 20.

14. A luminescence apparatus comprising the organic EL device according to claim 1.

15. The organic EL device according to claim 1, wherein the ratio of minimum luminescence spectrum to maximum luminescence spectrum of the at least two phosphorescent materials emitted from the device is within the range of from 20:80 to 50:50.

16. The organic EL device according to claim 1, wherein the ratio of minimum luminescence spectrum to maximum luminescence spectrum of the at least two phosphorescent materials emitted from the device is within the range of from 30:70 to 50:50.

* * * * *